United States Patent
Adachi et al.

(10) Patent No.: US 8,368,080 B2
(45) Date of Patent: ***Feb. 5, 2013

(54) LIGHT EMITTING DISPLAY WITH OPTICAL COMPENSATION LAYER AND CIRCULARLY POLARIZED REFLECTIVE LAYER FOR IMPROVED CONTRAST EVEN IN HIGH AMBIENT LIGHT

(75) Inventors: Masaya Adachi, Hitachi (JP); Osamu Itou, Hitachi (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 57 days.

This patent is subject to a terminal disclaimer.

(21) Appl. No.: 12/629,715

(22) Filed: Dec. 2, 2009

(65) Prior Publication Data

US 2010/0072880 A1 Mar. 25, 2010

Related U.S. Application Data

(63) Continuation of application No. 10/914,855, filed on Aug. 10, 2004, now Pat. No. 7,732,809.

(30) Foreign Application Priority Data

Aug. 13, 2003 (JP) ................................. 2003-293127

(51) Int. Cl.
*H01L 33/00* (2010.01)
(52) U.S. Cl. .......................................... 257/72; 257/40
(58) Field of Classification Search .................. 313/504; 345/82, 83, 87, 88; 349/71, 94, 96, 115; 257/40, 59, 71, E33.06, E33.067, E33.071, 257/E33.072, 88–103, 72
See application file for complete search history.

(56) References Cited

U.S. PATENT DOCUMENTS

| | | | | |
|---|---|---|---|---|
| 5,731,886 A | * | 3/1998 | Taber et al. | 359/291 |
| 5,928,801 A | * | 7/1999 | Broer et al. | 428/690 |
| 6,830,828 B2 | * | 12/2004 | Thompson et al. | 428/690 |
| 7,067,985 B2 | | 6/2006 | Adachi et al. | |
| 7,732,809 B2 | * | 6/2010 | Adachi et al. | 257/40 |

FOREIGN PATENT DOCUMENTS

| | | |
|---|---|---|
| JP | 8-509834 | 10/1996 |
| JP | 9-127885 | 5/1997 |
| JP | 11-231132 | 8/1999 |
| JP | 2001-311826 | 11/2001 |
| JP | 2001-357979 | 12/2001 |
| JP | 2002-215067 | 7/2002 |
| JP | 2003-35820 | 2/2003 |
| JP | 2003-114325 | 4/2003 |
| JP | 2003-186413 | 7/2003 |

* cited by examiner

*Primary Examiner* — Cuong Q Nguyen
(74) *Attorney, Agent, or Firm* — Antonelli, Terry, Stout & Kraus, LLP.

(57) ABSTRACT

The present invention provides light emitting displays which produce a bright image by efficiently emitting light radiated from a light-emitting thin-film layer to the viewer side, and also produces a high-quality image of high contrast ratio and changing in color to a limited extent over a wide viewing angle range even in a bright atmosphere. The light emitting displays are provided with a plurality of light-emitting devices 70, each device 70 having a light-emitting thin-film layer 100 and a light reflective surface 300 in this order on the back side, and a circularly polarized light reflective layer 500 which separates incident light into two types of circularly polarized components, one being reflected and the other transmitted by the reflective layer, an optical compensation layer 800, a quarter-wave plate 700 and a polarizer 600 on the front side, wherein the optical compensation layer 800 is composed of a transparent body working as an optical indicatrix having little refractive index distribution in the in-plane direction and having a refractive index in the thickness direction different from that in the in-plane direction.

5 Claims, 23 Drawing Sheets

(a)

(b)

REFLECTION SPECTRUM OF CHOLESTERIC LIQUID-CRYSTAL LAYER

REFLECTION SPECTRUM IN THIS INVENTION

REFLECTION SPECTRUM IN BACKGROUND ART

INCREASED INTENSITY IN THIS INVENTION

INCREASED INTENSITY IN BACKGROUND ART

LIGHT EMITTING DISPLAY WITH OPTICAL COMPENSATION LAYER AND CIRCULARLY POLARIZED REFLECTIVE LAYER FOR IMPROVED CONTRAST EVEN IN HIGH AMBIENT LIGHT

CROSS-REFERENCE TO RELATED APPLICATIONS

This application is a continuation of application Ser. No. 10/914,855, filed on Aug. 10, 2004, now U.S. Pat. No. 7,732,809, and claims benefit of priority under 35 USC 119 of Japanese application no. 2003-293127, filed on Aug. 13, 2003, which are incorporated herein by reference.

FIELD OF THE INVENTION

The present invention relates to displays working by controlling an emission of a light-emitting device, more particularly to effective techniques applied to light emitting displays provided with a light-emitting device, e.g., organic light-emitting diodes, having a light-reflective surface on a back side of a emission layer.

BACKGROUND OF THE INVENTION

Organic light-emitting diodes are a device which injects a hole and electron into its emission layer of organic thin film to transform the electrical energy into optical energy and thereby to emit light. Light emitting displays provided with an organic light-emitting diode as a light-emitting device constituting a pixel (hereinafter referred to as "OLED display") need no auxiliary light source, e.g., back light, and can be thinner and lighter than a non-emissive type display represented by a liquid crystal display. Moreover, it is shorter in response time for displaying, which is its another characteristic.

Various organic light-emitting diode structures have been proposed, e.g., a three-layer structure comprising, in addition to an electrode working as the anode and another electrode working as the cathode, a hole-transporting layer, an emission layer and an electron-transporting layer in this order between the anode and cathode from the anode side; two-layer structure with one layer working as the light-emitting and electron-transporting layers; and still another structure further having a hole-injecting layer between the anode and hole-transporting layer. A layer having a emission layer formed between an anode and cathode is hereinafter referred to as a "light-emitting thin-film layer" for convenience.

Any structure which emits light from one side of its emission layer is normally provided with an optically transparent electrode (anode or cathode) of a light-transmitting, electro-conductive material on the light-emitting side, with the other electrode being of a light-reflective metal to reflect light.

In the above structure, part of light radiated from the light-emitting thin-film layer is directly emitted outwards after being transmitted by the optically transparent electrode, and the remainder is emitted outwards after being reflected by the light-reflective electrode on the back. Therefore, it is essential for an OLED display provided with such an organic light-emitting diode to have the light-reflective electrode of high reflectance, in order to increase emitted light and thereby display bright images.

SUMMARY OF THE INVENTION

In the above structure, however, the reflective electrode works as a mirror while light is not emitted to catch ambient scenes, making it hard to view displayed images. The displayed image may have an insufficient contrast ratio when incident light passing into the OLED display from an ambient atmosphere (hereinafter sometimes referred to as "ambient light") is reflected, because a black image may not be sufficiently dark.

In order to solve these problems, a structure with a circular polarizer on the light-emitting side of the light-emitting device has been commercialized. The circular polarizer works when a quarter-wave plate and a polarizer are stacked in this order from the emission layer side.

A circular polarizer works in the following manner. Ambient light entering an OLED display from an ambient atmosphere is generally unpolarized. However, a polarizer absorbs a specific, linearly polarized light component while transmitting another linearly polarized light component traveling at a right angle to the above. A quarter-wave plate then acts on transmitted linearly polarized light while it is passing through the plate to make it circularly polarized light (e.g., dextrorotatory circularly polarized light), directing the light towards the reflective electrode. Light is reflected by the electrode to travel in a different direction and rotate in the opposite direction (i.e., to become levorotatory circularly polarized light). Light reflected by the electrode again enters the quarter-wave plate, where it is converted into linearly polarized light absorbable by the polarizer. Therefore, light transmitted by the quarter-wave plate is absorbed by the polarizer and cannot be returned back to the ambient.

In other words, the circular polarizer controls reflection of ambient light at the reflective electrode to make a black displayed image darker thereby improving its contrast ratio. This structure is disclosed by the following patent documents (1) and (2).

It is important for a quarter-wave plate as a circular polarizer component to secure a phase difference of ¼ wavelength ($\pi/2$) in a broad visible wavelength band, in order to have an improved effect of controlling reflection of ambient light and realize a display of high contrast ratio under a bright atmosphere. Some of the known procedures to realize a retardation plate which works as a quarter-wave plate in a broad wavelength band include lamination of 2 types of retardation films of different dependence of refractive index on wavelength (wavelength dispersion) in such a way that their slow axes intersects at a right angle to each other; and lamination of a retardation film having a phase difference of ¼ wavelength and at least one, preferably 2 or more, retardation films having a phase difference of ½ wavelength in such a way that their slow axes intersect with each other.

Moreover, the patent documents (3), (4) and (5) disclose a method for realizing a circular polarizer having a broad wavelength band and, at the same time, high antireflection effect in a wide viewing angle range by use of a laminate of biaxial phase difference films. Use of the circular polarizer can realize an OLED display of high contrast ratio in a wide viewing angle range.

However, an OLED display provided with a circular polarizer involves a problem of darkening of displayed images, because almost half of light radiated from the light-emitting thin-film layer, which is generally unpolarized, is absorbed by the circular polarizer. The patent documents (6) and (7) disclose OLED display having a circularly polarized light reflective layer positioned between the circular polarizer and the light-emitting thin-film layer as a means for decreasing light absorbed by the polarizer and thereby realizing an OLED display producing brighter images.

The circularly polarized light reflective layer is cholesteric layer, composed of a cholesteric liquid-crystal layer, cured by ultraviolet light or heating. The cholesteric liquid-crystal layer exhibits, based on its helical molecular configuration, a peculiar optical characteristic of selective reflection of light entering in parallel to the helical axis corresponding to rotational direction of the helix at a wavelength corresponding to helical pitch, reflecting a circularly polarized light component rotating in one direction and transmitting the component of the other rotational direction.

In this case, among light radiated from the light-emitting thin-film layer, light transmitting the cholesteric liquid-crystal layer is, when passing through the quarter-wave plate, converted into linearly polarized light by receiving an action thereof and transmits the polarizer. On the other hand, light reflected by the cholesteric liquid-crystal layer is reflected by the reflective electrode to direct back again to the cholesteric liquid-crystal layer as circularly polarized light rotating in the opposite direction. The light directed back again to the cholesteric liquid-crystal layer transmits the cholesteric liquid-crystal layer then, and the light reflected by the cholesteric liquid-crystal layer is finally, when passing through the quarter-wave plate, converted into linearly polarized light by receiving an action thereof and transmits the polarizer.

In other words, this technique reflects the polarized light component of light radiated from the light-emitting thin-film layer by the cholesteric liquid-crystal layer before it is absorbed by the polarizer to recover the component, which would be otherwise absorbed and lost, and display brighter images. However, the technology involves a problem that a reflection of ambient light increases as compared to the case of having a circular polarizer only, for the following reasons.

Ambient light entering an OLED display from an ambient atmosphere is generally unpolarized, and at least half of the light is absorbed by the polarizer while it is being transmitted thereby. The quarter-wave plate then acts on light transmitted by the polarizer while it is passing through the quarter wave plate to make it circularly polarized light (e.g., dextrorotatory circularly polarized light), and the circularly polarized light transmits the cholesteric liquid-crystal layer and then is reflected by the reflective electrode. The polarized light reflected by the reflected electrode is converted to a circularly polarized light rotating in the opposite direction (i.e., to become levorotatory circularly polarized light), and is reflected in this time by the cholesteric liquid-crystal layer to be directed back again to the reflective electrode. The light is reflected by the reflective electrode to rotate in the opposite direction (i.e., to become dextrorotatory circularly polarized light), and transmitted in this time by the cholesteric liquid-crystal layer. The light transmitted by the cholesteric liquid-crystal layer is converted by the quarter-wave plate into linearly polarized light which can be transmitted by the polarizer, and emitted via the polarizer to the outside, i.e., on the viewer side.

In other words, an OLED display provided with a cholesteric liquid-crystal layer for the circularly polarized light reflective layer reflects more ambient light than the one provided only with a circular polarizer, and has a lower contrast ratio in a bright atmosphere because a black displayed image is not sufficiently darkened.

By contrast, the patent document (8) discloses a technique for controlling increase of ambient light reflection for a structure with a cholesteric liquid-crystal layer between a circular polarizer and a light-emitting thin-film layer. The structure comprises cholesteric liquid-crystal layers of different selective reflection wavelength range, patterned in such a way to correspond to wavelength of light (hereinafter sometimes referred to as "wavelength of emitted light") radiated from the light-emitting device that constitutes an OLED display pixel.

In other words, the structure comprises cholesteric liquid-crystal layers, each having a selective reflection wavelength range which corresponds to color of light (hereinafter sometimes referred to as "internal emitted light color") radiated from the light-emitting device, patterned in such a way to correspond to the light-emitting thin-film layer position.

In the above structure, the cholesteric liquid-crystal layer has a narrowed selective reflection wavelength range, decreasing reflection of ambient light caused by the selective reflection of the layer to display an image of higher contrast ratio in a bright atmosphere. Moreover, setting a selective reflection wavelength range of the cholesteric liquid-crystal layer narrower than emitted light wavelength range can improve color purity (excitation purity) of color of light emitted to the display outside (hereinafter sometimes referred to as "external emitted light color").

PATENT DOCUMENTS (1) JP-A-8-509834
(2) JP-A-9-127885
(3) JP-A-11-231132
(4) JP-A-2003-35820
(5) JP-A-2003-114325
(6) JP-A-2001-311826
(7) JP-A-2001-357979
(8) JP-A-2002-215067

The above-described background art; i.e., an OLED display provided with a circular polarizer and cholesteric liquid-crystal layers of different selective reflection wavelength range, patterned in such a way to correspond to wavelength of light radiated from a light-emitting device and device position are found to have deteriorated image quality as viewing angle increases, although producing a bright image of high contrast ratio when viewed squarely, i.e., at a viewing angle of 0°, or at an angle close to 0°.

The image quality deterioration results from two causes. First, reflection of ambient light rapidly increases as the angle increases, with the result that a black image cannot be darkened as the angle increases in a bright atmosphere to have a decreased contrast ratio. It is accompanied by reflection of ambient light to cause decreased color purity. Second, external emitted light color changes as the angle increases.

The deteriorated image quality is caused by optical properties of the cholesteric liquid-crystal layer as a circularly polarized light reflective layer. Therefore, increased reflection of ambient light resulting from increased viewing angle cannot be solved by use of a circular polarizer of wide viewing angle proposed so far, comprising a polarizer and a quarter-wave plate incorporated with 2 or more biaxial retardation films to have a wider viewing angle.

The present invention has been developed to solve the problems involved in the conventional techniques. It is an object of the present invention to provide a light emitting display which utilizes light radiated from a light-emitting thin-film layer more efficiently to display a brighter image and, at the same time, controls reflection of ambient light to realize an image of higher contrast ratio even in a bright atmosphere.

It is another object of the present invention to provide a light emitting display which produces a high-quality image of high contrast ratio and controlled color changes even in a bright atmosphere over a wide viewing angle.

An OLED display provided with a cholesteric liquid-crystal layer as a circularly polarized light reflective layer between a circular polarizer and light-emitting thin-film layer involves problems of increased reflection of ambient light and changed external emitted light color as viewing angle increases, which are found to result from optical properties of the cholesteric liquid-crystal layer.

The increased reflection of ambient light as viewing angle increases mainly results from the cholesteric liquid-crystal layer working as an optically negative optical indicatrix having little refractive index distribution in the in-plane direction and a lower refractive index in the thickness direction than in the in-plane direction. In this case, light has no phase difference when traveling in parallel to the thickness direction of the cholesteric liquid-crystal layer, but does have an unnecessary phase difference when traveling at an angle to the thickness direction. As a result, light partly leaks out after passing through a polarizer, even when a circular polarizer of widened viewing angle is applied, because ambient light entering the display has changed polarized conditions due to the unnecessary phase difference occurring in the cholesteric liquid-crystal layer.

On the other hand, changed external emitted light color as viewing angle increases mainly results from the cholesteric liquid-crystal layer's selective reflection wavelength range shifting to the short wavelength side as incident light angle (angle to the axis in parallel to the thickness direction) increases. In other words, angle of incidence of light radiated from the light-emitting thin-film layer to enter the cholesteric liquid-crystal layer increases as viewing angle increases. Therefore, the wavelength range of light radiated from the light-emitting thin-film layer and reflected by the cholesteric liquid-crystal layer to be reutilized shifts to the short wavelength side, with the result that light to be emitted to the display outside has changed dependence of its intensity on wavelength and hence changed color.

The first to $23^{rd}$ means of the present invention developed to solve the above problems are described below.

(1) The first means to achieve the objects of the present invention is light emitting displays provided with a plurality of pixels, each pixel having:

a reflective layer;

a first electrode formed on the reflective layer;

a light-emitting thin-film layer formed on the first electrode;

a second electrode formed on the light-emitting thin-film layer;

a circularly polarized light reflective layer formed on the second electrode;

a quarter-wave plate formed on the circularly polarized light reflective layer; and a polarizer formed on the quarter-wave plate;

and also having an optical compensation layer between the second electrode and the polarizer.

The light-emitting thin-film layer is positioned between the first and second electrodes to emit light by converting electrical energy into optical energy, when hole and electron are injected. It is not limited in layer structure. For example, it may be of a (1) three-layer structure comprising a hole-transporting layer, emission layer and electron-transporting layer in this order, (2) two-layer structure with one layer working as the emission layer and electron-transporting layer in the above structure (1), and (3) four-layer structure comprising a hole-injecting layer, hole-transporting layer, emission layer and electron-transporting layer in this order.

The light-emitting device for the present invention means an assembly comprising a first electrode, second electrode and light-emitting thin-film layer held between these electrodes. For the first and second electrodes, the one on the hole-transporting layer side serves as the anode, and the other as the cathode. The electrode, however, is referred to the first or second electrode, because it may serve as the anode or cathode depending on the light-emitting thin-film layer structure.

An inorganic light-emitting diode (inorganic LED) or inorganic electroluminescent (EL) device may be used as the light-emitting device for the present invention, so long as it can keep polarized conditions of light it transmits. In this sense, a light emitting display includes an OLED, inorganic LED or inorganic EL display.

The member which realizes a circularly polarized light reflective layer can be generally regarded as an optical indicatrix having essentially no refractive index distribution in the in-plane direction macroscopically, and a refractive index in the thickness direction different from that in the in-plane direction. This means that the circularly polarized light reflective layer has a layered structure with each layer having birefringence to work as if it has essentially no refractive index distribution in the in-plane direction macroscopically, even when the individual layers microscopically have the distribution in the in-plane direction. The essentially no refractive index distribution means that the difference is 0.001 or less, preferably 0.0001 or less.

In the above case, a phase difference occurring in light traveling at an angle through the circularly polarized light reflective layer can be compensated by an optical compensation layer working as the optical indicatrix having essentially no refractive index distribution in the in-plane direction and a refractive index in the thickness direction different from that in the in-plane direction. As a result, reflection of ambient light can be controlled over a wider viewing angle range. The essentially no refractive index distribution in the in-plane direction means that the difference is 0.001 or less, preferably 0.0001 or less, also for the optical compensation layer.

(2) The second means is the first means, wherein the circularly polarized light reflective layer has a principal reflection wavelength range which includes a part of the wavelength range of light radiated from the pixel and also has a wavelength width of 130 nm or less. The circularly polarized light reflective layer has a wide reflection wavelength range in which the highest reflectance is attained and, at the same time, may have a plurality of narrower wavelength ranges in which a lower reflectance occurs. The principal reflection wavelength range means the range in which the highest reflectance is attained.

Light corresponding to wavelength range of the reflection of the circularly polarized light reflective layer, among ambient light entering in the light emitting display from an ambient atmosphere, is not absorbed in the circular polarizer but is reflected thereby. However, in the light emitting display provided with the second means, because the circularly polarized light reflective layer has a narrow reflection wavelength range of 130 nm as wavelength width, the reflection of the ambient light is controlled to a small extend. Therefore, the light emitting display can have a high contrast ratio over a wide viewing angle range even in a bright atmosphere.

(3) The third means is the first means, wherein the relationships $n_x=n_y$ and $n_{cx}=n_{cy}$ are substantially satisfied, and the following relationship is also satisfied:

$$|\Delta n_c(\phi) \cdot d_c / \cos \phi| = |\Delta n(\phi) \cdot d / \cos \phi|,$$

wherein, d: thickness, $n_z$: refractive index in the thickness direction, $n_x$ and $n_y$: principal refractive index in the in-plane direction perpendicular to the thickness direction, all of the circularly polarized light reflective layer; $d_c$: thickness, $n_{cz}$: refractive index in the thickness direction, $n_{cx}$ and $n_{cy}$: principal refractive index in the in-plane direction perpendicular to the thickness direction, all of the optical compensation layer; φ: light traveling angle which is an angle between a light traveling direction and an axis parallel to a thickness direction; Δn(φ): a refractive index difference between a refractive index of the circularly polarized light reflective layer in a thickness direction and a principal refractive index thereof in the in-plane direction perpendicular to the thickness direction at an angle φ; and $\Delta n_c(\phi)$: a refractive index difference between a refractive index of the optical compensation layer in the thickness direction and a principal refractive index thereof in the in-plane direction perpendicular to the thickness direction at an angle φ. This means can control reflection of ambient light over a wide viewing angle range, because the unnecessary phase difference occurring in the circularly polarized light reflective layer as viewing angle increases can be completely compensated by the optical compensation layer, realizing the light emitting display having a high contrast ratio over a wide viewing angle range even in a bright atmosphere.

(4) The fourth means is the first means, wherein the relationships $n_x = n_y$ and $n_{cx} = n_{cy}$ are substantially satisfied, and the following relationship is also satisfied:

$$|1.2 \cdot (n_x - n_z) \cdot d| \geq |(n_{cx} - n_{cx}) \cdot d_c| \geq |(n_x - n_z) \cdot d|,$$

wherein, d: thickness, $n_x$: refractive index in the thickness direction, $n_x$ and $n_y$: principal refractive index in the in-plane direction perpendicular to the thickness direction, all of the circularly polarized light reflective layer; $d_c$: thickness, $n_{cx}$: refractive index in the thickness direction, $n_{cx}$ and $n_{cy}$: principal refractive index in the in-plane direction perpendicular to the thickness direction, all of the optical compensation layer. This means can control reflection of ambient light over a wide viewing angle range, because the unnecessary phase difference occurring in the circularly polarized light reflective layer as viewing angle increases can be compensated by the optical compensation layer, realizing the light emitting display having a high contrast ratio over a wide viewing angle range even in a bright atmosphere.

(5) The fifth means is the first means, wherein the optical compensation layer is provided between circularly polarized light reflective layer and the quarter-wave plate.

(6) The sixth means is the first means, wherein the optical compensation layer is provided between the circularly polarized light reflective layer and the second electrode.

(7) The seventh means is the first means, wherein the circularly polarized light reflective layer is a chiral nematic liquid crystal layer or a cholesteric liquid crystal layer.

(8) The eighth means is the first means, wherein the reflective layer serves also as the first electrode.

(9) The ninth means is the first means, wherein the principal reflection wavelength range of the circularly polarized light reflective layer corresponds to the wavelength range of blue of 510 nm or less.

(10) The tenth means is the first means, wherein each of the plurality of pixels radiates any one of color selected from the group consisting of red, blue and green, and the pixel which radiates a red color is composed of a phosphorescent material.

(11) The 11$^{th}$ means is the first means, wherein each of the plurality of the pixels radiates any one of color selected from the group consisting of red, blue and green, and the pixel which radiates a green color is composed of a phosphorescent material.

(12) The 12$^{th}$ means is the first means, wherein each of the plurality of the pixels radiates any one of color selected from the group consisting of red, blue and green, and each of the pixels which radiate red and green colors is composed of a phosphorescent material.

(13) The 13$^{th}$ means is the first means, wherein an antireflection layer, in which a reflection of light in the principal reflection wavelength range of the circularly polarized light reflective layer is small, is provided around the light-emitting area of the pixels.

(14) The 14$^{th}$ means is the first means, wherein the circularly polarized light reflective layer corresponding to each of the plurality of the pixels is patterned for each of the pixels.

(15) The 15$^{th}$ means is the first means, wherein the circularly polarized light reflective layer is patterned for each of the pixels in such a way to correspond wavelength of light radiated from the pixels.

(16) The 16$^{th}$ means is the 14$^{th}$ means, wherein each of the circularly polarized light reflective layers patterned for each of the pixels has an almost constant product of a thickness of the circularly polarized light reflective layer and a value obtained by subtracting a refractive index in the in-plane direction perpendicular to the thickness direction from a refractive index in the thickness direction.

(17) The 17$^{th}$ means is the first means, wherein both $\lambda_0$ and $\lambda_{Imax}$ exist within the wavelength range of light a radiated from the light-emitting thin-film layer but are different from each other, wherein $\lambda_0$ is the central wavelength in the principal reflection wavelength range of light reflected by the circularly polarized light reflective layer, and $\lambda_{Imax}$ is the wavelength at which intensity of interference to light radiated from the light-emitting thin-film layer attains a maximum, all at a viewing angle of 0°.

(18) The 18$^{th}$ means is the first means, wherein one of the following relationships is satisfied:

$$\lambda_0 > \lambda_{Emax} > \lambda_{Imax} \text{ and}$$

$$\lambda_0 < \lambda_{Emax} < \lambda_{Imax},$$

wherein $\lambda_0$ is the central wavelength in the principal reflection wavelength range of light reflected by the circularly polarized light reflective layer, $\lambda_{Emax}$ is the peak wavelength of light radiated from the light-emitting thin-film layer, and $\lambda_{Imax}$ is the wavelength at which intensity of interference to light radiated from the light-emitting thin-film layer attains a maximum, all at a viewing angle of 0°.

(19) The 19$^{th}$ means is the first means, wherein each pixel is provided with: a color filter, which transmits a red color, at a position corresponding to the red color displaying pixel; a color filter, which transmits a green color, at a position corresponding to the green color displaying pixel; and a color filter, which transmits a blue color, at a position corresponding to the blue color displaying pixel.

(20) The 20$^{th}$ means is the 19$^{th}$ means, wherein the circularly polarized light reflective layer has a reflection wavelength range which essentially covers the visible wavelength range.

(21) The 21st means is the first means, wherein the circularly polarized light reflective layer has a negative birefringence and the optical compensation layer has a positive birefringence.

(22) The 22$^{nd}$ means is light emitting displays provided with a plurality of light-emitting devices arranged in matrix each constituting a pixel, each light-emitting device having a light-emitting thin-film layer and a light reflective surface or a reflective electrode working also as a light reflective surface in this order on the back side, and a circularly polarized light reflective layer which separates incident light into two types of circularly polarized components, one being reflected and the other transmitted by the reflective layer, a quarter-wave plate and a polarizer in this order on the front side, wherein the light-emitting thin-film layer keeps a state of polarization of light transmitted thereby essentially unchanged, the light reflective surface reflects most of at least circularly polarized light entering at a right angle to the surface after reversing its rotational direction while keeping it circularly polarized, the circularly polarized light reflective layer has a principal reflection wavelength range which includes part of the wavelength range of light radiated from at least one of a plurality of the light-emitting devices each constituting a pixel and also has a wavelength width of 130 nm or less, and an optical compensation layer is provided between the polarizer and the light-emitting device to serve as an optical indicatrix having no refractive index distribution in the in-plane direction and having a refractive index in the thickness direction different from that in the in-plane direction.

(23) The 23$^{rd}$ means is light emitting displays provided with a plurality of light-emitting devices arranged in a matrix each constituting a pixel, each light-emitting device having a light-emitting thin-film layer and a light reflective surface or a reflective electrode working also as a light reflective surface in this order on the back side, and a quarter-wave plate, a linearly polarized light reflective member which separates incident light into two types of linearly polarized components, one being reflected and the other transmitted by the reflective layer, and polarizer, in this order, on the front side, wherein the light-emitting thin-film layer keeps a state of polarization of light transmitted thereby essentially unchanged, the light reflective surface reflects most of at least circularly polarized light entering at a right angle to the surface after reversing its rotational direction while keeping it circularly polarized, the linearly polarized light reflective layer member has a principal reflection wavelength range which includes a part of the wavelength range of light radiated from at least one of a plurality of the light-emitting devices each constituting a pixel and also has a wavelength width of 130 nm or less, and an optical compensation layer is provided between the polarizer and the light-emitting device to serve as an optical indicatrix having no refractive index distribution in the in-plane direction and having a refractive index in the thickness direction different from that in the in-plane direction.

As discussed above, the present invention can realize a light emitting display which produces a brighter image or an image at a lower power consumption by allowing light radiated from the light-emitting thin-film layer to contribute to image displaying more efficiently, and, at the same time, keeps a high contrast ratio in a wide viewing angle range even in a bright atmosphere by controlling reflection of ambient light. It also realizes a light emitting display with controls color changes in a wide viewing angle range.

In other words, the present invention can realize a light emitting display which produces a brighter image or an image at a lower power consumption, and, at the same time, keeps a high contrast ratio and controls color changes in a wide viewing angle range.

Other objects, features and advantages of the invention will become apparent from the following description of the embodiments of the invention taken in conjunction with the accompanying drawings.

DESCRIPTION OF THE REFERENCE NUMERALS AND SIGNS

Figure 1:
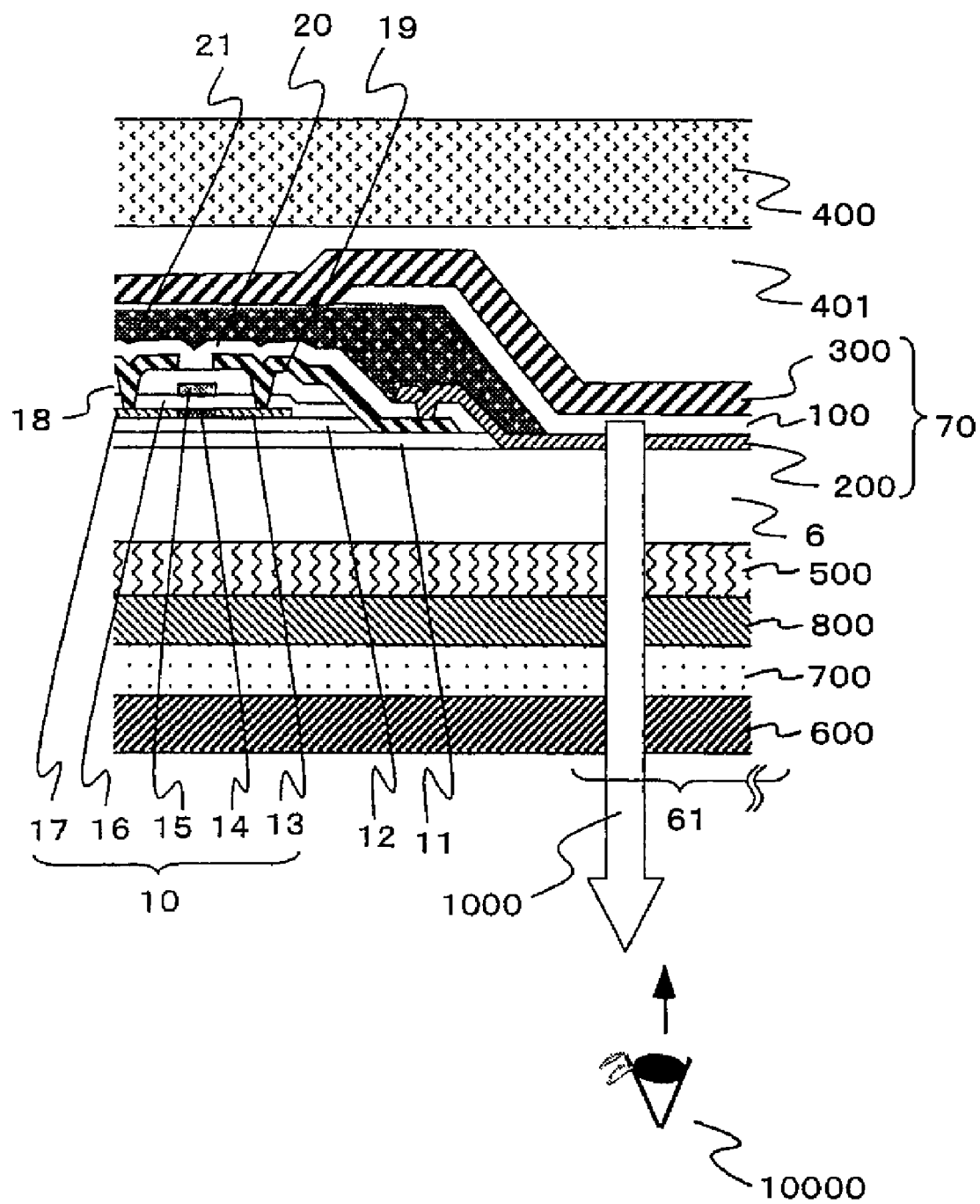
FIG. 1 is a cross-sectional view which schematically illustrates the structure around a pixel of one example of the light emitting displays of the present invention.

1 Light emitting display
2 Display area
3 Transparent substrate
40 Storage capacitor
60 Pixel
61 Light emitting area
70 Organic light emitting diode
90 Transparent sealing plate
100 Light-emitting thin-film layer
200 Transparent electrode
300 Reflective electrode working as a light reflective surface
400 Sealing member
500 Circularly polarized light reflective layer
500R Circularly polarized light reflective layer (cholesteric liquid-crystal layer) having a reflection wavelength range corresponding to that of a red color
500G Circularly polarized light reflective layer (cholesteric liquid-crystal layer) having a reflection wavelength range corresponding to that of a green color
500B Circularly polarized light reflective layer (cholesteric liquid-crystal layer) having a reflection wavelength range corresponding to that of a blue color
550 Linearly polarized light reflection member
600 Polarizer
700 Quarter-wave plate
800 Optical compensation layer
850 Optical compensation layer
900R Color filter transmitting light having a wavelength which falls into the wavelength range of a red color
900G Color filter transmitting light having a wavelength which falls into the wavelength range of a green color
900B Color filter transmitting light having a wavelength which falls into the wavelength range of a blue color

DETAILED DESCRIPTION OF THE INVENTION

The embodiments of the present invention are described by EXAMPLES and the drawings.

Figure 2:
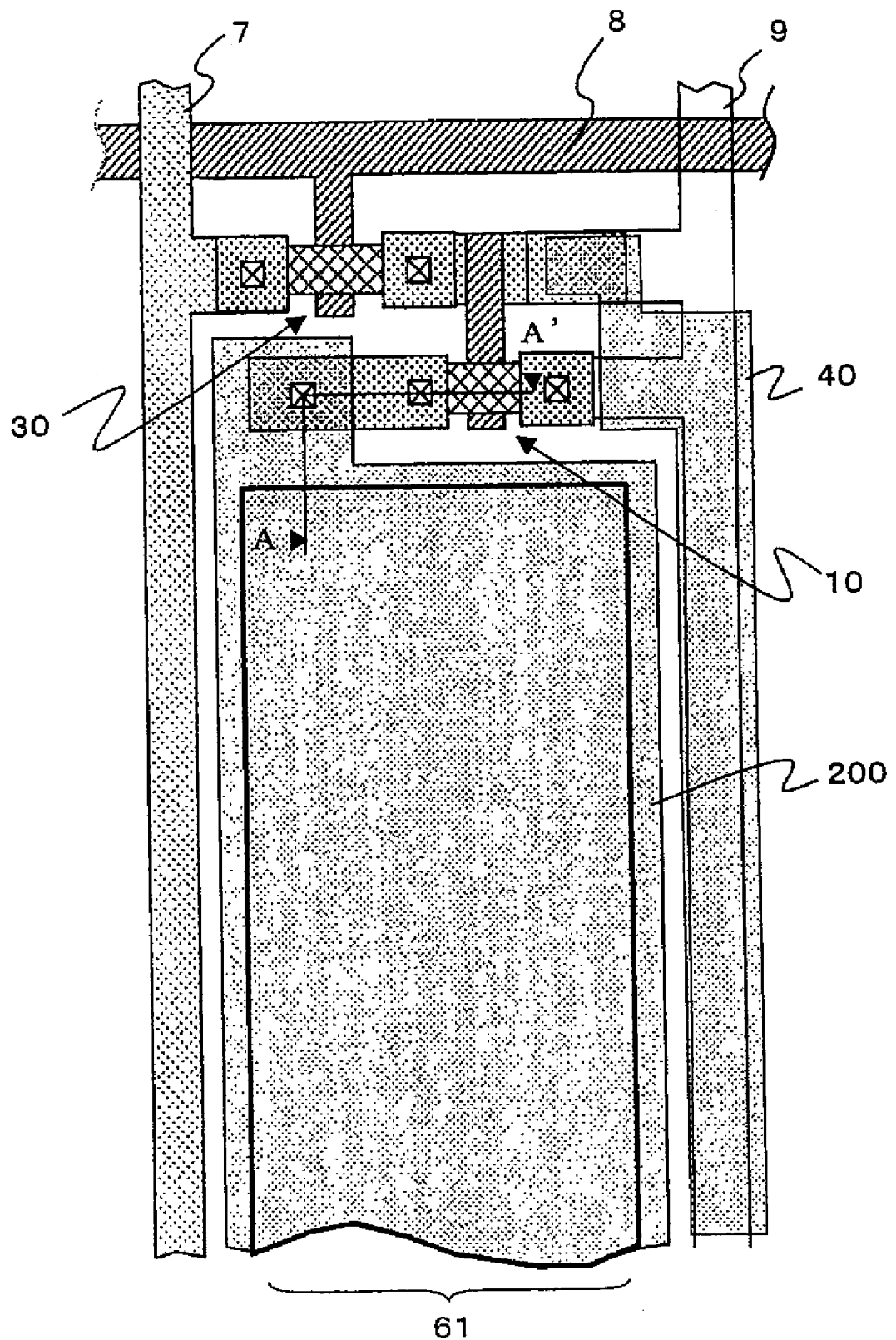
FIG. 2 is a partly perspective diagram which outlines the structure of the pixel area for the light emitting displays of the present invention.

FIG. 1 is a cross-sectional view of one pixel and its periphery which illustrates the structure of one embodiment of the light emitting display of the present invention. FIG. 2 is a partly perspective diagram which illustrates the structure of the pixel area for the light emitting display of the present invention. This embodiment of the light emitting display is an active matrix drive type OLED display having a thin-film transistor as a switching device and organic light-emitting diode.

The present invention is described by taking an active matrix drive type as an example, which by no means limits the present invention.

Figure 3:
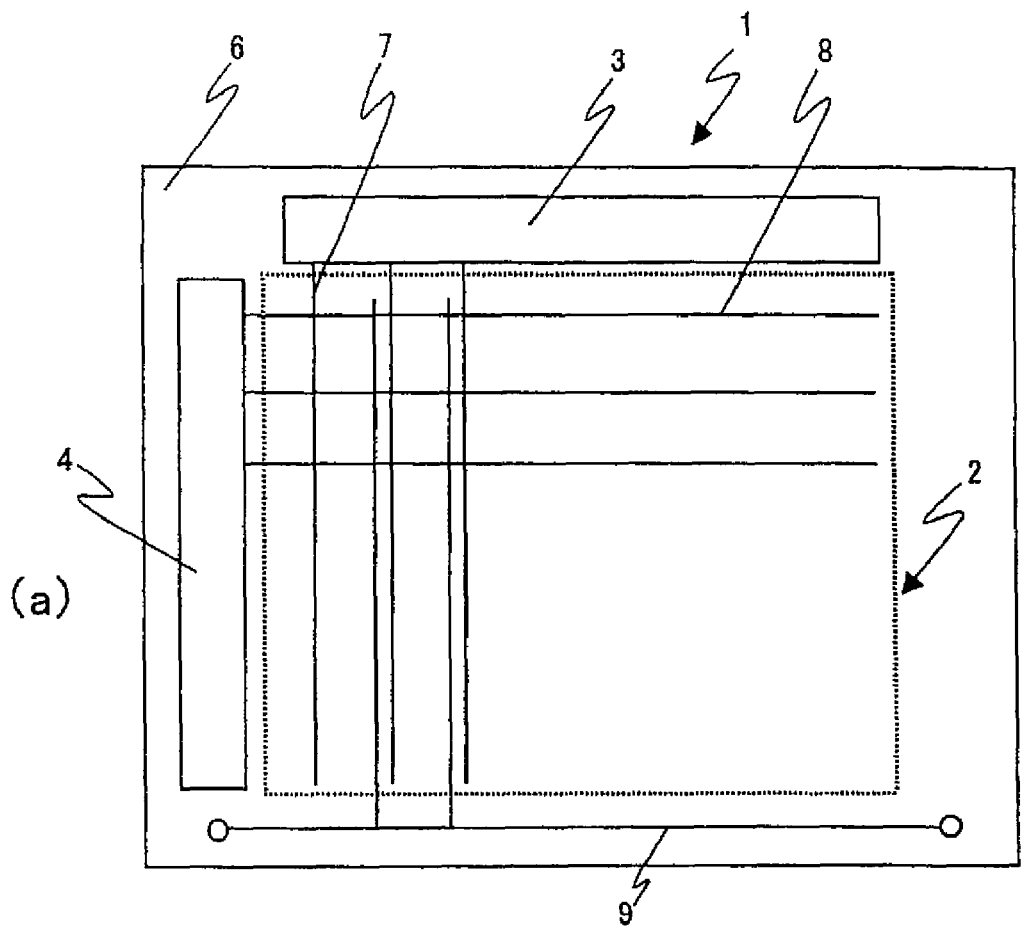
FIG. 3 is a block diagram which schematically illustrates the overall layout of the light emitting displays of the present invention.
Figure 3:
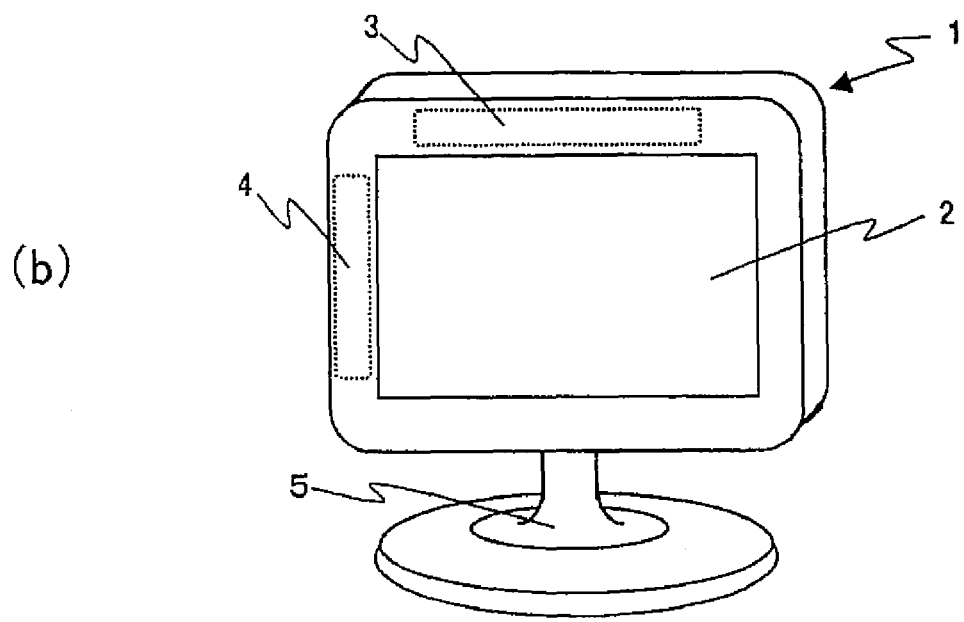
Figure 4:
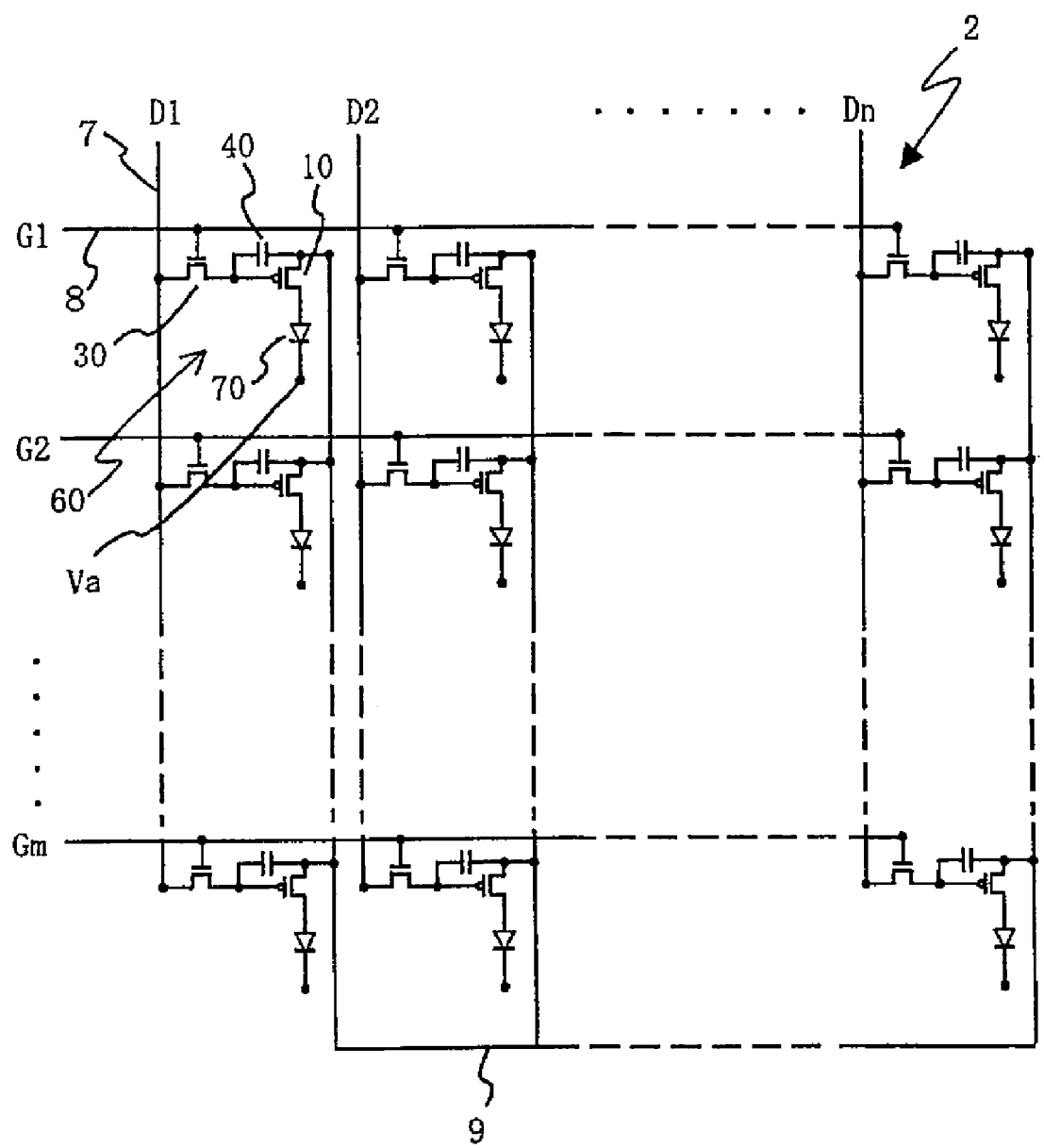
FIG. 4 shows an equivalent circuit of an active matrix provided in the displays area in the light emitting displays of the present invention.

FIG. 3 is a block diagram which schematically illustrates the overall layout of the light emitting display 1, and FIG. 4 shows an equivalent circuit of the active matrix provided in its display area 2.

Referring to FIG. 3(a), the light emitting display 1 has the display area 2 positioned almost at the center of the substrate 6 composed of a transparent, insulating material, e.g., glass. The display area 2 is provided with the data-driving circuit 3, which transmits the image signal to the data line 7, and with the scan-driving circuit 4, which transmits the scan signal to the gate line 8, on the upper and left side, respectively. Each of these driving circuits 3 and 4 is composed of a shift resistor circuit, composed of a complementary circuit of an N- and P-channel, thin-film transistor, level shifter circuit, analogue switch circuit and the like. The display 1 is supported by the leg 5, as shown in FIG. 3(b), and can be used as a monitor for TV or computer images. It can be also used as a TV receiver, when provided with a built-in TV tuner.

The light emitting display 1 is provided with a plurality of gate lines and data lines on the substrate 6, like an active matrix drive type liquid-crystal display, both lines extending in such a way to intersect with each other. The pixels 60 are positioned in a matrix at the intersecting points formed by the m-numbered gate lines, G1, G2, Gm and re-numbered data lines D1, D2, Dn, as shown in FIG. 4.

Each pixel is composed of the organic, light-emitting diode 70; storage capacitor 40; switching transistor 30 comprising an N-channel, thin-film transistor (TFT) whose gate electrode is connected to the gate line, and one of the source and drain electrodes is connected to the data line and the other is connected to the storage capacitor 40; and driving transistor 10 comprising a P-channel TFT whose gate electrode is connected to the storage capacitor 40, source electrode is connected to the common potential line 9 extending in the same direction as the data lines and drain electrode is connected to one of the electrodes for the organic light-emitting diode 70, the other electrode for the organic light-emitting diode 70 being connected to a common power supply line for all of the pixels to keep same potential at a constant level Va.

Next, the structure around one pixel of the light emitting display 1 is described by referring to FIGS. 1 and 2. FIG. 2 is a top view schematically illustrating part of the planar structure of the pixel for the light emitting display 1, and FIG. 1 is a cross-sectional view schematically illustrating the structure in the A-A' cross-section in FIG. 2.

The light emitting display is providing with a switching device of thin-film transistor on the flat-surfaced substrate 6 of an insulating material, e.g., glass. The switching device, e.g., driving transistor 10 or switching transistor 30 which constitutes the pixel circuit is composed of thin-film, polysilicon transistor. The thin-film, polysilicon transistor comprises the gate-insulating layer 16, gate electrode layer 15, first interlayer insulating layer 18, source/drain electrode layer 19 and second interlayer insulating layer 20 on the polysilicon layer containing the source/drain areas 17 and 13, and channel polysilicon layer 14.

The first foundation layer 11 of SiNx is provided between the thin-film, polysilicon transistor and substrate 6 to prevent contamination of the polysilicon layer 14 and gate insulating layer 16 with ions, e.g., those of Na and K, migrating from the substrate 6. Moreover, the second foundation layer 12 of SiOx is provided between the first foundation layer 11 and polysilicon layer.

In this embodiment, the first and second foundation layers 11 and 12, gate insulating layer 16, and first and second interlayer insulating layers 18 and 20 are selectively removed at the area corresponding to the light-emitting area 61 of the pixel, to provide aperture area, for the reason described later. At the same time, the transparent electrodes 200 are formed like islands in such a way to cover the areas each of which becomes the light-emitting area 61 of the pixel. The transparent electrode 200 is connected to the drain electrode by a through-hole in the second interlayer insulating layer 20.

The third interlayer insulating layer 21 is provided on each of the non-emitting areas, e.g., switching transistor 30, driving transistor 10, data line 7, gate line 8 and common potential line 9, and that on the transparent electrode 200 in such a way to be open to the light-emitting area 61 of the pixel. An organic thin film composed of a hole-transporting layer, emission layer and the like is provided on the transparent electrode 200.

The thin-film layer, containing the emission layer and provided between the cathode and anode constituting the organic light-emitting diode 70, is hereinafter merely referred to as the "light-emitting thin-film layer 100". The layer 100 is provided on the transparent electrode 200 in such a way to cover the pixel, and separated from the transparent electrode 200 by the interlayer insulating layer 21 on the area other than the light-emitting area 61. It is provided with the reflective electrode 300 working also as the light reflective surface to completely cover the display area 2.

The light emitting display is the so-called bottom-emission type OLED display, directing the light 1000 radiated from the organic light-emitting diode 70, towards a viewer from the substrate 6, on which the diode 70 is provided.

The transparent electrode 200 constituting the organic, light-emitting diode 70 and reflective electrode 300 also working as the light reflective surface work one for the anode and the other for the cathode. The display is described taking as an example the case with the transparent electrode 200 working as the anode and reflective electrode 300 as the cathode.

The transparent electrode 200 can work as the anode when it is of a transparent material of high work function. For example, indium tin oxide (ITO) is a preferable material, and InZnO can be also used. Metals of low work function, e.g., Al, Mg, Mg—Al alloy and Al—Li alloy can be used for the reflective electrode 300 which works as the cathode and light reflective surface.

The reflective electrode 300 of Al alone needs a high driving voltage and tends to have shortened life time. Therefore, it may be provided with a very thin film of a lithium compound (e.g., lithium oxide $LiO_2$ or lithium fluoride LiF) in the interface with the light-emitting thin-film layer to have the characteristics comparable to those of an Al—Li alloy electrode. It may be doped with a metal of high reactivity, e.g., lithium or strontium, in the organic layer in contact with the cathode to reduce driving voltage. For the reflective electrode 300 to allow light radiated from the light-emitting thin-film layer 100 to be efficiently emitted to the display outside, it is preferably composed of a material of high light reflectance. Moreover, the reflective electrode 300 preferably has a mirror type reflective surface (specular surface) which reflects at least circularly polarized light entering at a right angle to the surface after reversing its rotational direction while keeping it circularly polarized, for the reasons described later, to reduce reflection of ambient light and improve efficiency of emitting light radiated from the light-emitting thin-film layer 100 to the display outside, i.e., viewer side (the efficiency is hereinafter referred to as "light utilization efficiency").

The reflective electrode 300 works as the electrode and, at the same time, as the light reflective surface on the back side of the light-emitting thin-film layer 100. This embodiment of the present invention includes a case where the reflective electrode 300 has no function of the light reflective surface. For example, the light emitting display may be provided with a transparent electrode of a transparent, electroconductive material whose work function is adequately controlled at the position for the reflective electrode, and also with a light-reflective metallic layer or dielectric multilayer as the separate light reflective surface on the back side of the transparent electrode.

The light-emitting thin-film layer 100 constituting the organic, light-emitting diode 70 can be provided with an electron-transporting layer, emission layer and hole-transporting layer in this order between the anode and cathode from the cathode side. Moreover, it may be of a four-layer structure with a hole-injecting layer between the anode and hole-transporting layer, or two-layer structure with one layer working as the emission layer and electron-transporting layer.

The light-emitting thin-film layer 100 is composed of a material which emits a given color at a given current flowing between the anode and cathode. This embodiment is provided with pixels arranged in a matrix to realize a full-color light emitting display, where the light-emitting thin-film layers 100 each constituting the pixel and emitting a red, green or blue color are patterned in a given order. In other words, color of light emitted from the light-emitting thin-film layer 100 is patterned for each pixel in such a way to correspond to one of the primary colors of red, green and blue.

The materials for the red-emitting, thin-film layer include α-NPD (4,4'-bis[N-(1-naphthyl)-N-phenylamino]biphenyl) and triphenyldiamine derivatives TPD (N,N'-bis(3-methylphenyl)-N,N'-diphenyl-[1,1'-biphenyl]-4,4'-diamine) for the hole-transporting layer; and Alq3 (tris(8-quinolinolate) aluminum) dispersed with DCM-1 (4-dicyanomethylene-6-(p-dimethylaminostyrel)-2-methyl-4-H-pyran) for the electron-transporting, emission layer (working as the electron-transporting layer and also as the emission layer).

The materials for the green-emitting, thin-film layer include α-NPD and triphenyldiamine derivative TPD for the hole-transporting layer; and Alq3, Bebq (bis(8-hydroxy quinolinate)beryllium) and Alq3 doped with quinacridone for the electron-transporting, emission layer (working as the electron-transporting layer and also as the emission layer)

The materials for the blue-emitting, thin-film layer include α-NPD and triphenyldiamine derivative TPD for the hole-transporting layer; DPVBi (4,4'-bis(2,2-diphenylvinyl)biphenyl), a material comprising DPVBi and BCzVBi (4,4'-bis(2-carbazolevinylene)biphenyl), and distyrylallylene derivative as a host doped with distyrylamine derivative as a guest for the emission layer; and Alq3 for the electron-transporting layer. Moreover, a zinc complex of Zn(oxz)2(2-(o-hydroxyphenyl)benzoxazole) may be also used for the electron-transporting, emission layer (working as the electron-transporting layer and also as the emission layer).

In addition to the above-described low molecular weight compounds, a polymer-based material may be used. For example, a laminate of PEDT/PSS layer (layer of mixture of polyethylene dioxythiophene and polystyrene sulphonate) and PPV (poly(p-phenylene vinylene)) layer may be used for the hole-transporting and emission layer, respectively. The green-emitting layer can be realized by PPV incorporated with a green ink, the red-emitting layer by a green ink incorporated with Rhodamine 101 as a dopant, and blue-emitting layer by F8 (poly(dioctylfluorene)). F8 can also work as the electron-transporting layer. The other polymer-based materials include pigment-containing ones, e.g., PVK (poly(N-vinylcarbazole)).

Anyway, each layer that constitutes the light-emitting thin-film layer 100 is thin at several tens nanometers, and polarized conditions of light passing through the layer are almost kept unchanged. In the organic, light-emitting diode 70 having the above structure, the holes injected from the transparent electrode 200 and electrons injected from the reflective electrode 300 migrate via the respective hole-transporting layer and electron-transporting layer to the emission layer, where the electrons and holes are recombined with each other to emit light having a wavelength corresponding to a given color, when a DC voltage is applied to cause current flow between the transparent electrode 200 and reflective electrode 300.

The light-emitting thin-film layer 100 generally tends to deteriorate by moisture or the like in air. Therefore, it is preferably closed and sealed by a sealing member 400 to prevent it from coming into contact with ambient air, as shown in FIG. 1. The sealing member 400 may be a metallic can (e.g., stainless steel can), ceramic plate, glass plate, resin film treated to serve as a gas barrier, or laminate of thin glass plate and resin film. It is recommended that the sealing member 400 and substrate 6 are tightly adhered to each other by an adhesive sealant spread around the display area in a frame shape, with the gap 401 between them being sealed with an inert gas, e.g., nitrogen gas. It is also recommended that a desiccant is placed at an adequate position in the space between the sealing member 400 and substrate 6, as required. Moreover, the reflective electrode 300 may be directly coated with a highly gas-impermeable layer as a sealing member, which is different from the sealing design for this embodiment.

The circularly polarized light reflective layer 500, optical compensation layer 800, quarter-wave plate 700 and polarizer 600 are laminated on the light-emitting side of the organic light-emitting diode 70. The polarizer 600 and quarter-wave plate 700 constitute the so-called circular polarizer, and are arranged in such a way to totally cover at least the display area 2. The polarizer 600 transmits the linearly-polarized light component having a plane of polarization in one specific direction and absorbs the linearly polarized light component having the polarization axis perpendicular to that of the above component. The material for the quarter-wave plate 700 is selected from the ones having a function of converting linearly polarized light transmitted by the polarizer 600 into circularly polarized light by moving the phase by $\pi/2$.

For the polarizer 600, a polyvinyl alcohol-based polymer film may be used after being stretched together with iodine or a dichroric dye adsorbed thereon to have a polarization function and then coated with a transparent overcoat, e.g., triacetyl cellulose film, on one or both sides.

For the quarter-wave plate 700, a transparent, polymer film may be used after being stretched by an adequate procedure to have a phase difference. The polymer is not limited, so long as it can be optically anisotropic when stretched. These polymers include polyvinyl alcohol, polycarbonate, polysulfone, polystyrene, polyarylate and norbornene.

The phase difference film generally has refractive index which varies depending on wavelength of light, and is difficult for one film to secure the phase difference for the quarter-wave plate in light of wide wavelength range, e.g., ambient light (e.g., solar ray or illumination) or white light. It is therefore recommended to give a quarter-wave plate having a quarter-wavelength over a wide wavelength range by laminating 2 or more films of different dependence of refractive index on wavelength (wavelength dispersion) in such a way to intersect their retarded phase axes with each other at a right angle, or a quarter-wave film and at least one half-wavelength film in such a way to intersect their retarded phase axes with each other. In the latter procedure, a quarter-wave plate closer to ideality may be realized by use of a phase difference film of smaller dependence of refractive index on wavelength, e.g., film of an amorphous olefin polymer.

Moreover, in order to realize a circular polarizer working as a quarter-wave plate over a wide viewing angle range and exhibiting a high antireflection effect also over a wide viewing angle range, it is recommended to use a laminate of biaxial phase difference films. The methods disclosed by the above patent documents (3), (4) and (5) may be used to realize a circular polarizer exhibiting a high antireflection effect over a wide viewing angle range by use of biaxial phase difference films.

The quarter-wave plate may be a birefringence layer of a liquid-crystalline compound or laminate of the birefringence layer and a phase difference film. The liquid-crystalline compound is a rod-shaped one which is fixed by polymerization while being kept homogeneously aligned to form the birefringence layer. In this case, the birefringence layer of the liquid-crystalline compound can be thin at several microns, and realize a quarter-wave plate thinner than the phase difference film laminate.

The quarter-wave plate 700 is designed to have the retarded phase axis aligned in such a way that circularly polarized light transmitted by the polarizer 600 and quarter-wave plate 700 rotates in the direction opposite to that of circularly polarized light to which the chlesteric liquid-crystal layer constituting the circularly polarized light reflective layer 500 exhibits selective reflection.

The circularly polarized light reflective layer 500 has a function of separating incident light into two different circularly polarized light components by reflecting or transmitting light in a given wavelength range. The suitable layer for the circularly polarized light reflective layer 500 is that of a cholesteric liquid crystal or chiral nematic liquid crystal (hereinafter referred to as "cholesteric liquid-crystal layer").

The cholesteric liquid crystal layer exhibits a peculiar optical characteristic based on the helical molecular structure. More specifically, it separates incident light entering in parallel to the helical axis into two components at a wavelength corresponding to the helical pitch, depending on their helical rotational direction, the one rotating in one direction being reflected and the other being transmitted. This is known as selective reflection.

The central wavelength $\lambda_0$ in the selective reflection by the cholesteric liquid crystal layer and principal reflection wavelength range $\Delta\lambda$ are given by the formulae (1) and (2), respectively:

$$\lambda_0 = n_m \cdot p$$

$$\Delta\lambda = \Delta n \cdot p$$

wherein, "p" is a helical pitch of the cholesteric liquid crystal layer, and $n_m$ and $\Delta n$ are average refractive index and birefringence (differential refractive index) of the liquid crystal that constitutes the cholesteric liquid crystal layer, respectively. In the formulae (1) and (2), $n_m$ and $\Delta n$ are given by the formulae (3) and (4), respectively:

$$n_m = \sqrt{(n_e^2 + n_o^2)/2}$$

$$\Delta n = n_e - n_o$$

wherein, ne and no are the extraordinary and ordinary refractive indices, respectively.

The cholesteric liquid crystal layer can be composed of various compounds each of which has eventually a cholesteric liquid crystal structure. It is recommended that the cholesteric liquid crystal layer is immobilized or hardened while keeping its cholesteric liquid crystal structure for ease of handling. Such a cholesteric liquid crystal layer can be achieved by forming a liquid-crystal polymer solution into a layer and then drying it or polymerizing a liquid crystal monomer with ultraviolet ray or under heating.

Moreover, the cholesteric liquid crystal layer may be realized by patterning 2 or more cholesteric liquid crystal layers of different selective reflection wavelength range on the plane, as described later in another embodiment. Such a cholesteric liquid crystal layer can be produced by several procedures. For example, one procedure treats a cholesteric liquid crystal having a thermochromic property with respect to selective reflection wavelength to immobilize the structure at a given area while controlling its selective reflection wavelength by temperature. Another procedure treats a cholesteric liquid crystal whose selective reflection wavelength varies with ultraviolet ray to immobilize the structure at a given area while controlling its selective reflection wavelength by ultraviolet ray.

The circularly polarized light reflective layer exhibits its function when selectively positioned at least in the light-emitting area 61 in the pixel. In this embodiment, the circularly polarized light reflective layer 500 having a reflection wavelength range corresponding to that of a blue color is arranged in such a way to totally cover the display area 2. This arrangement will improve productivity, because the light-emitting area in each pixel and circularly polarized light reflective layer are not necessarily aligned precisely.

Next, the optical compensation layer 800 is described. The optical compensation layer 800 is one of the major characteristics of the present invention, and is necessary to realize a light emitting display of reduced reflection of ambient light in a wide viewing angle range and high contrast ratio even in a bright atmosphere.

The conventional OLED display provided with a circular polarizer and circularly polarized light reflective layer involves a problem of increased reflection of ambient light as viewing angle increases. This phenomenon mainly results from its circularly polarized light reflective layer, composed of a cholesteric liquid-crystal layer, working as an optical indicatrix having essentially no refractive index distribution in the in-plane direction and a refractive index in the thickness direction different from that in the in-plane direction.

The frontal direction, i.e., direction at a viewing angle of 0°, is defined as the z-axis, and the axes intersecting with each other at a right angle on the display area plane perpendicular to the z-axis are defined as the x- and y-axes. Then, the following relationships hold: $n_x = n_y = n_m$ $(= ((n_o^2 + n_e^2)/2)^{1/2})$ and $n_z = n_o$, wherein $n_x$ and $n_o$ are refractive indices of the liquid-crystal molecule constituting the cholesteric liquid-crystal layer in the direction in parallel to and perpendicular to the major axis of the molecule, respectively, $n_z$ is refractive index of the layer in the thickness direction (or direction in parallel to the helical axis of the layer, or z-axis direction), and $n_x$ and $n_y$ are principal refractive indices of the layer on the plane perpendicular to the thickness direction of the layer.

Figure 5:
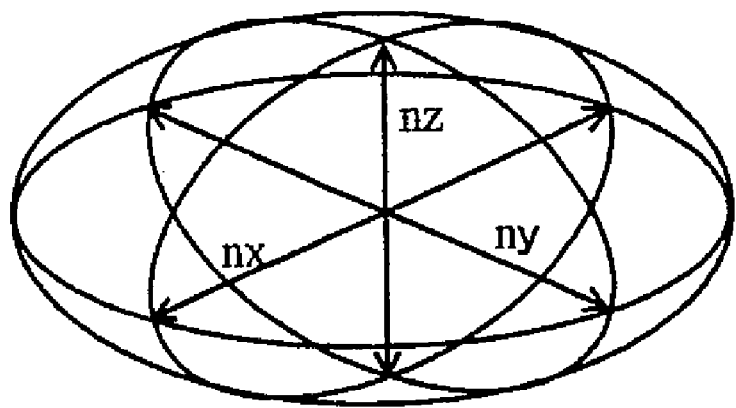
FIG. 5 schematically illustrates an optical indicatrix for the circularly polarized light reflective layer (cholesteric liquid-crystal layer) for the present invention.

In general, $n_e$ is larger than $n_o$, and the relationship $n_z < n_x = n_y$ holds. Therefore, the cholesteric liquid-crystal layer can be regarded as an optically negative optical indicatrix having no refractive index distribution in the in-plane direction and a lower refractive index in the thickness direction, i.e., z-axis direction, than in the in-plane direction, as shown in FIG. 5.

In this case, light traveling at a viewing angle of 0°, i.e., in the direction in parallel to the thickness direction of the cholesteric liquid-crystal layer, has no phase difference, and the circular polarizer efficiently works to control reflection of ambient light. However, a phase difference occurs as light travels at an angle to the helical axis of the cholesteric liquid-crystal layer to increase viewing angle.

The cholesteric liquid-crystal layer produces differential refractive index $\Delta n(\phi)$ represented by the following formula as a function of the angle between the light traveling direction and helical axis of the cholesteric liquid-crystal layer, i.e., angle between the light traveling direction and z-axis (the angle is hereinafter referred to as the "light traveling angle ($\phi$"):

$$\Delta n(\phi) = n_x - ((n_x^2 n_z^2 / (n_x^2 \sin^2\phi + n_z^2 \cos^2\phi)))^{1/2} \qquad (5)$$

As a result, light partly leaks out after passing through a polarizer without being absorbed, even when a circular polarizer of widened viewing angle is applied, because ambient light entering the display has changed polarized conditions due to the unnecessary phase difference occurring in the cholesteric liquid-crystal layer as viewing angle increases, accompanied by increased light traveling angle.

The optical compensation layer 800 for the present invention has a compensation function of substantially reducing the phase difference occurring in the circularly polarized light reflective layer 500. It is composed of a transparent body working as an optical indicatrix having little refractive index distribution in the in-plane direction and a refractive index in the thickness direction different from that in the in-plane direction.

When the circularly polarized light reflective layer is composed of a cholesteric liquid crystal, which can be regarded as an optically negative optical indicatrix as discussed above, the optical compensation layer 800 can exhibit the compensation function when composed of a transparent body working as an optically positive optical indicatrix having no refractive index distribution in the in-plane direction and a higher refractive index in the thickness direction than in the in-plane direction.

Figure 6:
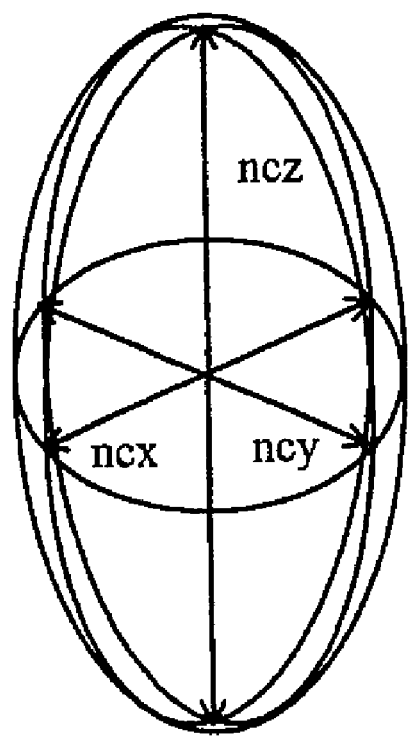
FIG. 6 schematically illustrates an optical indicatrix for the optical compensation layer for the present invention.

In other words, the optical compensation layer 800 is composed of a transparent body working as an optical indicatrix which satisfies the relationship $n_{cz} > n_{cx} = n_{cy}$, wherein $n_{cz}$ is refractive index in the thickness direction, i.e., z-axis direction, and $n_{cx}$ and $n_{cy}$ are principal indices in the plane perpendicular to the thickness direction, as shown in FIG. 6.

This optical compensation layer produces differential refractive index $\Delta n_c(\phi)$ represented by the following formula as a function of the light traveling angle $\phi$:

$$\Delta n_c(\phi) = n_{cx} - ((n_{cx}^2 n_{cz}^2 / (n_{cx}^2 \sin^2\phi + n_{cz}^2 \cos^2\phi)))^{1/2} \qquad (6)$$

Therefore, the optical compensation layer can completely compensate the phase difference produced in the cholesteric liquid-crystal layer, i.e., the phase difference produced in the cholesteric liquid-crystal layer can be completely offset by that produced in the optical compensation layer, when it satisfies the following relationship:

$$\Delta n_c(\phi) \cdot d_c / \cos \phi = -\Delta n(\phi) \cdot d / \cos \phi \qquad (7)$$

wherein, "d" is thickness of the cholesteric liquid-crystal layer and $d_c$ is thickness of the optical compensation layer.

However, it is not easy to realize an optical compensation layer which completely satisfies the above condition. Therefore, it is more realistic to find out the conditions under which the totaled phase difference FD, defined by the following formula (8), which is sum of the phase differences produced in the optical compensation and cholesteric liquid-crystal layers, can be decreased as far as possible with the $(n_{cx}-n_{cz}) \cdot d_c$ level of the optical compensation layer as a parameter.

$$FD = \Delta n_c(\phi) \cdot d_c / \cos \phi + \Delta n(\phi) \cdot d / \cos \phi \qquad (8)$$

The optical compensation layer can produce a certain compensation effect, when it satisfies the following conditional formula (9):

$$(n_{cx}-n_{cz}) \cdot d_c = -(n_x-n_z) \cdot d \qquad (9)$$

Figure 7:
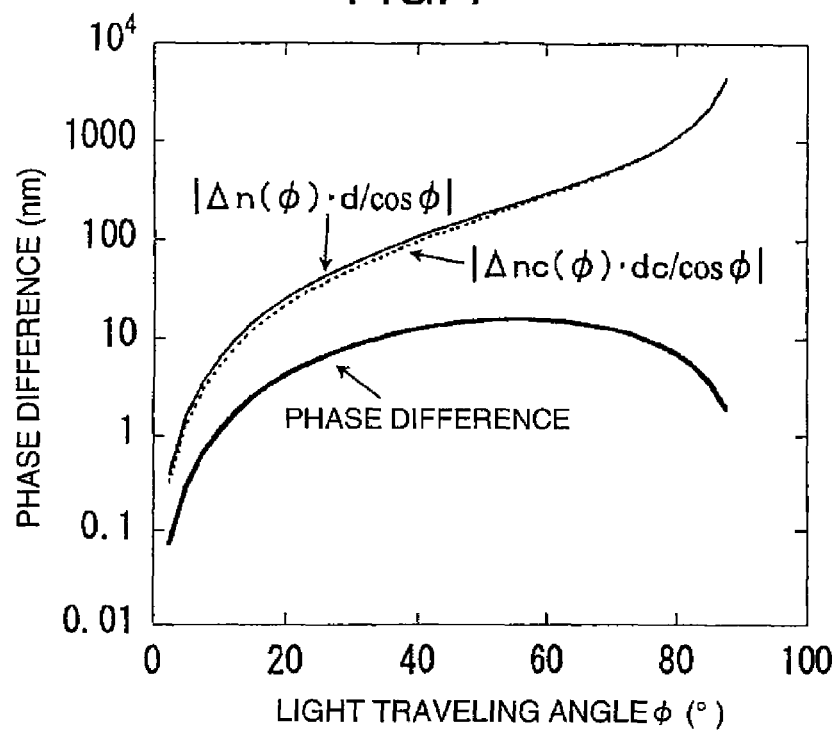
FIG. 7 shows one example of the differential phase difference between a circularly polarized light reflective layer (a cholesteric liquid-crystal layer) and optical compensation layers, plotted against light traveling angle for the present invention.

FIG. 7 shows one example of the differential phase difference between those of the optical compensation and cholesteric liquid-crystal layers, with the phase difference(nm) plotted against light traveling angle φ (°), where the term "phase difference" means sum of the phase differences produced in the optical compensation and cholesteric liquid-crystal layers, i.e., FD(=$\Delta n_c(\phi) \cdot d_c$/cos φ+$\Delta n(\phi) \cdot d$/cos φ). FIG. 7 also shows the absolute values of the phase differences of the cholesteric liquid-crystal and optical compensation layers themselves, i.e., $\Delta n(\phi) \cdot d$/cos φ and $\Delta n_c(\phi) \cdot d_c$/cos φ, for reference.

As shown in FIG. 7, the phase difference decreases to over tens nm, by which is meant that the optical compensation layer satisfies the condition defined by the formula (9) to efficiently exhibit its compensation effect. However, the phase difference value is preferably smaller to reduce reflection of ambient light.

Figure 8:
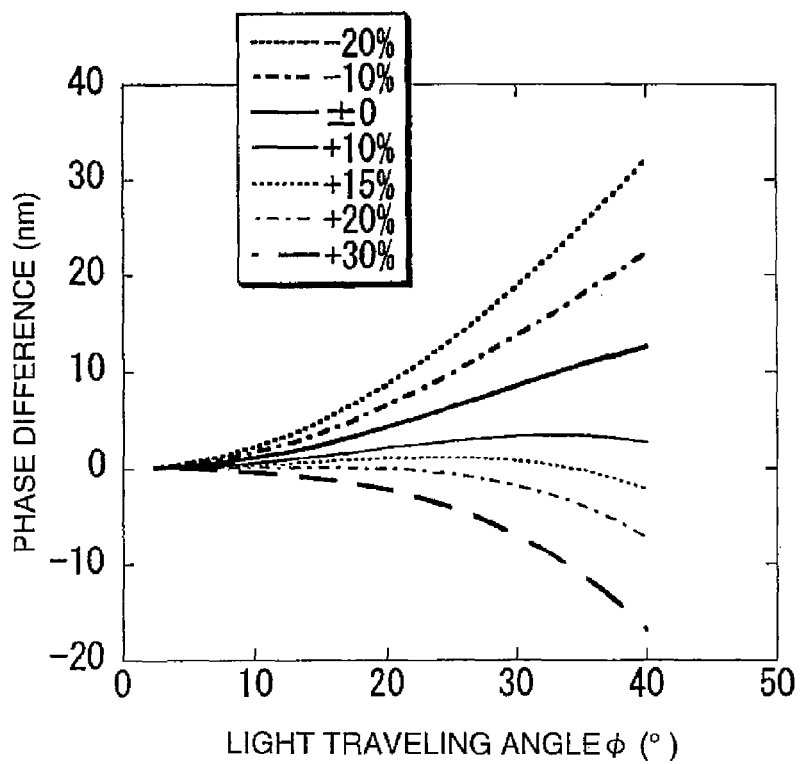
FIG. 8 shows another example of differential phase difference between a circularly polarized light reflective layer (a cholesteric liquid-crystal layer) and optical compensation layers, plotted against light traveling angle for the present invention.

FIG. 8 plots phase difference (nm) against light traveling angle φ, showing one example of the calculated phase difference FD values, where the $|(n_{cx}-n_{cz}) \cdot d_c|$ value is changed from −20 to +30% over the $|(n_{cx}-n_{cz}) \cdot d_c|$ value. Light traveling angle φ is limited within a range of around 0 to 40° inconsideration of differential refractive index between those of air and the optical member, e.g., optical compensation layer or circularly polarized light reflective layer. Therefore, the angle may be considered within the above range to determine the phase difference FD value.

As shown in FIG. 8, the phase difference FD value increases as the $|(n_{cx}-n_{cz}) \cdot d_c|$ value becomes smaller than the $|(n_x-n_z) \cdot d|$ value. So is vice versa, the phase difference FD value decreases as the $|(n_{cx}-n_{cz}) \cdot d_c|$ value becomes larger than the $|(n_x-n_z) \cdot d|$ value, giving a smaller FD value than the condition of the formula (9) until it is roughly 20% larger than the $|(n_x-n_z) \cdot d|$ value. Decreasing the phase difference FD value as far as possible is preferable for realizing a display of low reflection of ambient light and high contrast ratio. Therefore, the optical compensation layer preferably satisfies the following condition:

$$|1.2 \cdot (n_x-n_z) \cdot d| \geq |(n_{cx}-n_{cz}) \cdot d_c| \geq |(n_x-n_z) \cdot d| \qquad (10)$$

It is particularly preferably satisfies the following condition, because the phase difference FD value can be still smaller within the range of the $|(n_{cx}-n_{cz}) \cdot d_c|$ value 1.1 to 1.15 times (+10 to +15%) larger than the $|(n_x-n_z) \cdot d|$ value.

$$|1.15 \cdot (n_x-n_z) \cdot d| \geq |(n_{cx}-n_{cz}) \cdot d_c| \geq |1.1 \cdot (n_x-n_z) \cdot d| \qquad (11)$$

When the above condition is satisfied, the optical compensation layer can substantially offset or compensate the phase difference produced in light traveling at an angle through the cholesteric liquid-crystal layer to realize a light emitting display of high contrast ratio over a wide viewing angle range.

When a cholesteric liquid-crystal layer is formed on a transparent base material film, it is necessary to also compensate the phase difference in the film. Such a film is frequently of triacetyl cellulose. It works as an optically negative optical indicatrix having norefractive index distribution in the in-plane direction and a lower refractive index in the thickness direction than in the in-plane direction. Therefore, it is recommended that the optical compensation layer has the $|(n_{cx}-n_{cz}) \cdot d_c|$ value which includes that of the transparent base material film in consideration of the above.

The optical compensation layer working as an optically positive optical indicatrix having no refractive index distribution in the in-plane direction and a higher refractive index in the thickness direction than in the in-plane direction can be composed of a homeotropically aligned, liquid-crystalline compound. The liquid-crystalline compound may be a low-molecular-weight or high-molecular-weight one, and is preferably a rod-shaped one. Moreover, the optical compensation layer is preferably of a homeotropically aligned, liquid-crystalline compound immobilized or hardened while being kept homeotropically aligned for ease of handling. Such a layer can be realized by a mixture of homeotropically aligned, reactive, rod-shaped, nematic liquid-crystalline and photopolymerization initiator into a film, which is formed into a film and immobilized under heating or with ultraviolet ray for cross-linking.

An optical compensation layer and circularly polarized light reflective layer generally have refractive index which varies with wavelength. Therefore, the above conditions preferably hold over the entire visible wavelength range. It is important for them to satisfy the above conditions at least at around 550 nm, at which high spectral luminous efficiency is attained, in order to control increased reflection of ambient light.

The optical compensation layer can work effectively when located at any position between the polarizer and organic light-emitting diode. However, there is an optimum position at which it works most effectively in relation to the other light emitting display members. It is therefore important to locate the optical compensation layer at the best position for a specific light emitting display structure. The varying effect depending on optical compensation layer position is described later.

It is important to use the optical compensation layer working as an optically positive optical indicatrix having no refractive index distribution in the in-plane direction and a higher refractive index in the thickness direction than in the in-plane direction together with a polarizer and a quarter-wave plate with widened viewing angle range by a biaxial, phase difference film for realizing a light emitting display of low reflection of ambient light and high contrast ratio over a wide viewing angle range. In this case, it is recommended to locate the optical compensation layer independently from the quarter-wave plate or polarizer for ease of the optical designs and production.

However, the present invention is not limited to locating the optical compensation layer independently from the quarter-wave plate or polarizer. A member which constitutes the quarter-wave plate or polarizer can be provided with the optical compensation layer function of compensating the phase difference produced in the circularly polarized light reflective layer, to reduce number of film layers or total device thickness. A biaxial, phase difference film is used for the phase difference film also in this case.

When a polarizer which is not specially treated to have a widened viewing angle range and quarter-wave plate of uniaxial phase difference film are used, the optical compensation layer may be provided with a function of widening viewing angle range of the polarizer and quarter-wave plate, in addition to the function of compensating the phase difference produced in the circularly polarized light reflective layer. In this case, its phase difference $|(n_{cx}-n_{cz}) \cdot d_c|$ will be larger than the above condition.

The circularly polarized light reflective layer may comprise a laminate 2 quarter-wave plates and linearly polarized light reflective member which works to reflect a linearly polarized light component of a specific wavelength range and transmits the other components between them, in addition to a cholesteric liquid-crystal layer. This display has the polarizer and linearly polarized light reflective member with the 2 quarter-wave plates in-between. These quarter-wave plates between the polarizer and linearly polarized light reflective member may be removed by use of a common transmitting axis for the polarizer and linearly polarized light reflective member.

In other words, the above configuration can be achieved by laminating the quarter-wave plate, linearly polarized light reflective member and polarizer in this order from the organic, light-emitting diode 70 side. The structure with a linearly polarized light reflective member is preferable for reducing display thickness and production cost, because of reduced number of optical members.

The linearly polarized light reflective member may be a reflective polarizing film comprising 2 or more birefringent, high-molecular-weight, stacked films, e.g., the one disclosed by the international application WO95/27919. A phase difference occurs in light traveling at an angle also in this case, and it is recommended to provide an optical compensation layer at an adequate position between the polarizer and organic light-emitting diode.

A circularly polarized light reflective layer realizable at present works as an optically negative optical indicatrix. If it works as an optically positive optical indicatrix, it will be self-evident that the phase difference produced therein can be compensated by an optical compensation layer working as an optically negative optical indicatrix, i.e., the one satisfying the relationship $n_{cz}<n_{cx}=n_{cy}$.

Next, driving of each pixel for the light emitting display of this embodiment is described by referring to FIG. 4. The pixel is driven by a turn-on voltage (scanning signal) supplied sequentially to m rows of the gate lines in a frame span from the gate line G1. When the switching transistor 30 is turned on by the scanning signal, the image signal transmitted from the data line is written in the storage capacitor 40 via the switching transistor 30. More specifically, in this driving scheme, while a turn-on voltage is supplied to a certain gate line, all of the switching transistors 30 connected the gate line become a conducting state and, in synchronization therewith, data voltage is supplied to the n rows of the data lines.

The data voltage is stored in the storage capacitor 40 while the turn-on voltage is being supplied, and the gate electrode of the driving transistor 10 is kept by the storage capacitor 40 at a potential corresponding to the image signal almost throughout one frame span. The voltage level at the storage capacitor 40 defines the gate voltage at the driving transistor 10, thereby controlling the current flowing through the driving transistor 10 and hence controlling light emission from the organic light-emitting diode 70. Light emission can be stopped by turning off the driving transistor 10.

In other words, quantity of light emitted from a pixel can be controlled by supplying the voltage corresponding to image information via the data line synchronously with supplying the turn-on voltage to the gate line corresponding to the pixel in question. Therefore, a desired image can be displayed by controlling quantity of light emitted from each of a plurality of the pixels which constitute the display area 2 to correspond to image information. Response time required for emitting light after the current is supplied to the organic, light-emitting diode is normally 1 µs or less, and even a fast moving image can be displayed without delay.

Figure 9:
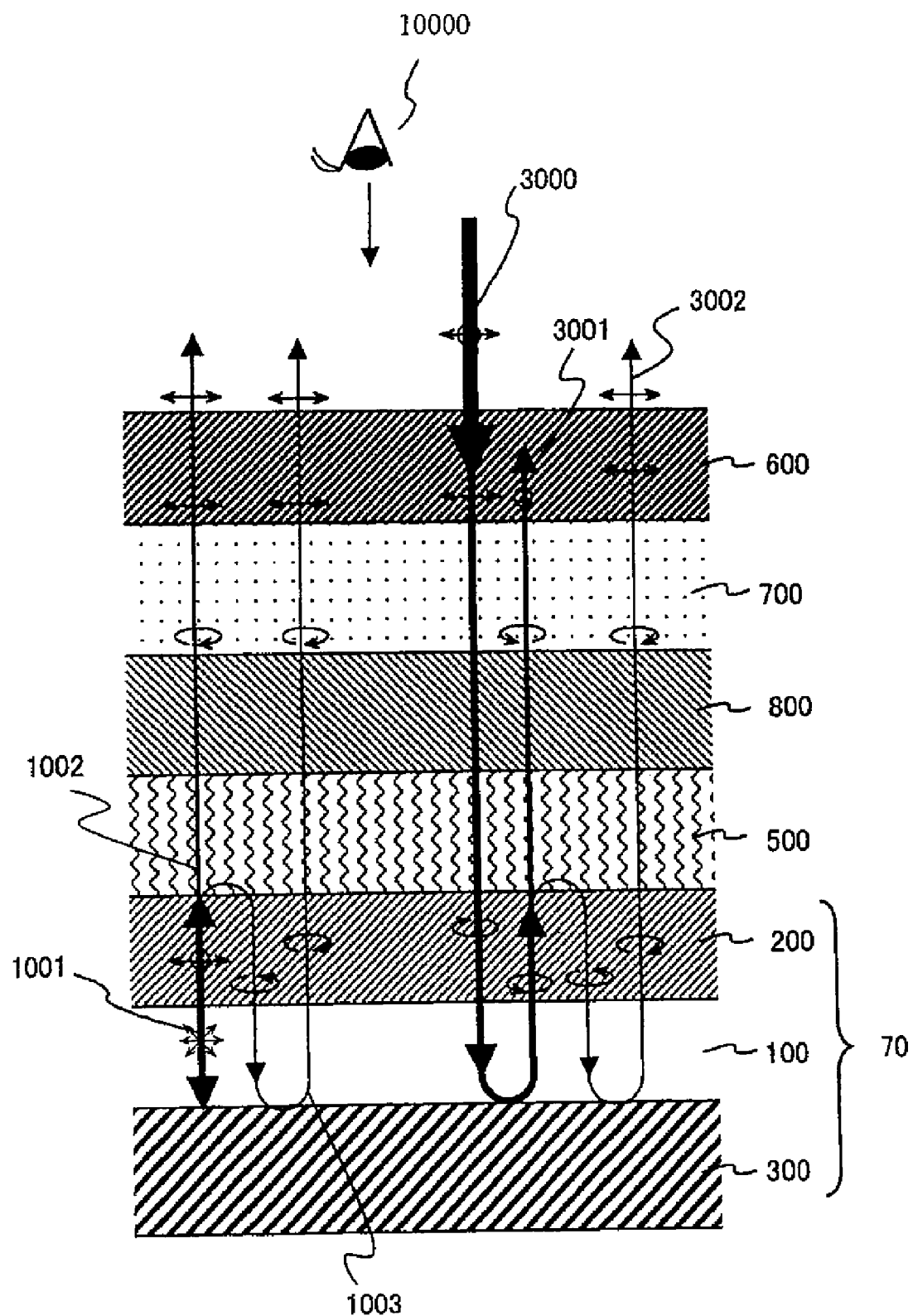
FIG. 9 shows a cross-sectional structure of a light-emitting area of the light emitting displays of the present invention.

Next, light radiated from the light-emitting thin-film layer 100 and light entering the light-emitting area 61 from an ambient atmosphere (ambient light) are described by referring to FIG. 9. FIG. 9 shows the cross-sectional structure of the light-emitting area of the light emitting display of the present invention, where those members, e.g., transparent substrate, which are not directly related to light behavior in the present invention are omitted.

They are described for the case with the optical compensation layer 800 positioned between the circularly polarized light reflective layer 500 and quarter-wave plate 700, where a cholesteric liquid-crystal layer is used as the circularly polarized light reflective layer 500. Therefore, the sign 500 for the circularly polarized light reflective layer is hereinafter used also for the cholesteric liquid-crystal layer.

The light 1001 radiated from the light-emitting thin-film layer 100 is directed towards the transparent electrode 200 side either directly or after being reflected by the reflective electrode 300, and transmitted by the transparent electrode 200 to enter the cholesteric liquid-crystal layer 500. The light radiated from the light-emitting thin-film layer 100 is generally unpolarized. Therefore, the cholesteric liquid-crystal layer 500 reflects the incident light component circularly polarized, rotating in one direction (levoratatory circularly polarized light in this case) and having a wavelength falling into the selective reflection wavelength range of the layer 500, and transmits the other components.

Of the light 1002 transmitted by the cholesteric liquid-crystal layer 500, the component having a wavelength falling into the selective reflection wavelength range is converted by the quarter-wave plate 700 into linearly polarized light which can be transmitted by the polarizer 600. About half of the other light 1002 components, having a wavelength out of the selective reflection wavelength range of the cholesteric liquid-crystal layer 500, are absorbed by the polarizer 600, the remainder being transmitted and emitted to the viewer 10000 side.

On the other hand, the light 1003 reflected by the cholesteric liquid-crystal layer 500 is transmitted by the light-emitting thin-film layer 100 or the like while being essentially kept polarized, and reflected by the reflective electrode 300 to travel in a different direction and rotate in the opposite direction (dextrorotatory circularly polarized light in this case) to be directed back to the cholesteric liquid-crystal layer 500. It is therefore transmitted by the cholesteric liquid-crystal layer 500, converted by the quarter-wave plate 700 into linearly polarized light which can be transmitted by the polarizer 600, and transmitted by the polarizer 600 to be emitted to the viewer 10000 side.

Of light radiated from the light-emitting thin-film layer 100, the component having a wavelength falling into the selective reflection wavelength range of the cholesteric liquid-crystal layer is mostly emitted to the viewer 10000 side without being absorbed by the polarizer 600. As a result, a brighter image is displayed.

In other words, it is desirable to expand the selective reflection wavelength range of the cholesteric liquid-crystal layer, i.e., the range of light reflected by the circularly polarized light reflective layer, in order to enhance efficiency of emitting light to the viewer 10000 side (the efficiency is hereinafter referred to as "light utilization efficiency").

Next, light entering the display area of the light emitting display from a bright ambient atmosphere is described. The ambient light 3000 entering the light emitting display from an ambient atmosphere is generally unpolarized. However, the polarizer 600 absorbs a linearly polarized light component having a plane of polarization aligned to a specific direction, while transmitting another linearly polarized light component having the plane perpendicular to the above. The quarter-wave plate 700 then acts on the light transmitted by the polarizer 600 to make it circularly polarized (e.g., dextrorotatory circularly polarized light in this case). The light transmitted by the quarter-wave plate 700 is then transmitted by the cholesteric liquid-crystal layer 500 to be directed to the reflective electrode 300, where it is reflected to travel in a different direction and rotate in the opposite direction (i.e., levorotatory circularly polarized light in this case).

The light reflected by the reflective electrode 300 enters the cholesteric liquid-crystal layer 500, which straight transmits the light 3001 having a wavelength out of the selective reflection wavelength range while reflecting the light having a wavelength falling into the range.

The quarter-wave plate 700 then acts on the light 3001 transmitted by the cholesteric liquid-crystal layer 500 to convert it into linearly polarized light which can be absorbed by the polarizer 600. Therefore, the light transmitted by the quarter-wave plate 700 is absorbed by the polarizer 600 and cannot be returned back to the ambient.

On the other hand, the light 3002 reflected by the cholesteric liquid-crystal layer 500 is reflected by the reflective electrode 300 back to the cholesteric liquid-crystal layer 500, which can now transmit the light because it is made circularly polarized rotating in the opposite direction while being reflected by the reflective electrode. The quarter-wave plate 700 then acts on the light 3002 transmitted by the cholesteric liquid-crystal layer 500 to convert it into linearly polarized light which can be transmitted by the polarizer 600. It is therefore transmitted by the polarizer 600 to be emitted to the viewer 10000 side.

In other words, about half of the ambient light 3000 entering the display area of the light emitting display is first absorbed by the polarizer 600. The light transmitted by the polarizer 600 is reflected by the reflective electrode 300 towards the cholesteric liquid-crystal layer 500. The light 3001 transmitted by the cholesteric liquid-crystal layer 500 is absorbed by the polarizer 600. Therefore, the light returned back to the viewer 10000 side is limited to the light 3002 having a wavelength falling into the reflection wavelength range of the cholesteric liquid-crystal layer 500, which accounts for only a part of the incident light.

Therefore, it is desirable to narrow the selective reflection wavelength range of the cholesteric liquid-crystal layer, i.e., the reflection wavelength range of the circularly polarized light reflective layer, as far as possible in order to reduce reflection of ambient light. In other words, reflection of ambient light cannot be reduced unless the reflection wavelength range of the circularly polarized light reflective layer is narrowed, even when a phase difference occurring in light traveling at an angle through the circularly polarized light reflective layer is compensated by the optical compensation layer.

The background art involves 2 causes for increased reflection of ambient light; one being phase difference occurring in light traveling at an angle through the circularly polarized light reflective layer, and the other reflection wavelength range of the circularly polarized light reflective layer. These causes should be simultaneously solved to reduce reflection of ambient light.

The reflection wavelength range of the circularly polarized light reflective layer should be narrowed as far as possible to control reflection of ambient light, but conversely it is preferably expanded to enhance light utilization efficiency.

The light emitting display of the present invention is provided with a circularly polarized light reflective layer having a principal reflection wavelength range which includes at least part of the wavelength range of light radiated from at least one light-emitting device constituting one of a plurality of pixels and also having a wavelength width of 130 nm or less. These are the essential conditions to control reflection of ambient light and, at the same time, to enhance light utilization efficiency.

These conditions are based on the consideration that the light to be emitted from one pixel to a viewer has a wavelength width of one-thirds or less of the visible wavelength range (about from 380 to 780 nm), i.e., about 130 nm or less, because a color display uses at least the 3 primary colors. In other words, width of the wavelength range required for light radiated from one pixel to display a desired color is 130 nm at the widest, and the display can reduce loss of light resulting from absorption by its polarizer and efficiently enhance light utilization efficiency, when its circularly polarized light reflective layer has a reflection wavelength range which covers at least part of the above wavelength range.

For reflection of ambient light, on the other hand, the circularly polarized light reflective layer has a narrow reflection wavelength range width of 130 nm or less to be able to reduce a reflection of an ambient light resulting from a light having a wavelength falling into the reflection wavelength range.

One of the procedures to realize the circularly polarized light reflective layer of the above structure is patterning circularly polarized light reflective layers of different selective reflection wavelength range on the plane in such a way to correspond to wavelength of light radiated from each pixel. More specifically, a circularly polarized light reflective layer having a reflection wavelength range corresponding to that of a specific color is located at the emitting side of a pixel emitting that color, red, green or blue. This structure is disclosed by the patent document (8).

Another procedure to realize the circularly polarized light reflective layer of the above structure is locating a circularly polarized light reflective layer having a reflection wavelength range corresponding to the wavelength range of one of a red, green and blue colors in such a way to totally cover the display area, or locating it at a position corresponding to that of a pixel for that color.

In this embodiment, the circularly polarized light reflective layer is of a cholesteric liquid-crystal layer having a principal reflection wavelength range corresponding to the wavelength range of a blue color, and located in such a way to totally cover the display area.

The cholesteric liquid-crystal layer having a wavelength range for selective reflection of a blue color preferably has the wavelength range which includes at least part of the wavelength range of light radiated from the organic light-emitting diode for the blue-emitting pixel, a central wavelength of the selective reflection wavelength range of 400 to 490 nm, more preferably 420 to 480 nm, and a principal reflection wavelength range of 510 nm or less. This is to minimize reflection of ambient light, efficiently utilize the light effective for the blue color to improve brightness and purity of the blue color and thereby to improve light utilization efficiency, and expand the color gamut, the reasons for which are described later. The wavelength range corresponding to that of a blue color hereinafter means the visible wavelength range of 510 nm or less.

Figure 10:
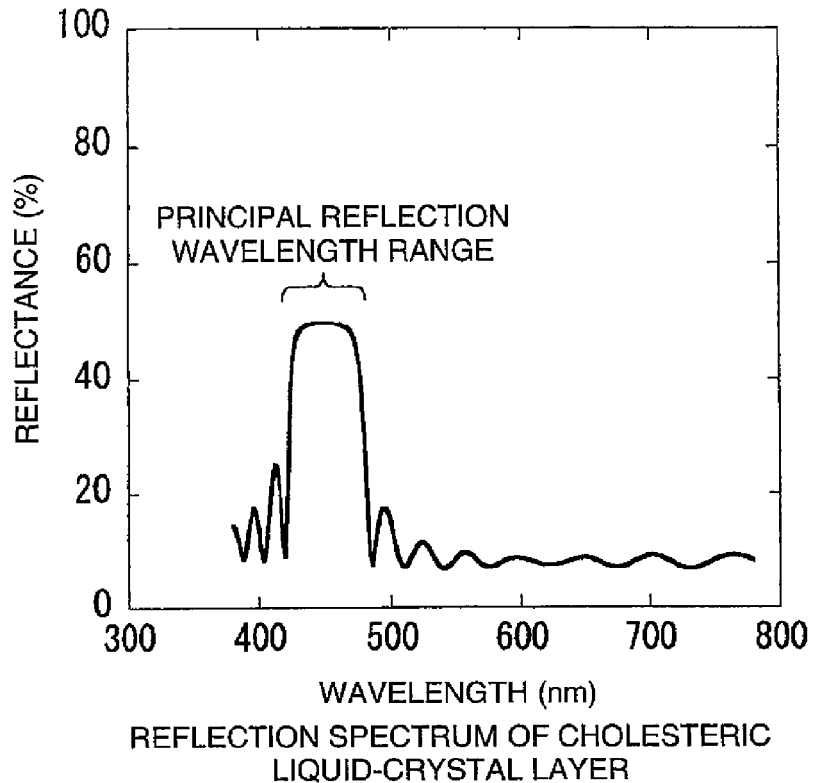
FIG. 10 shows one example of reflection spectrum of a cholesteric liquid-crystal layer for the present invention.

FIG. 10 presents one example of spectral reflectance (reflection spectrum) of the cholesteric liquid-crystal layer having a selective reflection wavelength range corresponding to that of the blue light, showing dependence of reflectance on wavelength with unpolarized light entering the cholesteric liquid-crystal layer. In this embodiment, the principal reflection wavelength range is about 490 nm or less, as shown in FIG. 10.

Figure 11:
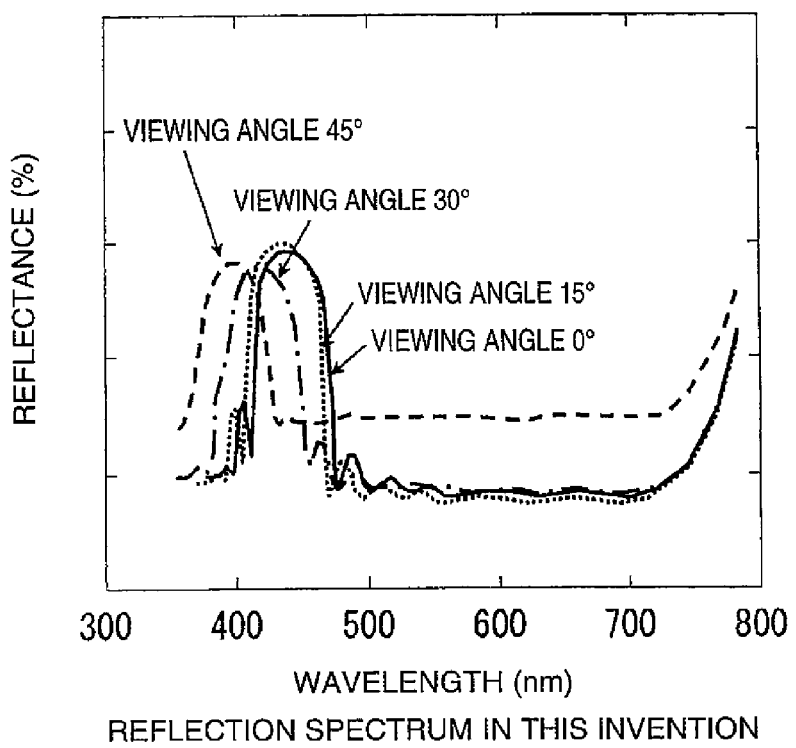
FIG. 11 shows reflection spectrum at a displays area of the light emitting displays of the present invention.
Figure 12:
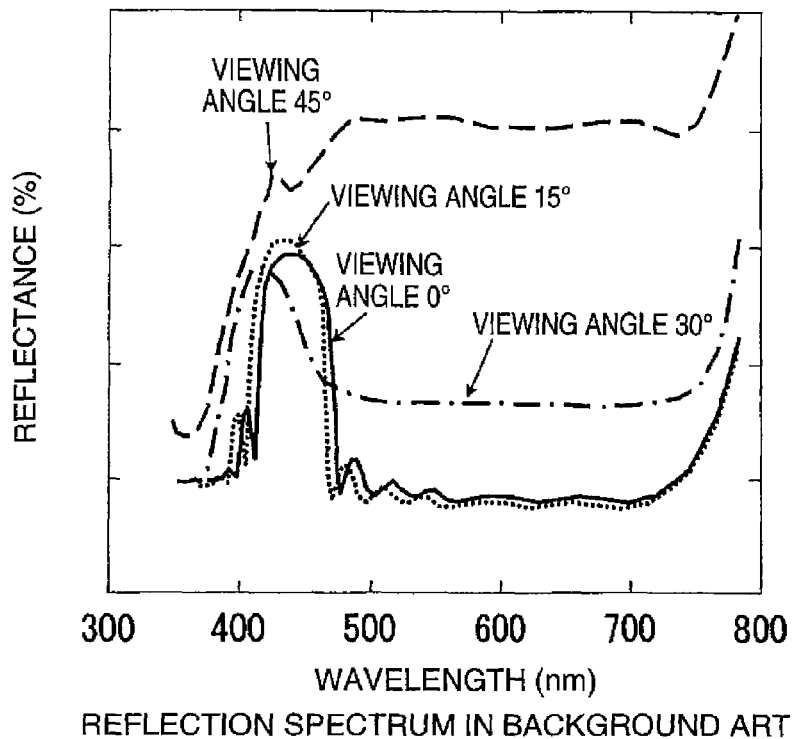
FIG. 12 shows reflection spectrum at a display area for conventional light emitting displays.

FIG. 11 shows ambient light reflectance (reflection spectrum) at the display area of the light emitting display which includes the cholesteric liquid-crystal layer shown in FIG. 10. FIG. 12 shows ambient light reflectance at a display area of a display provided with no optical compensation layer, for comparison. Both figures show wavelength-dependence of reflectance of ambient light entering the display area from an ambient atmosphere at a viewing angle of 0, 15, 30 or 45°.

As shown in FIGS. 11 and 12, a high reflectance is secured at a wavelength falling into the reflection wavelength range of the circularly polarized light reflective layer at a viewing angle of 0° or 15°, whether an optical compensation layer is provided or not. At another wavelength, however, the reflectance is essentially limited to that of a surface reflection. At the same time, luminous reflectance is controlled at below 5%, including 4% of that associated with surface reflection, at a wavelength at which reflectance is high, because a wavelength at which spectral luminous efficiency is low is limited to light of short wavelength.

A display provided with no optical compensation layer, on the other hand, has an increased reflectance also in the wavelength range other than the reflection wavelength range of the circularly polarized light reflective layer, as viewing angle increases to 30 and 45°, as shown in FIG. 12. This results from phase difference produced as viewing angle increases, because the circularly polarized light reflective layer works as an optical indicatrix having essentially no refractive index distribution in the direction perpendicular to the thickness direction, i.e., in-plane direction, and a refractive index in the thickness direction different from that in the in-plane direction.

By contrast, the light emitting display of the present invention, which is provided with an optical compensation layer, can sufficiently control increase in ambient light reflection accompanied by increase in viewing angle. Although its wavelength range in which reflectance is kept at a high level shifts to the short wavelength side, its reflectance in the other wavelength range is essentially kept unchanged at a viewing angle of 30° and increases to only a limited extent at 45°, as shown in FIG. 11.

Figure 13:
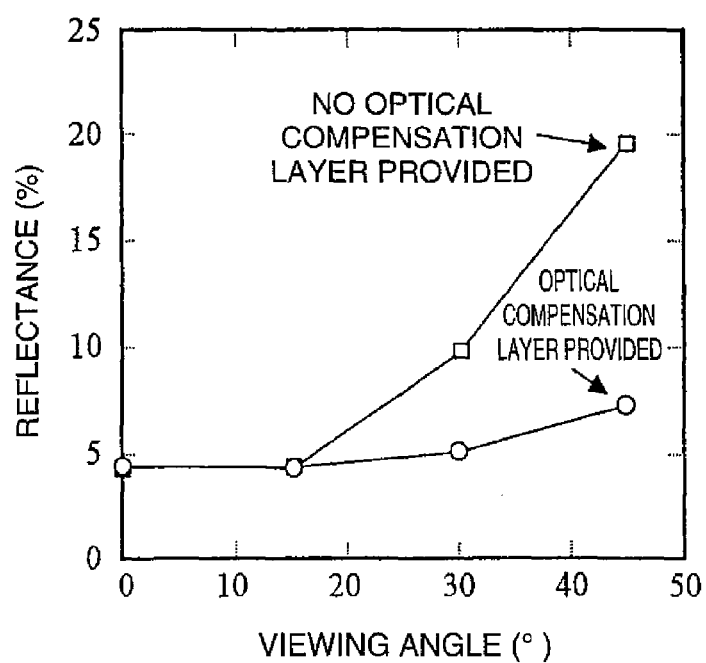
FIG. 13 shows dependence of luminous reflectance on viewing angle at a display area in the light emitting displays of the present invention.

FIG. 13 compares the display provided with an optical compensation layer with that provided with no optical compensation layer in dependence of luminous reflectance at the display area on viewing angle. The display provided with no optical compensation layer has reflectance sharply increasing as viewing angle increases. As a result, its contrast ratio decreases in a bright atmosphere. On the other hand, the light emitting display of the present invention has reflectance increasing to a smaller extent as viewing angle increases, and can display an image of higher contrast ratio over a wide viewing angle range, even in a bright atmosphere.

It is important to reduce as far as possible reflection of light of high spectral luminous efficiency of photopic vision, i.e., light having a wavelength of about 520 to 600 nm, in order to control reflection of ambient light and thereby make a viewer feel that unnecessary reflection is limited.

In particular, this embodiment limits the principal reflection wavelength range to 510 nm or less at the circularly polarized light reflective layer, more specifically to the range of low spectral luminous efficiency corresponding to a blue color having wavelength of 490 nm or less. As a result, reflection of light having a wavelength of 520 to 600 nm, in which spectral luminous efficiency of photopic vision is high, is controlled to reduce luminous reflectance, bringing an effect of making a viewer feel that unnecessary reflection is limited.

Moreover, when a cholesteric liquid-crystal layer is used as the circularly polarized light reflective layer, the principal reflection wavelength range shifts to the short-wavelength side as viewing angle increases, with the result that the wavelength range in which ambient light reflection increases shifts to the short-wavelength side. Therefore, the wavelength range in which ambient light reflection increases shifts to the ultraviolet range, in which spectral luminous efficiency is low, as viewing angle increases, when the principal reflection wavelength range of the circularly polarized light reflective layer is kept in the wavelength range corresponding to that of a blue color having a wavelength of 510 nm or less, making reflection less visible.

As a result, the light emitting display can produce an image of higher contrast ratio over a wide viewing angle range, even in a bright atmosphere, because ambient light reflection increases in a controlled manner as viewing angle increases. It will be self-evident that surface reflection at the display area can be controlled by coating the polarizer 600 with a film of low refractive index or antireflection film comprising 2 or more layers of different refractive index.

Next, light radiated from the light-emitting thin-film layer is described by again referring to FIG. 9. The light 1001 radiated from the light-emitting thin-film layer 100 is directed towards the transparent electrode 200 side either directly or after being reflected by the reflective electrode 300, and transmitted by the transparent electrode 200 to enter the circularly polarized light reflective layer 500, i.e., cholesteric liquid-crystal layer 500, as described earlier. The light radiated from the light-emitting thin-film layer 100 is generally unpolarized. Therefore, the cholesteric liquid-crystal layer 500 reflects the incident light component circularly polarized, rotating in one direction (levoratatory circularly polarized light in this case) and having a wavelength falling into the selective reflection wavelength range of the layer 500, and transmits the other components.

Therefore, the cholesteric liquid-crystal layer 500 transmits most of light radiated from the light-emitting thin-film layers which constitute each of the red and green pixels, about half of the transmitted light being absorbed by the polarizer 600 and the remainder being transmitted to the viewer 10000 side.

By contrast, the light radiated from the light-emitting thin-film layer which constitutes the blue pixel has a wavelength range largely overlapping the principal selective reflection wavelength range of the cholesteric liquid-crystal layer 500. Therefore, of light radiated from the light-emitting thin-film layer 100 which constitutes the blue pixel, the light 1002 having a wavelength falling into the selective reflection wavelength range of the layer 500 and transmitted by the layer 500 is converted by the quarter-wave plate 700 into linearly polarized light which can be transmitted by the polarizer 600. Light transmitted by the polarizer 600 is emitted to the viewer 10000 side.

Of light radiated from the light-emitting thin-film layer 100 which constitutes the blue pixel, the light 1003 reflected by the cholesteric liquid-crystal layer 500 is transmitted by the light-emitting thin-film layer 100 or the like while being essentially kept polarized, and reflected by the reflective electrode 300 to travel in a different direction and become a circularly polarized light rotating in the opposite direction to be directed back to the cholesteric liquid-crystal layer 500. It is therefore transmitted by the cholesteric liquid-crystal layer 500, converted by the quarter-wave plate 700 into linearly polarized light which can be transmitted by the polarizer 600, and transmitted by the polarizer 600 to be emitted to the viewer 10000 side.

Therefore, of light radiated from the light-emitting thin-film layer 100, most of the blue light having a wavelength falling into the selective reflection wavelength range of the cholesteric liquid-crystal layer is emitted to the viewer 10000 side without being absorbed by the polarizer 600, to make the blue pixel brighter.

In other words, utilization efficiency of light corresponding to a blue color, which is absorbed by a polarizer and lost in the conventional display, can be enhanced by the cholesteric liquid-crystal layer as the circularly polarized light reflective layer for the present invention, to realize a light emitting display which produces a brighter image at the same power consumption, or an image of the same brightness at a lower current level in the organic light-emitting diode, reducing power consumption and extending life time.

The cholesteric liquid-crystal layer generally has a precipitous selective reflection wavelength distribution, as shown in FIG. 10. The selective reflection wavelength range can be narrower than the wavelength range of light radiated from the organic light-emitting diode by Δn and helical pitch "p" of the liquid crystal which constitutes the layer, as described earlier.

A clear color of higher color purity (excitation purity in this case) can be produced, when the light has a narrower full-width at half maximum and more precipitous intensity distribution with respect to wavelength even at the same wavelength at which intensity attains a maximum (hereinafter referred to as "emission peak wavelength"), wherein the "full-width at half maximum" is defined as the wavelength range width in which intensity is halved.

Therefore, light emitted from the blue pixel of the present invention to the outside is higher in excitation purity and clearer than the one radiated from the organic light-emitting diode which constitutes the blue pixel.

Moreover, the light emitting display has a wider color gamut than the one provided with no cholesteric liquid-crystal layer, because it increases excitation purity of light radiated from the blue pixel without having essentially no effect on the light radiated from the red or green pixel to the outside.

When blue chromaticity of the net light radiated from the organic light-emitting diode for the blue pixel is insufficient, it can be improved by shifting the selective reflection wavelength range and central wavelength of the selective reflection of the cholesteric liquid-crystal layer to the shorter-wavelength side from the wavelength range and emission peak wavelength of the organic light-emitting diode.

Next, a situation of viewing an image at an angle, i.e., at a large viewing angle, is described. Increasing viewing angle increases angle at which light entering the cholesteric liquid-crystal layer travels, shifting the selective reflection wavelength range to the shorter-wavelength side. As a result, the wavelength range of light radiated from the light-emitting thin-film layer and reflected by the cholesteric liquid-crystal layer before being absorbed by the polarizer to be reutilized also shifts to the shorter-wavelength side.

Figure 14:
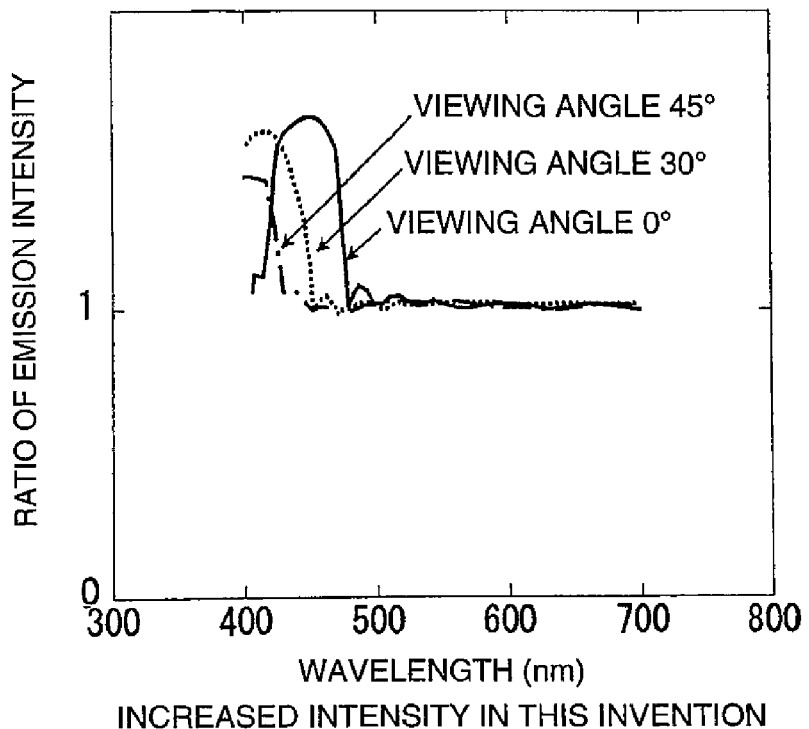
FIG. 14 shows wavelength dependence of the ratio of emission intensity of the OLED display of the present invention to that of a conventional OLED display.

FIG. 14 shows intensity of light emitted from the display (hereinafter referred to as "emission intensity") of the present invention to the viewer side, changing with wavelength, more specifically wavelength-dependence of the ratio of emission intensity of the OLED display of the present invention to that of the OLED display provided with the conventional circular polarizer at the same power consumption.

As shown in FIG. 14, emission intensity increases at a viewing angle of 0° in the selective reflection wavelength range of the cholesteric liquid-crystal layer as the circularly polarized light reflective layer by the effect brought by the layer. Increasing viewing angle shifts the selective reflection wavelength range to the shorter-wavelength side, and hence the wavelength range in which emission intensity increases also to the shorter-wavelength side.

Therefore, wavelength-dependence of intensity of light emitted from the display to the viewer side (hereinafter sometimes referred to as "emission spectrum) changes, which is accompanied by changed color, as viewing angle increases.

The present invention utilizes dependence of intensity of interference on viewing angle to compensate the problem of changed color resulting from the shifted selective reflection wavelength range of the cholesteric liquid-crystal layer.

OLED displays generally have an organic light-emitting diode comprising very thin layers, thickness being of the order of light wavelength or less, with the result that light radiated from the emission layer constituting the light-emitting thin-film layer is affected by interference. Its wavelength at which intensity increases or decreases by interference shifts to the short-wavelength side as viewing angle increases.

In the present invention, both $\lambda_{Imax}$ and $\lambda_O$, which are different from each other, fall into the wavelength range of light radiated from the light-emitting thin-film layer at a viewing angle of 0°, and preferably the relationship $\lambda_O > \lambda_{Emax} > \lambda_{Imax}$ or $\lambda_O < \lambda_{Emax} < \lambda_{Imax}$, wherein $\lambda_{Imax}$ is the wavelength at which intensity of interference to light radiated from the light-emitting thin-film layer attains a maximum, $\lambda_O$ is the central wavelength in the principal reflection wavelength range of light reflected by the circularly polarized light reflective layer and $\lambda_{Emax}$ is the peak wavelength of light radiated from the light-emitting thin-film layer.

In other words, the central wavelength in the principal reflection wavelength range of the circularly polarized light reflective layer and the wavelength at which intensity of interference attains a maximum are shifted to expand the wavelength range in which the effect of enhancing emission intensity is produced by the circularly polarized light reflective layer and interference effect.

The wavelength range in which the effect of enhancing emission intensity is produced shifts to the short-wavelength side as viewing angle increases. This effect is produced over a wider viewing angle range, when the wavelength range in which it is produced expands. As a result, the wavelength-dependence of intensity of light emitted from the display to the viewer side, i.e., emission spectrum, changes less with viewing angle to control color changes.

Figure 15:
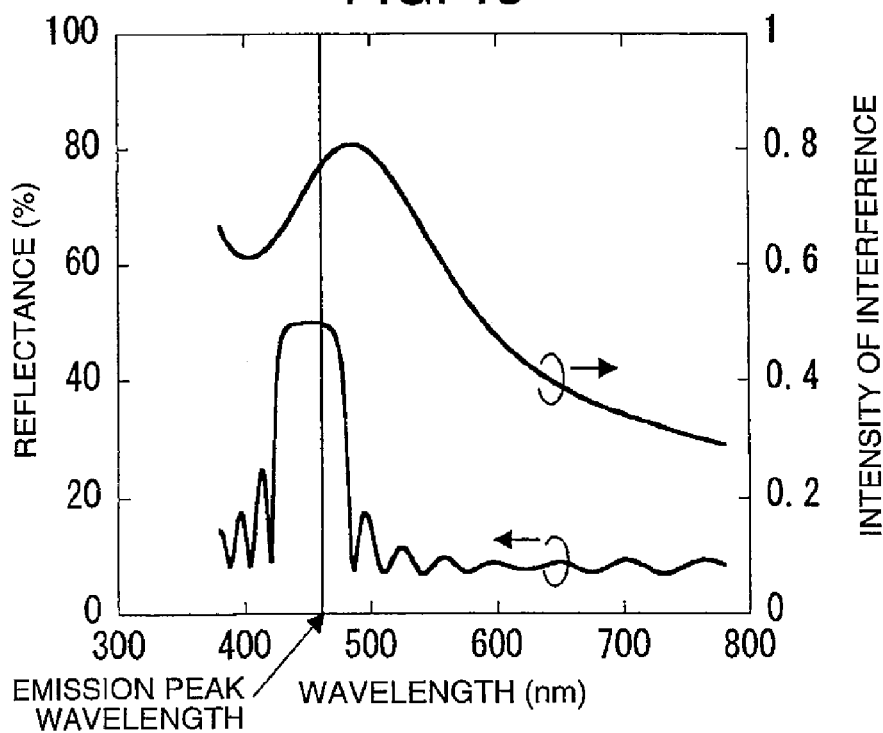
FIG. 15 shows one example of the wavelength-dependence of reflectance of a cholesteric liquid-crystal layer and intensity of interference for the present invention.

FIG. 15 shows one example of the wavelength-dependence of reflectance of the circularly polarized light reflective layer (i.e., cholesteric liquid-crystal layer) and intensity of interference of this embodiment, which satisfies the above conditions, wherein the right-pointing arrow indicates the interference intensity scale and left-pointing one the reflectance scale. FIG. 15 also shows the peak wavelength of light radiated from the light-emitting thin-film layer which constitutes the blue pixel for reference, wherein the peak wavelength of light radiated from the light-emitting thin-film layer ($\lambda_{Emax}$), central wavelength in the principal reflection wavelength range of light reflected by the cholesteric liquid-crystal layer working as the circularly polarized light reflective layer ($\lambda_o$) and wavelength at which intensity of interference to light radiated from the light-emitting thin-film layer attains a maximum ($\lambda_{Imax}$) are set at 460, about 450 and 480 nm, respectively.

Figure 16:
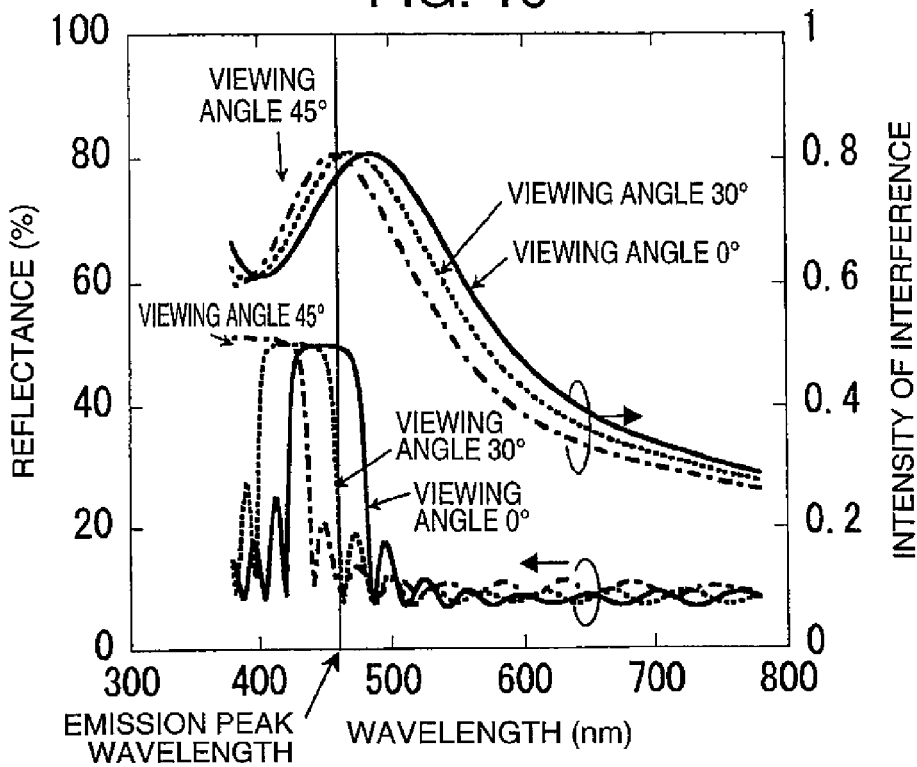
FIG. 16 shows one example of the wavelength-dependence of reflectance of a cholesteric liquid-crystal layer and intensity of interference for the present invention, changing with viewing angle.

FIG. 16 shows wavelength-dependence of reflectance of the cholesteric liquid-crystal layer and intensity of interference changing with viewing angle under the above conditions. Both the selective reflection wavelength range of the cholesteric liquid-crystal layer and wavelength at which intensity of interference attains a maximum shift to the short-wavelength side as viewing angle increases.

The central wavelength in the principal reflection wavelength range of the cholesteric liquid-crystal layer and wavelength at which intensity of interference attains a maximum deviate from each other, with the result that the emission peak wavelength of light radiated from the light-emitting thin-film layer is within the selective reflection wavelength range of the cholesteric liquid-crystal layer or a wavelength range in which intensity of interference is kept high even when viewing angle changes. As a result, the effect of enhancing emission intensity can be secured over a wide viewing angle range, and the wavelength-dependence of intensity of light emitted from the display to the viewer side, i.e., emission spectrum, changes less with viewing angle to control color changes.

In this embodiment, light radiated from the blue pixel to the viewer side changes in color, a decrease of about 30% in terms of chromaticity difference $\Delta xy$ relative to the level for the case where emission peak wavelength of light radiated from the light-emitting thin-film layer is coincided with the wavelength at which intensity of interference attains a maximum, as viewing angle increases from 0 to 60°

In this embodiment, the first and second foundation layers 11 and 12, gate insulating layer 16, and first and second insulating layers 18 and 20 are selectively removed at the area corresponding to the light-emitting area 61 of the pixel to provide aperture area, as shown in FIG. 1. In other words, the layers between the organic light-emitting diode 70 and substrate 6 are removed.

Figure 17:
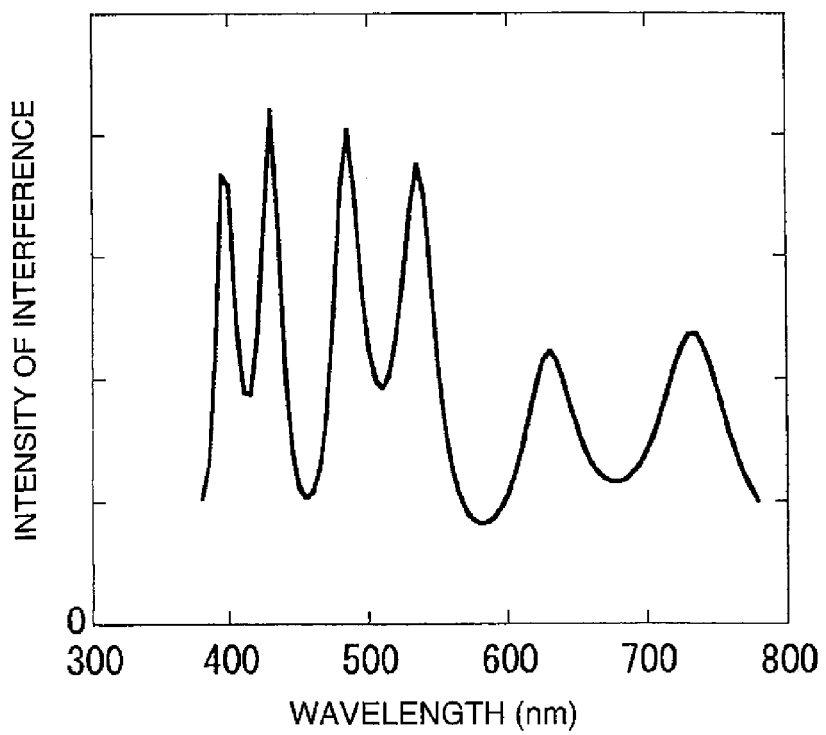
FIG. 17 shows one example of wavelength-dependence of intensity of interference in the display provided with a plurality of layers of different refractive index between an organic light-emitting diode and substrate.

On the other hand, FIG. 17 shows one example of wavelength-dependence of intensity of interference of light radiated from the light-emitting thin-film layer 100 at a viewing angle 0° for the case where the first and second foundation layers 11 and 12, gate insulating layer 16, and first and second insulating layers 18 and 20 are assumed to be held between the organic light-emitting diode 70 and substrate 6. As shown, presence of the layers of different refractive index between the organic light-emitting diode 70 and substrate 6 increases number of maxima and minima of intensity of interference in the visible wavelength range.

In this case, color changes resulting from dependence of interference effect on viewing angle may be beyond control by deviating the central wavelength in the principal reflection wavelength range of the circularly polarized light reflective layer and wavelength at which intensity of interference attains a maximum from each other.

It is therefore important to remove, as far as possible at least from the display area 61, a layer which is not necessary for light-emitting actions of the light-emitting device and has an adverse effect on interference of light radiated from the light-emitting thin-film layer, as is, the case with the display of this embodiment, or to select layers of limited refractive index difference, in order to minimize color changes resulting from dependence of the interference effect on viewing angle.

It should be noted, however, that removing a foundation layer or the like from the light-emitting area to decrease dependence of the interference effect on viewing angle may cause formation of passages for ions, e.g., Na or K, moving from the substrate. It is therefore preferable to form an ion-blocking layer at least in the area in which a switching device is provided, and also to protect the switching device with ion-blocking layer in all directions. This is to prevent problems, e.g., changed threshold voltage at a low-temperature-processed polycrystalline silicon TFT, resulting from contamination with ions, e.g., Na or K, moving from the substrate through new ion routes, which could be formed when a foundation layer is removed from the light-emitting area.

A tight layer, e.g., SiNx layer, is suitable for the ion-blocking layer. In this embodiment, as illustrated in FIG. 1, the switching device (driving transistor 10 in the figure) is protected from an ionic contaminant with the first foundation layer 11 of SiNx and second interlayer insulating layer 20 of SiNx in all directions. This structure can prevent changed threshold voltage at the TFT, which could result from contamination with ions.

Moreover, in this embodiment, removing the foundation layer and interlayer insulating layer from the area corresponding to the light-emitting area brings another advantage of preventing deformation of the substrate or microcracking of the layer, possibly caused by a stress developed in the layer, which is a concern in particular in the case of a large-size display.

Next, the effects of the optical compensation layer 800 on light radiated from the light-emitting thin-film layer are described.

Figure 18:
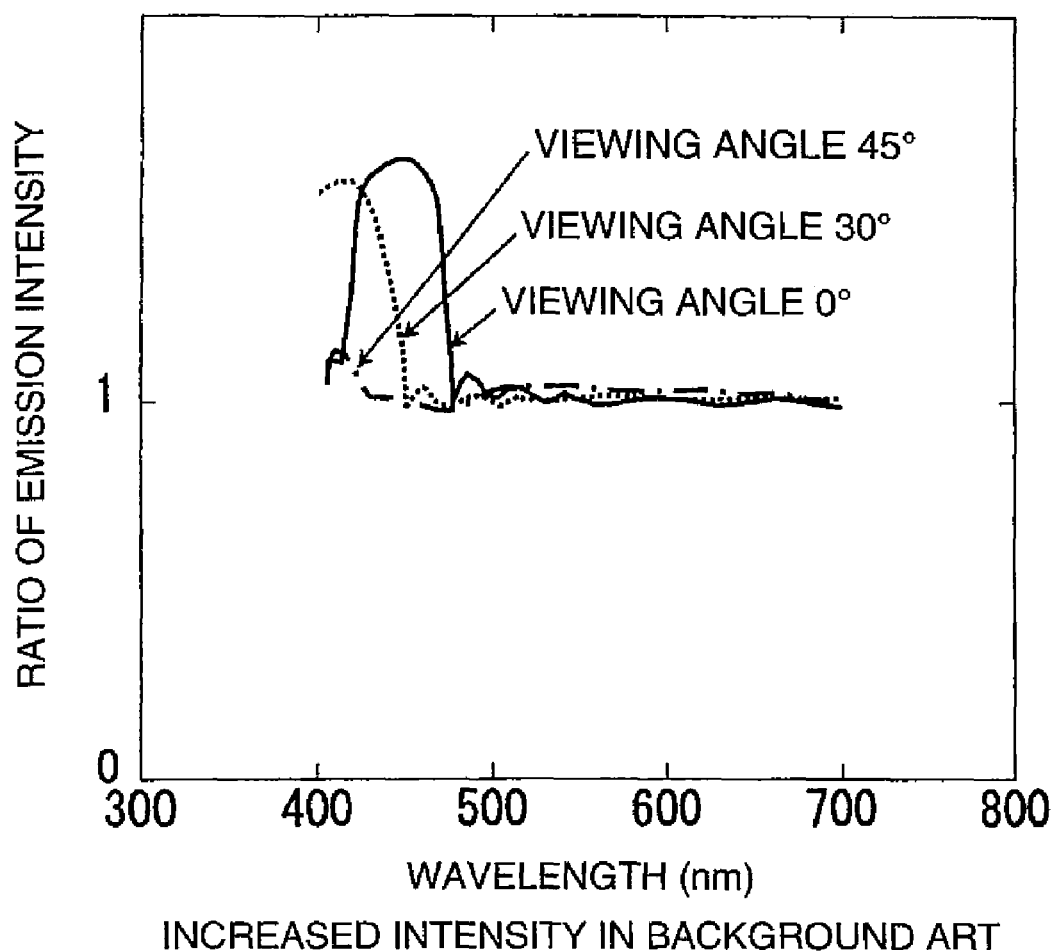
FIG. 18 shows wavelength-dependence of the ratio of emission intensity of an OLED display provided with a conventional circular polarizer to that of the display of the present invention from which the optical compensation layer is removed.

FIG. 18 shows wavelength-dependence of the ratio of emission intensity of the display of this embodiment, from which the optical compensation layer 800 is removed, to that of an OLED display provided with the conventional circular polarizer at the same power consumption level. Emission intensity is kept at a high level in the selective reflection wavelength range of the cholesteric liquid crystal layer at a viewing angle of 0° by the effect of the layer as the circularly polarized light reflective layer whether an optical compensation layer is provided or not, as is the case with the display of this embodiment. It is also shown that the wavelength in which emission intensity is kept at a high level shifts to the short-wavelength side as viewing angle increases, because of the shift of the selective reflection wavelength range of the cholesteric liquid crystal layer to the short-wavelength side. However, the effect of increasing emission intensity goes down as viewing angle increases in the absence of an optical compensation layer, to a very low level at 45°.

By contrast, the display of this embodiment keeps the effect of enhancing emission intensity more stably, because it is decreased less as viewing angle increases, although the wavelength range in which emission intensity is kept at a high level shifts to the short-wavelength side with viewing angle, as shown in FIG. 14. It is because a compensation by the optical compensation layer is effective also for light, which is radiated from the light-emitting thin-film layer, and is, before being absorbed by the polarizer, reflected by the circularly polarized light reflective layer (cholesteric liquid crystal layer) to be reutilized.

In other words, light radiated from the light-emitting thin-film layer and reflected by the circularly polarized light reflective layer (cholesteric liquid crystal layer) is reflected by the reflective electrode to be transmitted by the cholesteric liquid crystal layer, where a phase difference is produced in light being transmitted at an angle.

The phase difference produced at the cholesteric liquid crystal layer is compensated (offset) in the display of this embodiment with the optical compensation layer provided between the cholesteric liquid crystal layer and polarizer while the light is being transmitted by the optical compensation layer, with the result that most of light transmitted by the cholesteric liquid crystal layer is emitted to the outside without being absorbed by the polarizer. In a display provided with no optical compensation layer, on the other hand, part of light transmitted by the cholesteric liquid crystal layer is absorbed by the polarizer, because of its polarized state changed by the phase difference produced at the cholesteric liquid crystal layer. As a result, light radiated from the light-emitting thin-film layer and reflected by the circularly polarized light reflective layer for reutilization is partly lost as viewing angle increases to diminish the effect of enhancing emission intensity.

As discussed above, the effect of enhancing emission intensity does not go down precipitously as viewing angle increases, when an optical compensation layer is provided between the cholesteric liquid crystal layer and polarizer, and is merely shifted to the short-wavelength side. Therefore, light color may change as viewing angle changes depending on a condition. In order to avoid the light color change resulting from changed viewing angle, it is recommended to change position of the optical compensation layer to between the cholesteric liquid crystal layer and light-emitting diode.

Otherwise, the effect of changed viewing angle can be avoided by limiting the selective reflection wavelength range of the cholesteric liquid crystal layer to that of a blue color, as taken for the display of this embodiment. In other words, the effect of enhancing emission intensity shifts to the short-wavelength side as viewing angle increases in the display of this embodiment, or to the side of the ultraviolet wavelength range, in which spectral luminous efficiency is low, making reflection less visible. This has no effect on a color other than blue, e.g., green or red. It is necessary to take into consideration a balance with other colors, but the above change, rather enhancing blue color purity, has not necessarily a negative effect.

The parallax between light radiated from the light-emitting thin-film layer and reflected once by the circularly polarized light reflective layer (cholesteric liquid-crystal layer) before being emitted to the outside and light emitted to the outside without being once reflected by the circularly polarized light reflective layer increases as distance between the reflective electrode 300 and circularly polarized light reflective layer 500 increases, when the displayed image is viewed at an angle. It is therefore preferable to decrease the distance for minimizing the parallax, and in such a case, to provide an optical compensation layer between the circularly polarized light reflective layer and polarizer.

In an OLED display of bottom-emitting structure, such as the one of this embodiment, the light-emitting area 61 in each pixel shares an area with the storage capacitor 40, switching transistor, e.g., TFT, and line, among others. Therefore, reflection of ambient light can be greatly reduced, when the display is structured in such a way to have no or reduced reflection of light having a wavelength falling into the principal reflection wavelength range of the circularly polarized light reflective layer 500 in an area other than the light-emitting area 61.

More specifically, it is recommended to provide an antireflection means of antireflection layer, not shown, in an area other than the light-emitting area. The antireflection layer can exhibit its function so long as it shows no or reduced reflection of light having a wavelength falling in the reflection wavelength range of the circularly polarized light reflective layer. The material for the layer in itself may be light-absorptive or may be incorporated with a light-absorptive dye or pigment.

Moreover, it may be of a laminate of transparent or semi-transparent layers of different refractive index which produces an interference effect to show no or reduced reflection of light having a wavelength falling into the reflection wavelength range of the circularly polarized light reflective layer.

Still more, the storage capacitor 40 or line, which accounts for a relatively large area in the pixel, can be structured to work as an antireflection means. For example, the storage capacitor 40 can have a reduce reflectance in a wavelength range corresponding to a blue color, when structured to comprise a polysilicon (poly-Si), silicon oxide ($SiO_2$) and titanium-tungsten (Ti—W), in this order from the substrate 6.

Still more, reflectance in a wavelength range corresponding to a blue color may be reduced by controlling structure or thickness of the light-emitting thin-film layer in the light-emitting area of the pixel which radiates light other than blue, e.g., red or green, in such a way to produce an interference effect.

One of the above means can control reflection of light, as the component of ambient light entering the display from a bright ambient atmosphere, having a wavelength which falls in the reflection wavelength range of the circularly polarized light reflective layer 500 and corresponds to that of a blue color. Therefore, it reduces ambient light reflection caused by light having a wavelength falling into the reflection wavelength range of the circularly polarized light reflective layer 500, to realize a display having a higher contrast ratio in a bright atmosphere.

When the selective reflection wavelength range of the circularly polarized light reflective layer corresponds to the wavelength range of a blue color, as is the case with this embodiment, an antireflection means can be provided relatively easily and hence reflection of ambient light can be controlled easily, because the display members in general more efficiently absorb light of shorter wavelength.

Figure 19:
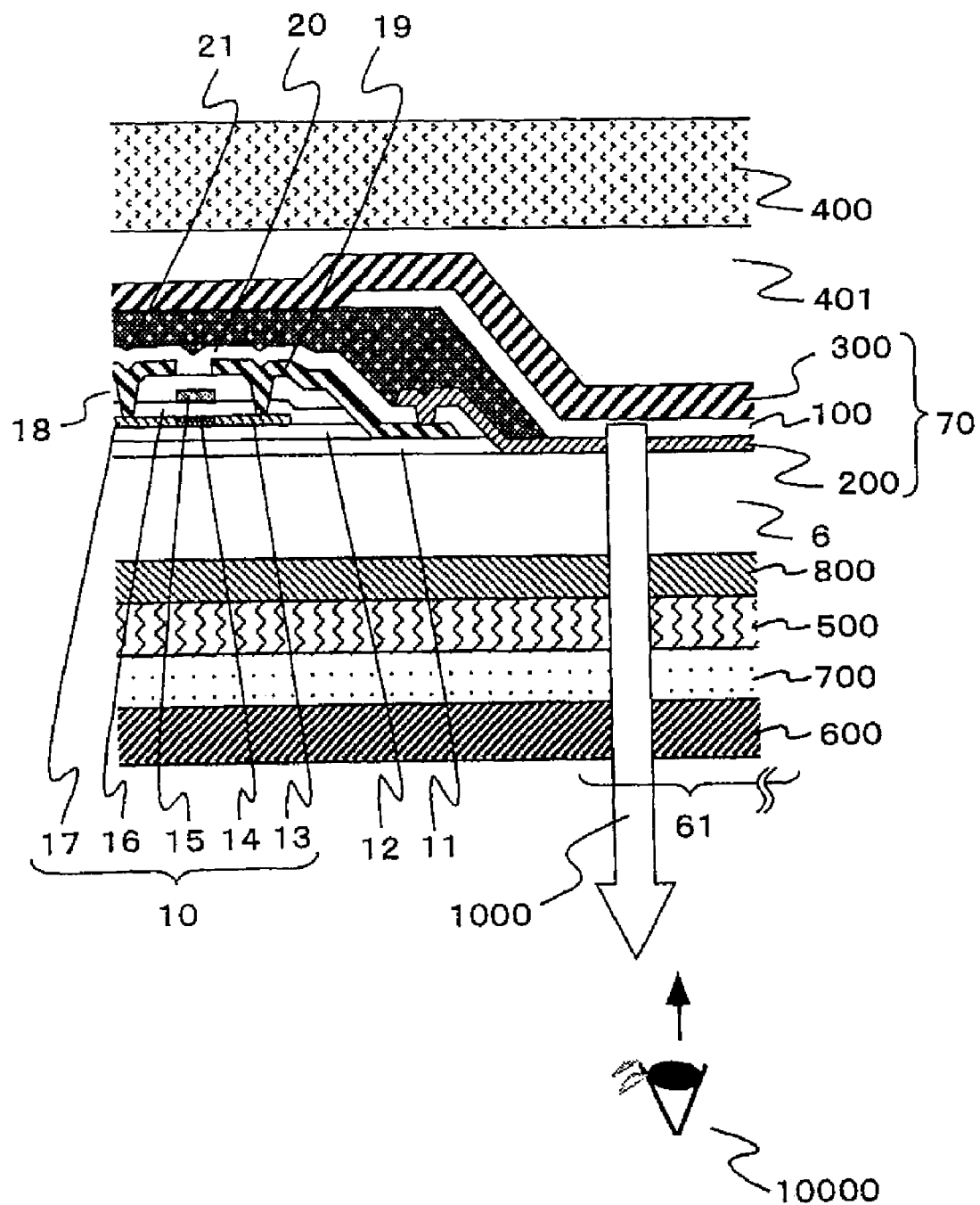
FIG. 19 is a cross-sectional view which schematically illustrates the structure around a pixel of one example of the light emitting displays of the present invention.

Next, another embodiment of the present invention is described by referring to FIG. 19. The display of this embodiment shares the common basic structure with that of the above embodiment, except that position of the optical compensation layer 800 is changed, more specifically changed from between the circularly polarized light reflective layer 500 and quarter-wave plate 700 to between the circularly polarized light reflective layer 500 and substrate Therefore, the common member is given the same sign and the detailed description is omitted. The structure of this embodiment is more preferable viewed from controlling color changes in a wide viewing angle range and ambient light reflection.

Figure 20:
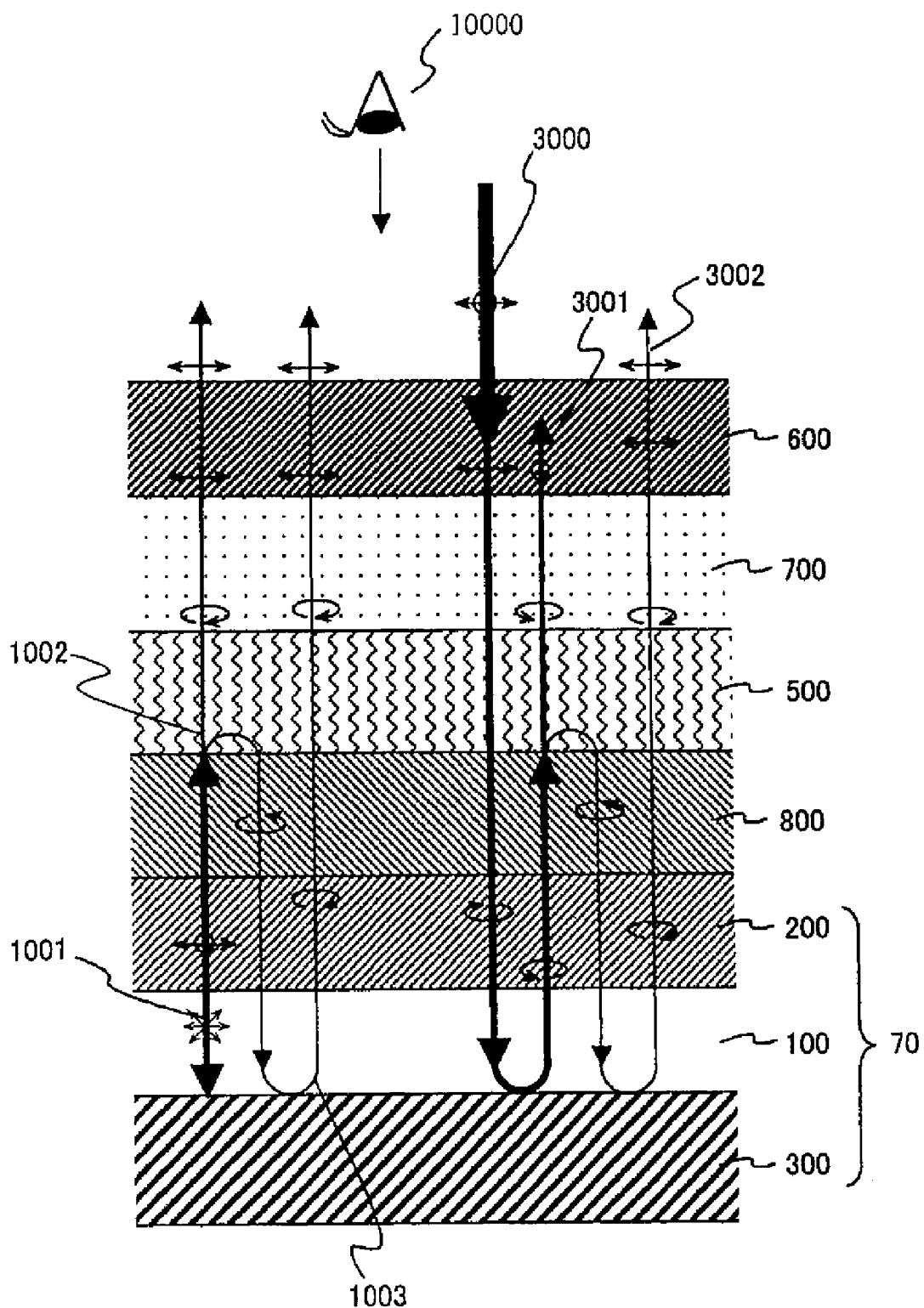
FIG. 20 is a part of cross-sectional structure of light-emitting area in the light emitting displays of the present invention.

Next, light radiated from the light-emitting thin-film layer 100 and ambient light entering the light-emitting area 61 are described by referring to FIG. 20. FIG. 20 is a cross-sectional view of the structure of this embodiment around the light-emitting area, where the members not directly related to light behavior, e.g., substrate, are not shown. They are described for the case with a cholesteric liquid-crystal layer used as the circularly polarized light reflective layer 500. Therefore, the sign 500 for the circularly polarized light reflective layer is hereinafter used also for the cholesteric liquid-crystal layer.

The light 1001 radiated from the light-emitting thin-film layer 100 is directed towards the transparent electrode 200 side either directly or after being reflected by the reflective electrode 300, and transmitted by the transparent electrode 200 and then by the optical compensation layer 800 to enter the cholesteric liquid-crystal layer 500. The light radiated from the light-emitting thin-film layer 100 is generally unpolarized. Therefore, the cholesteric liquid-crystal layer 500 reflects the incident light component circularly polarized, rotating in one direction (levoratatory circularly polarized light in this case) and having a wavelength falling into the selective reflection wavelength range of the layer 500, and transmits the other components.

Of the light 1002 transmitted by the cholesteric liquid-crystal layer 500, the component having a wavelength falling into the selective reflection wavelength range is converted by the quarter-wave plate 700 into linearly polarized light which can be transmitted by the polarizer 600, and emitted to the viewer 10000 side-after being transmitted by the polarizer 600. About half of the other light 1002 components, having a wavelength out of the selective reflection wavelength range of the cholesteric liquid-crystal layer 500, are absorbed by the polarizer 600, the remainder being transmitted and emitted to the viewer 10000 side.

On the other hand, the light 1003 reflected by the cholesteric liquid-crystal layer 500 is reflected by the reflective electrode 300 back to the cholesteric liquid-crystal layer 500, after being transmitted twice by the optical compensation layer 800. No or only a little phase difference is produced in light transmitted by the optical compensation layer 800 at a viewing angle of 0° or close thereto. The light reflected by the reflective electrode 300 back to the cholesteric liquid-crystal layer 500 is changed in traveling and becomes circularly polarized light rotating in the opposite direction (dextrorotatory circularly polarized light in this case) while being reflected by the electrode 300. Therefore, it is transmitted by the cholesteric liquid-crystal layer 500 this time. The light transmitted by the layer 500 is converted by the quarter-wave plate 700 into linearly polarized light which can be transmitted by the polarizer 600, and transmitted by the polarizer 600 to be emitted to the viewer 10000 side.

At a large viewing angle, on the other hand, a phase difference is produced in light reflected by the cholesteric liquid-crystal layer 500 and then by the reflective electrode 300 back to the layer 500, because it is transmitted twice at an angle by the optical compensation layer 800 before reentering the layer 500. This phase difference changes polarized conditions of the light before it reenters the cholesteric liquid-crystal layer 500, with the result that part of the light is transmitted by the layer 500 while the remainder is again reflected by the layer 500, and decays while it is reflected by the reflective electrode 300.

A phase difference is also produced in light transmitted by the cholesteric liquid-crystal layer 500 while it is passing through the layer 500 at an angle. This phase difference changes polarized conditions of light transmitted by the layer 500, allowing part of the light to be absorbed by the polarizer.

As a result, the effect of enhancing emission intensity associated with the reflection wavelength range of the circularly polarized light reflective layer 500 goes down as viewing angle increases. This, however, is accompanied by controlled color changes which result from the wavelength range in which the effect of enhancing emission intensity is secured shifting to the short-wavelength side.

Next, light entering the display area of the light emitting display from a bright ambient atmosphere is described. The ambient light 3000 entering the light emitting display from an ambient atmosphere is generally unpolarized. However, the polarizer 600 absorbs a linearly polarized light component having a plane of polarization aligned to a specific direction, while transmitting another linearly polarized light component having the plane perpendicular to the above. The quarter-wave plate 700 then acts on the light transmitted by the polarizer 600 to make it circularly polarized (e.g., dextrorotatory circularly polarized light in this case). The light transmitted by the quarter-wave plate 700 is then transmitted by the cholesteric liquid-crystal layer 500 to be directed to the reflective electrode 300, where it is reflected to travel in a different direction and become circularly polarized light rotating in the opposite direction (i.e., levorotatory circularly polarized light in this case). The light reflected by the reflective electrode 300 enters the cholesteric liquid-crystal layer 500, which straight transmits the light 3001 having a wavelength out of the selective reflection wavelength range while reflecting the light having a wavelength falling into the range.

The quarter-wave plate 700 then acts on the light 3001 transmitted by the cholesteric liquid-crystal layer 500 to convert it into linearly polarized light which can be absorbed by the polarizer 600. Therefore, the light transmitted by the quarter-wave plate 700 is absorbed by the polarizer 600 and is not emitted to the viewer 10000 side. Most of the light 3001 transmitted by the cholesteric liquid-crystal layer 500 is absorbed by the polarizer even at a large viewing angle, because the phase difference produced while it is being transmitted by the layer 500 is compensated by the optical compensation layer 800, and is not emitted to the viewer 10000 side.

On the other hand, the light 3002 reflected by the cholesteric liquid-crystal layer 500 is reflected by the reflective electrode 300 back to the cholesteric liquid-crystal layer 500, after being transmitted twice by the optical compensation layer 800. No or only a little phase difference is produced in light transmitted by the optical compensation layer 800 at a viewing angle of 0° or close thereto. The light reflected by the reflective electrode 300 back to the cholesteric liquid-crystal layer 500 is changed to become circularly polarized light rotating in the opposite direction while being reflected by the electrode 300. Therefore, it is transmitted by the cholesteric liquid-crystal layer 500 this time. The light 3002 transmitted by the layer 500 is converted by the quarter-wave plate 700 into linearly polarized light which can be transmitted by the polarizer 600, and transmitted by the polarizer 600 to be emitted to the outside.

At a large viewing angle, on the other hand, a phase difference is produced in light reflected by the cholesteric liquid-crystal layer 500 and then by the reflective electrode 300 back to the layer 500, because it is transmitted twice at an angle by the optical compensation layer 800 before reentering the layer 500. This phase difference changes polarized conditions of the light before it reenters the cholesteric liquid-crystal layer 500, with the result that part of the light is transmitted by the layer 500 while the remainder is again reflected by the layer 500, and decays while it is reflected by the reflective electrode 300.

A phase difference is also produced in light transmitted by the cholesteric liquid-crystal layer 500 while it is passing through the layer 500 at an angle. This phase difference changes polarized conditions of the light transmitted by the layer 500, allowing part of the light to be absorbed by the polarizer 600.

As a result, the display of this embodiment brings an effect of controlling reflection of ambient light as viewing angle increases, even it has a wavelength of the selective reflection wavelength range of the cholesteric liquid-crystal layer.

In other words, the display of this embodiment can control ambient light reflection resulting from the phase difference produced at the cholesteric liquid-crystal layer 500 and that from the selective reflection wavelength range of the layer 500 over a wide viewing angle range by positioning the optical compensation layer 800 between the cholesteric liquid-crystal layer 500 and organic light-emitting diode 70. As a result, this brings an effect of realizing a light emitting display of high contrast ratio over a wide viewing angle range even in a bright atmosphere.

Figure 21:
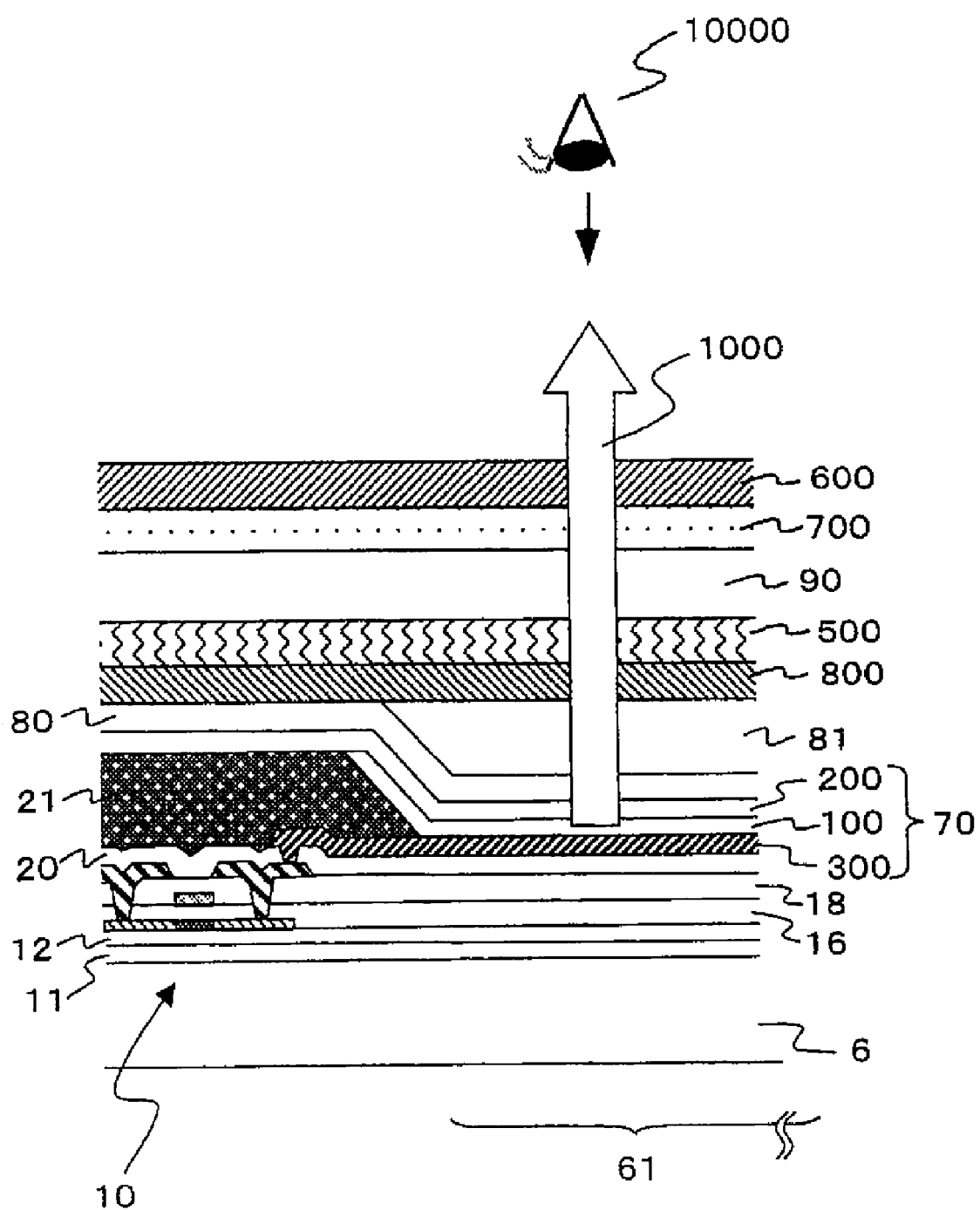
FIG. 21 is a cross-sectional view which schematically illustrates the structure around a pixel of another example of the light emitting displays of the present invention.
Figure 22:
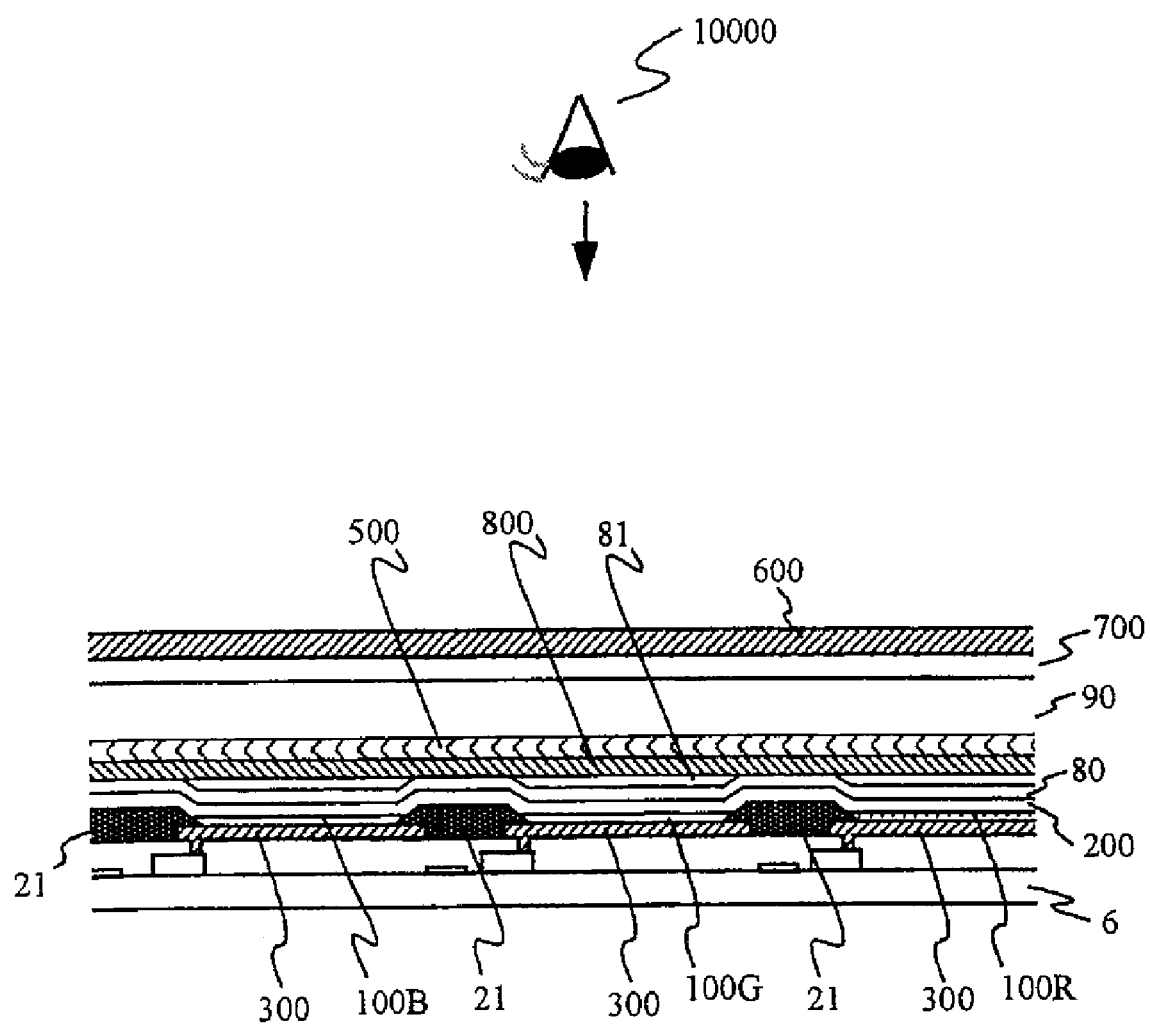
FIG. 22 is a part of cross-sectional structure of one example of the light emitting displays of the present invention.

Next, still another embodiment of the present invention is described by referring to FIGS. 21 and 22. The display of this embodiment shares the common members with that of the above embodiment, and they are given the same signs and the detailed description is omitted. FIG. 21 schematically illustrates the cross-sectional structure around a pixel of the light emitting display of this invention. FIG. 22 also schematically illustrates the cross-sectional structure showing a part of the light emitting display of this invention, where the light-emitting thin-film layers are patterned in such a way that the light-emitting thin-film layers 100R, 100G and 100B emitting a red, green and blue colors, respectively are separated from each other.

The display of this embodiment is the so-called top-emitting structure OLED in which light is emitted from the opposite side to the substrate 6 on which the organic light-emitting diode 70 is provided. Therefore, the reflective electrode 300 that constitutes the organic light-emitting diode 70 is connected to the driving transistor 10. An N-channel type TFT is used as the driving transistor 10, when the reflective electrode 300 is to work also as the cathode.

In this embodiment, light radiated from the light-emitting thin-film layers 100 (100R, 100G and 100B) does not directly enter the gate-insulating layer 16 that constitutes the switching device, first or second interlayer insulating layer 18 or 20, or first or second foundation layer 11 or 12. Therefore, it is not necessary to remove these layers from the light-emitting area, unlike in the case of the above-described embodiment, because they have no interference effect on light radiated from the light-emitting thin-film layer.

The third insulating layer 21 is provided around the light-emitting area 61 in such a way to cover the reflective electrode 300 periphery. The third insulating layer 21 is preferably composed of a material which shows no or only a limited reflection of light having a wavelength falling into the principal reflection wavelength range of the circularly polarized light reflective layer 500. In other words, it preferably works as an antireflection means for at least light having a wavelength falling into the principal reflection wavelength range of the circularly polarized light reflective layer 500.

For example, a photosensitive resin which can be formed into a pattern by photolithography with light of short wavelength, e.g., ultraviolet ray, as the exposure can be used as a material for the third insulating layer 21, because such a resin generally absorbs light having a short wavelength corresponding to that of a blue color. Moreover, the photosensitive resin may be dispersed with a light-absorptive pigment or dye for the third insulating layer 21. The third insulating layer 21 can be formed by photolithography or printing.

The light-emitting thin-film layers 100 (100R, 100G and 100B) each emitting one of a red, green and blue colors are patterned in a given manner on the reflective electrode 300. The structure and material for the light-emitting thin-film layer may be selected from those described above. The light-emitting thin-film layers 100 (100R, 100G and 100B in FIG. 22) can be patterned by a known selective deposition method for vacuum-evaporated organic layers with a shadow mask (e.g., the one disclosed by S. Miyaguchi, et. al, Organic LED Full-color Passive-matrix Display, Journal of the SID, 7, 3, pp. 221 to 226, 1999), when they are of a low-molecular-weight compound. In the above method, the third insulating layer 21 can be used as a stopper element for the shadow mask.

The light-emitting thin-film layers can be also patterned by a known ink-jet patterning method (e.g., the one disclosed by T. Shimoda, et. al, Multicolor Pixel Patterning of Light-Emitting Polymers by Ink-Jet Printing, SID 99 DIGEST, 376, 1999), when they are of a polymer. In the above method, the third insulating layer 21 can be used as a bank for separating the pixel areas from each other.

The light-emitting thin-film layer 100 is totally coated with the transparent electrode, which is connected to a current supply line not shown. It is recommended that the transparent electrode 200 is coated, as required, with the overcoat 80 of a transparent, insulating material. The overcoat 80 not only protects the transparent electrode 200 but also facilitates lamination of the members on the electrode 200.

The overcoat 80 preferably has a lower refractive index than the transparent electrode 200 and a higher refractive index than air in a wavelength range of light radiated from the light-emitting thin-film layer 100. A transparent electrode generally has a high refractive index of around 1.9 to 2.3. Therefore, the refractive index difference between the transparent electrode 200 and a gas, when a gas is present immediately above the electrode 200, increases to reflect more light in the electrode/gas interface. In this case, interference intensity is more sensitive to light wavelength, and colors change more with viewing angle as a result of dependence of interference intensity on viewing angle.

Therefore, the transparent electrode 200 is preferably coated with the transparent overcoat 80 having a refractive index between those of the electrode 200 and gas, more specifically around 1.4 to 1.7, to control reflection in the interface and decrease dependence of interference intensity on viewing angle, in order to control color changes with Viewing angle.

It is recommended that the overcoat 80 is composed of an inorganic material transparent to the visible light, e.g., silicon oxide, or an organic, transparent material, e.g., acrylic, benzocyclobutene or polyimide resin. These organic materials, when formed into a film by spin coating or the like, can have a planarized surface relatively easily.

The transparent sealing plate 90, gas barrier, optically isotropic and transparent to the visible light, is provided above the overcoat 80. The circularly polarized light reflective layer 500 and optical compensation layer 800 are provided on one side of the transparent sealing plate 90, and the quarter-wave plate 700 and polarizer 600 on the other side. The transparent sealing plate 90 is provided in such a way that the surface on which the circularly polarized light reflective layer 500 is to be provided faces the substrate 6 surface on which the light-emitting thin-film layer is to be provided.

The transparent sealing plate 90 may be a glass plate, high-molecular-weight compound film treated to be gas barrier, or laminate of a thin glass plate and resin film. The high-molecular-weight compound film may be an optically isotropic plastic sheet or film, e.g., polymer film (e.g., polycarbonate or triacetyl cellulose film formed by casting), or alicyclic acryl resin plate formed by injection molding. It is necessary for a high-molecular-weight compound film or resin plate, when used, to have a gas barrier characteristic. It may be treated to have a gas barrier layer or laminated with a glass layer, several tens microns thick.

The circularly polarized light reflective layer 500 may be a cholesteric liquid-crystal layer having a principal selective reflection wavelength range corresponding to the wavelength range of a blue color, as is the case with each of the above-described embodiments. One method for providing the circularly polarized light reflective layer 500 of a cholesteric liquid-crystal layer on the transparent sealing plate 90 involves a series of steps: coating the transparent sealing plate 90 with an alignment layer of polyimide or the like and alignment-treating the layer; coating the alignment layer with a mixture of cholesteric liquid-crystal and photopolymerization initiator, and treating the resulting layer to have desired conditions by utilizing temperature-dependence of the selective reflection wavelength range of the cholesteric liquid-crystal; and immobilizing the layer with ultraviolet ray for cross-linking.

Formation of the circularly polarized light reflective layer 500 for the present invention is not limited, and any method can be used so long as it can form the layer 500 having a desired selective reflection wavelength range. For example, the cholesteric liquid-crystal layer having a desired selective reflection wavelength range, formed on a transparent substrate film, e.g., triacetyl cellulose film, may be adhered to the transparent sealing plate via a transparent adhesive agent.

The optical members for the present invention include the circularly polarized light reflective layer 500, quarter-wave plate 700 and polarizer 600 provided in this order from the transparent electrode 200 side, and the optical compensation layer 800, which may be positioned in any position between the polarizer 600 and transparent electrode 200. As discussed earlier, light having a wavelength falling into the selective reflection wavelength range of the cholesteric liquid-crystal layer behaves differently depending on where the optical compensation layer 800 is positioned.

In this embodiment, the case in which the optical compensation layer 800 is positioned between the cholesteric liquid-crystal layer as the circularly polarized light reflective layer 500 and transparent electrode 200 is described.

The quarter-wave plate 700 and polarizer 600 are provided on the transparent sealing plate 90 on the side opposite to the side on which the circularly polarized light reflective layer 500 is to be provided. The quarter-wave plate 700 and polarizer 600 are similar to those for the previous embodiment, and are adhered to each other via a transparent, acrylic adhesive agent.

The transparent sealing plate 90 and substrate 6 are tightly adhered to each other by an adhesive sealant, incorporated with a spacer material, e.g., beads or rods, spread around the display area of the display in a frame shape. It is important in this case that the optical compensation layer 800 and circularly polarized light reflective layer 500 are provided in the area corresponding to the display area while by-passing the transparent sealing plate 90 periphery or in the area slightly larger than the display area to increase an alignment margin, so that the transparent sealing plate 90 securely comes into contact directly with the sealant. This is to secure life time of the organic light-emitting diode by preventing ambient air through the optical compensation layer or circularly polarized light reflective layer, when it is positioned between the sealant and transparent sealing plate 90.

It is recommended that the gap between the transparent sealing plate 90 and substrate 6, i.e., the gap 81 between the optical compensation layer 800 and overcoat 80, is sealed with an inert gas, e.g., nitrogen gas. Otherwise, the gap may be totally closed with a transparent body, e.g., transparent adhesive agent, to shut out a gas. In this case, it is recommended that the gap 81 is filled with a transparent body having a refractive index of around 1.4 to 1.7 to decrease a refractive index difference at an interface between the layers. The overcoat 80 may be dispensed with when the gap 81 between the transparent sealing plate 90 and substrate 6 is filled with a transparent body. Reflections at the interface between the transparent electrode 200 and gap 81 and at the interface between the gap 81 and optical compensation layer 800 become smaller than the case that the gap 81 is filled with a gas, and therefore the effect of reflection on interference intensity in these interfaces becomes smaller.

The transparent sealing plate 90 may be replaced by a gas barrier film of inorganic transparent body, or laminate of alternately placed inorganic and organic transparent films, formed on the transparent electrode 200 to provide the gas barrier.

Position of each optical member for this embodiment relative to the inorganic or organic transparent film is not limited so long as the circularly polarized light reflective layer 500, quarter-wave plate 700 and polarizer 600 are provided in this order from the transparent electrode 200 side, and the optical compensation layer 800 is placed in any position between the polarizer 600 and transparent electrode 200.

However, it is necessary for both the inorganic and organic transparent films for realizing a gas barrier characteristic to be optically isotropic. Alternately, the transparent sealing plate 90 may be dispensed with, when at least one of the optical compensation layer 800, circularly polarized light reflective layer 500, quarter-wave plate 700 and polarizer 600 is treated to have a sufficient gas barrier effect.

The effect similar to those for the previous embodiments can be realized also in this embodiment. In other words, positioning the optical compensation layer 800 between the cholesteric liquid-crystal layer 500 and transparent electrode 200 controls ambient light reflection resulting from the phase difference produced at the cholesteric liquid-crystal layer 500 and that resulting from light having a wavelength falling into the selective reflection wavelength range of the layer 500 over a wide viewing angle range. As a result, it brings an effect of realizing a light emitting display of high contrast ratio over a wide viewing angle range even in a bright atmosphere.

In this embodiment, the third insulating layer 21 is provided around the light-emitting area 61 in such a way to decrease reflection of light having a wavelength falling into the principal reflection wavelength range of the circularly polarized light reflective layer 500, as described earlier. In this case, essentially no ambient light entering the display area from a bright atmosphere is emitted to the viewer side, when it enters the third insulating layer 21, because ambient light entering the third insulating layer 21 is reflected to a limited extent when it has a wavelength falling into the selective reflection wavelength range of the cholesteric liquid-crystal layer 500, and the other component having a wavelength out of the above range is absorbed by the polarizer 600 after being reflected by the third insulating layer 21. As a result, this embodiment can realize a light emitting display of high contrast ratio over a wide viewing angle range even in a bright atmosphere.

The third insulating layer 21 brings another advantage of preventing a cross talk or blooming, because the third insulating layer 21 prevents a light, which is radiated from the light-emitting thin-film layer 100 and is reflected by the circularly polarized light reflective layer, from leaking from one pixel to another. When the third insulating layer 21 is composed of a material containing a black pigment, in particular, a high-quality image free of cross talk or blooming can be produced, because it separates the pixels from each other.

In the light emitting display of the present invention, a parallax may be produced between light radiated from the light-emitting thin-film layer 100 and emitted to the outside after being once reflected by the circularly polarized light reflective layer (cholesteric liquid-crystal layer) 500 and light emitted to the outside without once being reflected by the layer 500 when the image is viewed at an angle as distance between the reflective electrode 300 and circularly polarized light reflective layer 500 increases. The increased distance may cause other problems, e.g., image resolution seems to decrease because of light reflected by the circularly polarized light reflective layer 500 leaking from the reflective electrode of one pixel to that of another pixel, and light radiated from the light-emitting thin-film layer 100 and reflected by the circularly polarized light reflective layer 500 falls off before reaching the viewer because it is absorbed by the third insulating layer 21 or the like. It is therefore preferable to minimize distance between the reflective electrode 300 and circularly polarized light reflective layer 500 viewed from image quality and light utilization efficiency.

The light emitting display of this embodiment, being of top-emission type, can dispense with an optical member having a thickness reaching several hundreds microns, e.g., glass substrate, between the circularly polarized light reflective layer 500 and reflective electrode 300. This reduces distance between the circularly polarized light reflective layer 500 and reflective electrode 300.

Moreover, the above structure reduces a parallax between light radiated from the light-emitting thin-film layer 100 and emitted to the outside after being once reflected by the circularly polarized light reflective layer 500 and light emitted to the outside without once being reflected by the layer 500. It also enhances light utilization efficiency, because light radiated from the light-emitting thin-film layer 100 and reflected by the circularly polarized light reflective layer 500 is less absorbed by the third insulating layer 21, leading to reduced loss. Still more, it prevents leaking of light radiated from the light-emitting thin-film layer 100 and reflected by the circularly polarized light reflective layer 500 from the reflection electrode of one pixel to that of another pixel, and hence prevents resolution loss or cross talk. As a result, it realizes a light emitting display which can produce a high-quality image free of resolution loss.

This embodiment coats the substrate 6 on which the organic light-emitting diode 70 is to be provided with the optical members, e.g., the circularly polarized light reflective layer 500, which are separately prepared beforehand, because troubles, e.g., deterioration of the light-emitting thin-film layer or the like, may occur while the cholesteric liquid-crystal layer as the circularly polarized light reflective layer 500 is provided on the substrate 6 which has been already coated with the organic light-emitting diode.

Separating the step for forming the circularly polarized light reflective layer 500 from that for forming the organic light-emitting diode 70, as adopted in this embodiment, increases freedom of each step, preventing these steps from adversely affecting each other to realize a high-performance display. However, a circularly polarized light reflective layer 500 and organic light-emitting diode 70 can be formed on the same substrate in the future when a highly durable organic material is developed.

This embodiment positions the optical compensation layer 800 between the transparent electrode 200 and circularly polarized light reflective layer 500. However, it may be positioned between the quarter-wave plate 700 and circularly polarized light reflective layer 500. This increases the effect of enhancing emission intensity by the selective reflection of the cholesteric liquid-crystal layer over a wide viewing angle, as discussed earlier.

Figure 23:
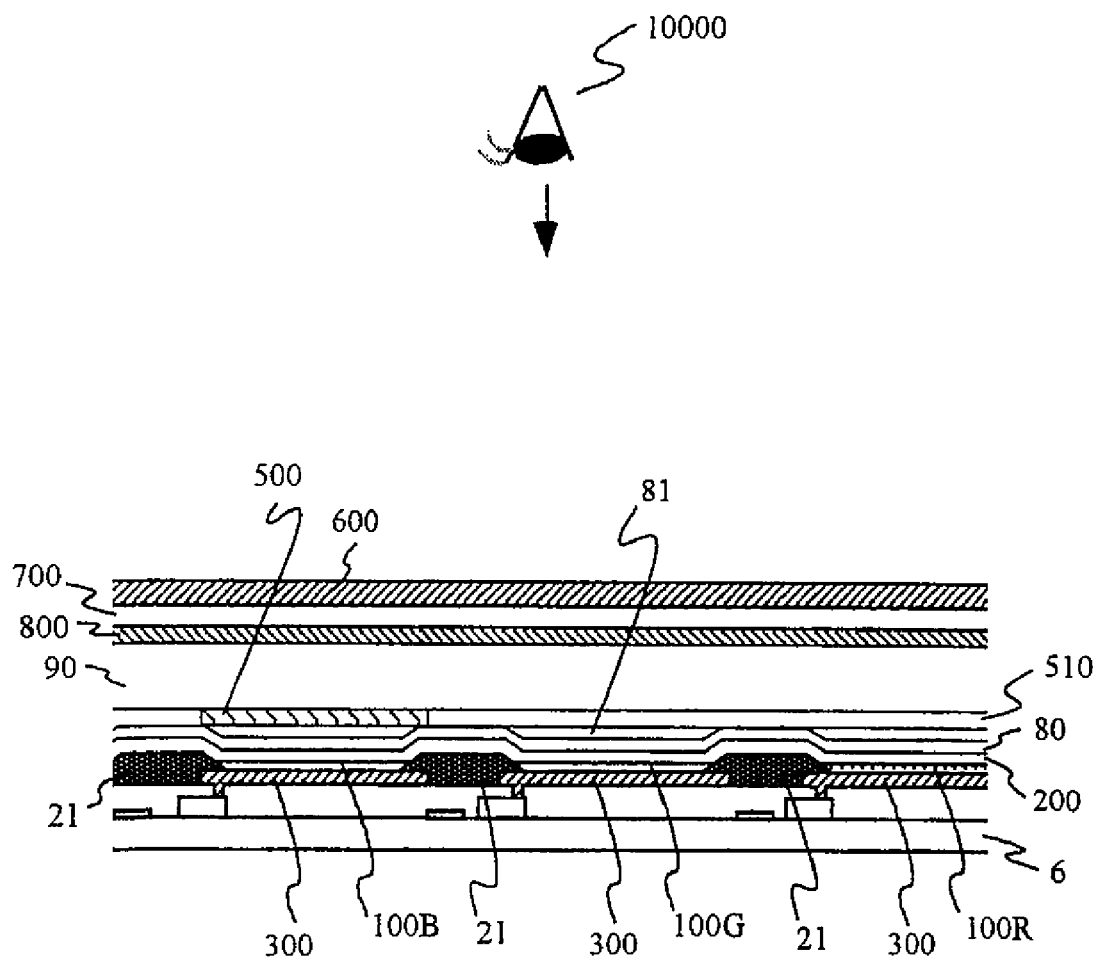
FIG. 23 is a part of cross-sectional structure of another example of the light emitting displays of the present invention.

Next, still another embodiment of the OLED display of the present invention is described by referring to FIG. 23. The figure schematically outlines part of the cross-section of the display of the present invention. This display shares the basic structure with the previous embodiment, illustrated in FIGS. 21 and 22, except that the cholesteric liquid-crystal layer as the circularly polarized light reflective layer 500 is selectively positioned on the light-emitting thin-film layer 100B that constitutes the blue pixel, and the optical compensation layer 800 is positioned on the viewer 10000 side of the transparent sealing plate 90. The common members are given the same signs and the detailed description is omitted.

As illustrated in FIG. 23, the display of this embodiment selectively positions the cholesteric liquid-crystal layer as the circularly polarized light reflective layer 500 on the light-emitting thin-film layer 100B that constitutes the blue pixel. In this case, there may be a difference in level between the transparent sealing plate 90 segment on which the circularly polarized light reflective layer 500 is provided and the other segment. Therefore, the transparent sealing plate 90 may be coated with the planarization layer 510 to make the surface smoother. The planarization layer 510 may be composed of an organic, transparent material, e.g., acrylic, benzocyclobutene or polyimide resin. These organic materials, when formed into a film by spin coating or the like, can have a planarized surface relatively easily.

In this embodiment, as is the case with the previous embodiment, the circularly polarized light reflective layer 500 works to efficiently utilize light having a wavelength corresponding to a blue color, which is absorbed by a polarizer and lost in the conventional display, enhancing light utilization of the blue pixel. As a result, the light emitting display of the present invention produces a brighter image than the conventional display at the same power consumption, or an image of the same brightness at a lower power consumption. Moreover, this embodiment realizes a light emitting display having a wider displayed color range, because it emits blue-color light (external emitted blue light) having a higher excitation purity than internal emitted blue light radiated from the light-emitting thin-film layer.

Moreover, this embodiment is provided with the optical compensation layer 800 to control ambient light reflection, caused by a phase difference produced at the cholesteric liquid-crystal layer as the circularly polarized light reflective layer, over a wider viewing angle range and realizes a light emitting display producing an image of high contrast ratio over a wider viewing angle range even in a bright atmosphere.

In particular, this embodiment has the circularly polarized light reflective layer at no position other than that corresponding to the light-emitting thin-film layer 100B, and controls ambient light reflection caused by light having a wavelength falling into the selective reflection wavelength range of the cholesteric liquid-crystal layer to a much lower level, one-thirds or less, than the case with the cholesteric liquid-crystal layer totally covering the display area. As a result, it realizes a light emitting display of high contrast ratio even in a bright atmosphere.

This embodiment positions the optical compensation layer 800 between the quarter-wave plate 700 and circularly polarized light reflective layer 500. This arrangement produces the effect of enhancing emission intensity by the selective reflection of the cholesteric liquid-crystal layer 500 over a wider viewing angle range.

On the other hand, ambient light entering the display area from an ambient atmosphere shows reflection resulting from light having a wavelength falling into the reflection wavelength range of the cholesteric liquid-crystal layer 500, which does not go down precipitously as viewing angle increases, although accompanied by the wavelength range shifting to the short-wavelength side. In the display of this embodiment, the cholesteric liquid-crystal layer 500 has the principal reflection wavelength range limited to the range associated with a blue color. The range shifts to the ultraviolet range, in which spectral luminous efficiency is low, as viewing angle increases, making reflection less visible and causing no problem.

This embodiment positions the optical compensation layer 800 between the quarter-wave plate 700 and circularly polarized light reflective layer 500. However, it may be positioned between the circularly polarized light reflective layer 500 and transparent electrode 200. In this case, ambient light reflection resulting from light of a wavelength range of the selective reflection of the cholesteric liquid-crystal layer becomes saller, as viewing angle increases, as discussed earlier.

Figure 24:
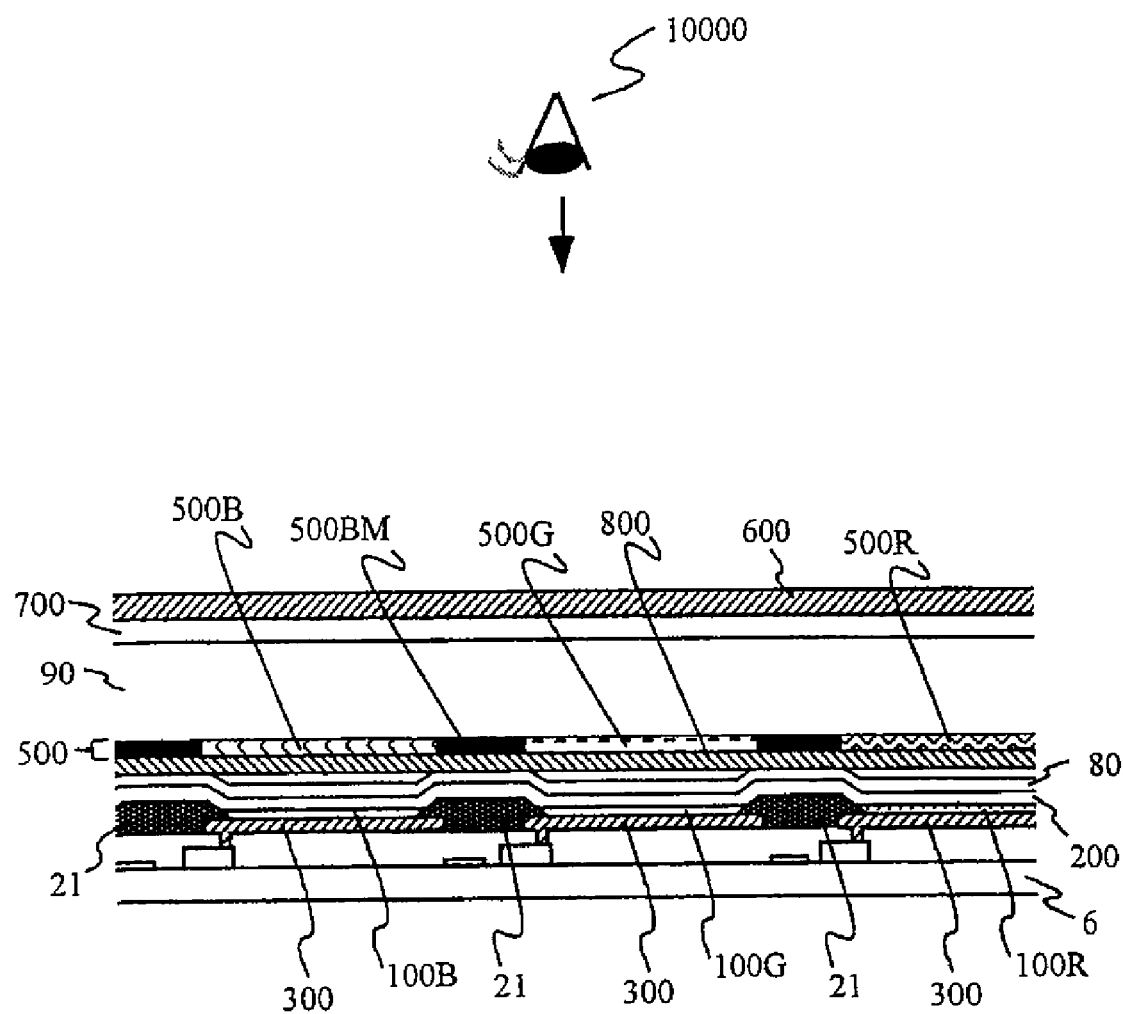
FIG. 24 is a part of cross-sectional structure of still another example of the light emitting displays of the present invention.

Next, still another embodiment of the light emitting display of the present invention is described by referring to FIG. 24. The figure schematically outlines part of the cross-section of the light emitting display of the present invention. This display shares the basic structure with the previous embodiment, illustrated in FIGS. 21 and 22, except that the cholesteric liquid-crystal layer as the circularly polarized light reflective layer 500 is patterned in a plurality of areas. The common members are given the same signs and the detailed description is omitted.

The display of this embodiment has the circularly polarized light reflective layers 500 patterned in such a way that the circularly polarized light reflective layer 500B having the principal selective reflection wavelength range corresponding to the wavelength range of a blue color is positioned on the light-emitting thin-film layer 100B that constitutes the blue pixel, the circularly polarized light reflective layer 500G having the principal selective reflection wavelength range corresponding to the wavelength range of a green color on the light-emitting thin-film layer 100G that constitutes the green pixel, and the circularly polarized light reflective layer 500R having the principal selective reflection wavelength range corresponding to the wavelength range of a red color on the light-emitting thin-film layer 100R that constitutes the red pixel. In short, the cholesteric liquid-crystal layers (i.e., circularly polarized light reflective layers 500) of different selective reflection wavelength range for this embodiment are patterned on the plane in such a way to correspond to each color emitted from the light-emitting thin-film layer that constitutes the pixel.

The central wavelength of the selective reflection of the cholesteric liquid-crystal layer 500 corresponds to wavelength of each color. For example, it is recommended to select the central wavelength from a range of 440 to 480 nm for a blue color, 540 to 580 nm for a green color and 600 to 640 nm for a red color. The selective reflection wavelength range width is preferably limited to 130 nm or less to control ambient light reflection, as discussed earlier.

It is recommended to provide the black matrix 500BM to cover the non-emitting area of the pixel among the cholesteric liquid-crystal layers 500B, 500G and 500R of different color. The black matrix 500 BM may be composed of metallic chromium, chromium oxide or a photosensitive resin dispersed with a light-absorptive pigment. The black matrix BM preferably has an aperture area larger than the light-emitting area of the pixel to increase an alignment margin between the patterned cholesteric liquid-crystal layer and light-emitting area of the pixel.

It is also recommended that each of the patterned cholesteric liquid-crystal layers is coated with an overcoat (not shown) of a transparent resin to planarize the surface. This is to facilitate lamination of the optical compensation layer 800 thereon and also to avoid scattered optical characteristics resulting from the surface of uneven level.

The patterned cholesteric liquid-crystal layers 500R, 500G and 500B preferably have a constant $(n_x-n_z) \cdot d$ value. This is to allow the one optical compensation layer 800 provided to totally cover the display area to compensate all of the phase differences produced at the patterned cholesteric liquid-crystal-layers 500R, 500G and 500B.

The patterned cholesteric liquid-crystal layers 500R, 500G and 500B can have a constant $(n_x-n_x) \cdot d$ value, when they are composed of the same liquid-crystal material and formed to have the same thickness. Otherwise, they may be controlled to have a constant $(n_x-n_z) \cdot d$ value by an adequate method, when a different material is used for each layer.

In the present embodiment, the polarizer 600 absorbs less light, not only for blue-color light but also light radiated from the light-emitting thin-film layers 100G and 100R, each constituting the pixel for a green or red color known to have a high spectral luminous efficiency, by the actions of the circularly polarized light reflective layers 500G and 500R, to enhance light utilization efficiency. As a result, this embodiment can realize a light emitting display which produces a brighter image at the same power consumption, or an image of the same brightness at a lower current level in the organic light-emitting diode, reducing power consumption and extending life time.

Moreover, this embodiment realizes a light emitting display having a wider displayed color range than the material in itself for the light-emitting thin-film layer, because light actually emitted to the viewer side (external emitted light) has a higher excitation purity than internal emitted light radiated from the light-emitting thin-film layer that constitutes each of the blue, green and red pixels.

Moreover, this embodiment is provided with the optical compensation layer 800 to control ambient light reflection, caused by a phase difference produced at the cholesteric liquid-crystal layer as the circularly polarized light reflective layer, over a wider viewing angle range.

This embodiment positions the optical compensation layer 800 between the circularly polarized light reflective layer 500 and transparent electrode 200. Therefore, ambient light reflection resulting from light of a wavelength range of the selective reflection of the cholesteric liquid-crystal layer, becomes smaller, as viewing angle increases, as discussed earlier. As a result, it realizes a light emitting display of high contrast ratio even in a bright atmosphere.

The optical compensation layer 800 is preferably provided between the circularly polarized light reflective layer 500 and transparent electrode 200, when the principal reflection wavelength range of the circularly polarized light reflective layer covers the wavelength range outside of that corresponding to a blue color, as is the case with this embodiment, for the following reasons.

When the optical compensation layer 800 is provided between the quarter-wave plate 700 and circularly polarized light reflective layer 500, for example, the phase difference occurring in light radiated from the light-emitting thin-film layer and transmitted by the cholesteric liquid crystal layer as the circularly polarized light reflective layer is compensated. As a result, the effect of enhancing emission intensity does not precipitously go down as viewing angle increases, although the wavelength range in which the effect is produced shifts to the short wavelength side.

When the circularly polarized light reflective layer has the principal reflection wavelength range limited to the wavelength range associated with a blue color, as is the case with the previous embodiment, shifting of the wavelength range in which the effect of enhancing emission intensity is produced to the short wavelength side as viewing angle increases causes problems to a limited extent, because of the range shifting to the ultraviolet wavelength range, in which spectral luminous efficiency is low. When the principal reflection wavelength range of the circularly polarized light reflective layer covers the wavelength range of a color other than blue, e.g., green or red, on the other hand, the color changes in the range in which spectral luminous efficiency is higher and hence more visible. In particular, light emitted from the red pixel has emission intensity increasing in the wavelength range in which spectral luminous efficiency is high as viewing angle increases, and the changed color or brightness is more visible.

When the optical compensation layer 800 is provided between the quarter-wave plate 700 and circularly polarized light reflective layer 500, ambient light reflection caused by light having wavelength falling into the selective reflection wavelength range of the cholesteric liquid crystal layer does not go down precipitously as viewing angle increases, although the reflection wavelength range shifts to the short wavelength side. When the circularly polarized light reflective layer has the principal reflection wavelength range limited to the wavelength range associated with a blue color, as is the case with the previous embodiment, shifting of the wavelength range in which the effect of enhancing emission intensity is produced to the short wavelength side as viewing angle increases causes problems to a limited extent, because the range shifts to the ultraviolet wavelength range, in which spectral luminous efficiency is low, and the reflection is not highly visible. When the principal reflection wavelength range of the circularly polarized light reflective layer covers the wavelength range of a color other than blue, e.g., green or red, on the other hand, the color changes in the range in which spectral luminous efficiency is higher and hence more visible. In particular, light emitted from the red pixel is reflected more in the wavelength range in which spectral luminous efficiency is high as viewing angle increases, and the ambient light reflection is more visible. As a result, ambient light reflection increases as viewing angle increases in a bright atmosphere, possibly decrease contrast ratio of the displayed image.

It is therefore preferable to position the optical compensation layer 800 between the circularly polarized light reflective layer 500 and transparent electrode 200, when the principal reflection wavelength range of the circularly polarized light reflective layer covers the wavelength range outside of that corresponding to a blue color, e.g., a green or red color, in order to control color changes or ambient light reflection increase resulting from a viewing angle change.

The above description, however, does not rule out positioning of the optical compensation layer 800 between the quarter-wave plate 700 and circularly polarized light reflective layer 500, because this arrangement brings several advantages. For example, it produces the effect of enhancing emission intensity over a wide viewing angle range by the selective reflection of the cholesteric liquid crystal layer. Moreover, it facilitates assembling the display, because an assembly of the optical compensation layer 800, quarter-wave plate 700 and polarizer 600 is prefabricated into a film, on which the transparent sealing plate 90 is provided.

As discussed above, the light emitting display of the present invention exhibits display properties varying depending on where the optical compensation layer 800 is positioned. The effect of the position also varies depending on the light emitting display structure. It is recommended, therefore, to provide the optical compensation layer at the best position for satisfying the performance and structural characteristics the light emitting display is required to have.

Figure 25:
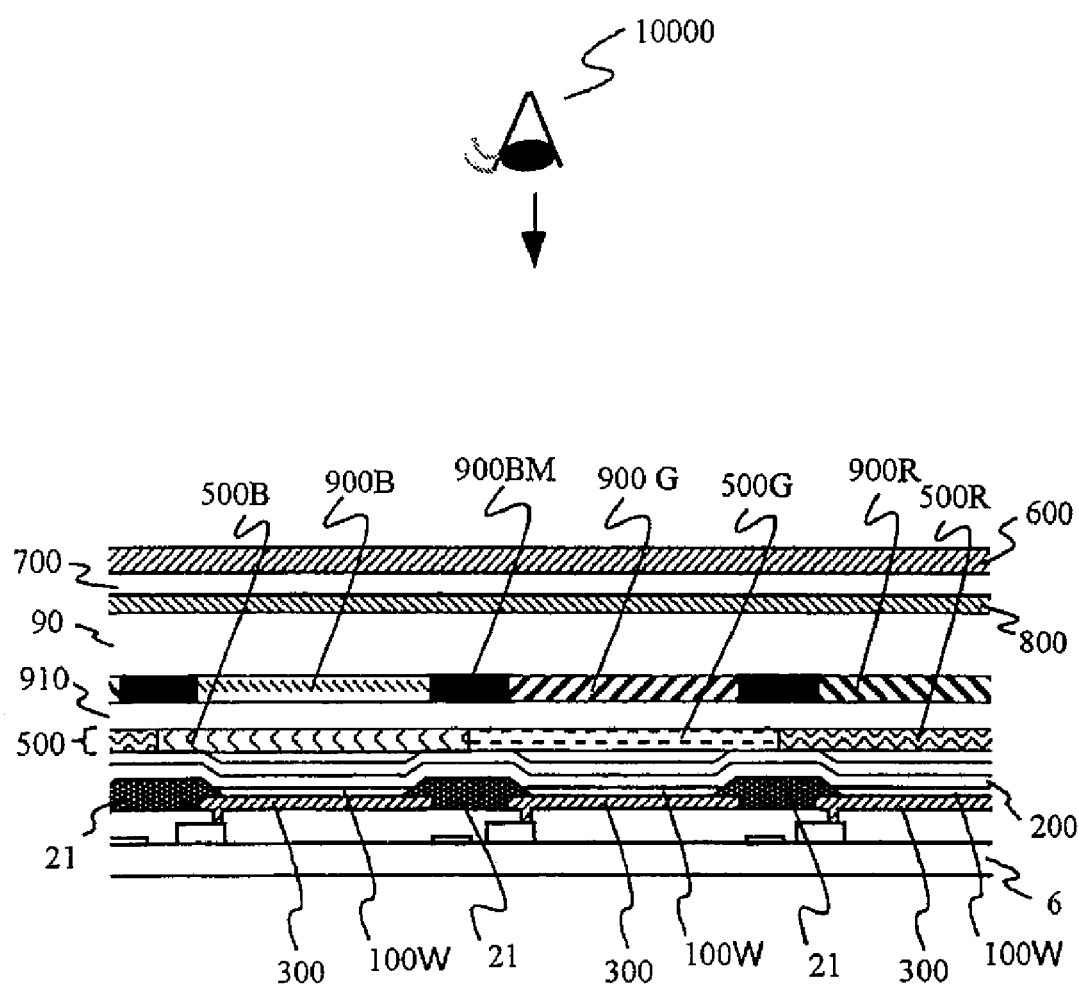
FIG. 25 is a part of cross-sectional structure of still another example of the light emitting displays of the present invention.

Next, still another embodiment of the light emitting display of the present invention is described. FIG. 25 schematically outlines part of the cross-section of the light emitting display of the present invention. This display shares the basic structure with the previous embodiment, illustrated in FIG. 24, except that the light-emitting thin-film layer 100W emits white internal light, and color filters 900R, 900G and 900B are provided. The common members are given the same signs and the detailed description is omitted.

As shown in FIG. 25, the light-emitting thin-film layer of this embodiment is the one illustrated in FIG. 24 in which all of the light-emitting thin-film layers are the layers 100W emitting white light, and the color filters 900R, 900G and 900B transmitting light corresponding to red, green and blue colors, respectively, are patterned between the transparent sealing plate 90 and circularly polarized light reflective layer 500. The optical compensation layer 800 is positioned between the transparent sealing plate 90 and quarter-wave plate 700.

The light-emitting thin-film layer emitting white light can be produced by laminating a plurality of layers emitting a different color, or doping one emission layer with pigments emitting a different color. One example of the laminates for the former approach is a combination of TPD, Alq3 partly doped with Nile red and 1,2,4-triazole (TAZ) derivatives. One example of the emission layers for the latter approach is of PVK doped with 3 types of pigments, e.g., 1,1,4,4-tetraphenyl-1,3-butadiene (TPB), coumarin 6 and DCM1. In any case, the layer emitting white light is preferably of a material of high emission efficiency and long life time.

The color filters are patterned on the transparent sealing plate 90, on which the black matrix 900BM of a photosensitive resin dispersed with chromium metal, chromium oxide or a light-absorptive pigment has been provided, in such a way that each filter transmits light corresponding to a red, green or blue color and absorbs the others by a known method, e.g., dying, pigment-dispersed photolithography or printing.

It is preferable that each of the color filters is coated with the overcoat layer 910 of a transparent resin to planarize the surface. This is to facilitate lamination of the circularly polarized light reflective layer 500 thereon and also to avoid scattered optical characteristics resulting from the surface irregularities.

The cholesteric liquid crystal layers of different selective reflection wavelength range are patterned as the circularly polarized light reflective layers 500 on the overcoat layer 910, as is the case with the previous embodiment, in such a way that the cholesteric liquid crystal layer 500R having the reflection wavelength range corresponding to a wavelength range of a red color is position at the color filter 900R transmitting a red color, and so are the cholesteric liquid crystal layers 500G and 500B having the reflection wavelength range corresponding to a wavelength range of a green and blue colors at the respective color filters 900G and 900B transmitting a green and blue colors. In this embodiment, the black matrix is provided at the color filter, and hence not at the circularly polarized light reflective layer. It is recommended also in this embodiment that each of the patterned cholesteric liquid-crystal layers is coated with an overcoat (not shown) of a transparent resin to planarize the surface. This is to protect the surface while the display is being assembled and also to avoid scattered optical characteristics resulting from the surface of uneven level.

The transparent sealing plate 90 on which the color filters 900R, 900G and 900B, and cholesteric liquid crystal layers as the circularly polarized light reflective layers 500 are provided is set on the substrate 6 after the light-emitting thin-film layer 100W that constitutes a pixel is substantially aligned with the patterned cholesteric liquid crystal layer and color filter.

In other words, the cholesteric liquid crystal layer 500R having the selective reflection wavelength range corresponding to a wavelength range of a red color and color filter 900R transmitting a red color are positioned at the light-emitting thin-film layer that constitutes a red pixel, and so are the cholesteric liquid crystal layers 500G and 500B having the reflection wavelength range corresponding to a wavelength range of a green and blue colors and color filters 900G and 900B transmitting a green and blue colors at the light-emitting thin-film layers that constitute a green and blue pixels, respectively.

The optical compensation layer 800, quarter-wave plate 700 and polarizer 600 are provided on the transparent sealing plate 90 on the side opposite to the side on which the circularly polarized light reflective layer 500 is provided.

Next, working mode of this light emitting display is described. Light radiated from the light-emitting thin-film layer 100W is directed, either directly or after being reflected by the reflective electrode 300, towards the circularly polarized light reflective layer 500 where each of the cholesteric liquid crystal layers having the selective reflection wavelength range corresponding to a color to be displayed by each pixel is patterned.

Of light radiated from the light-emitting thin-film layer 100W that constitutes a red pixel and directed towards the cholesteric liquid crystal layer 500R, the component having a wavelength falling into the wavelength range of a red color, circularly polarized and rotating in one direction (levorotatory in this case) is selectively reflected by the layer 500R, the remainder being transmitted. Of light transmitted by the layer 500R, the circularly polarized component having a wavelength falling into the wavelength range of a red color becomes dextrorotatory, the remainder being unpolarized.

Light transmitted by the cholesteric liquid crystal layer 500R is directed towards the red color filter 900R. Of light entering the color filter 900R, the component having a wavelength falling into the wavelength range of a red color is transmitted by the filter 900R, the remainder being absorbed.

Light having a wavelength falling into the selective reflection wavelength range of the cholesteric liquid crystal layer 500R and transmitted by the red color filter 900R is converted by the quarter-wave plate 700 from circularly polarized light into linearly polarized light, and transmitted by the polarizer 600 to be emitted to the viewer 10000 side.

About half of light having a wavelength out of the selective reflection wavelength range of the cholesteric liquid-crystal layer 500R and transmitted by the red color filter 900R is absorbed by the polarizer 600, the remainder being emitted to the viewer 10000 side.

On the other hand, light reflected by the cholesteric liquid-crystal layer 500R is reflected by the reflective electrode 300 to direct again to the cholesteric liquid-crystal layer 500R, and, when being reflected by the reflective electrode 300, it becomes a circularly polarized light rotating in the opposite direction (dextrorotatory circularly polarized light in this case) to thereby transmit the cholesteric liquid-crystal layer 500 in this time. After being transmitted by the layer 500R, it is also transmitted by the red color filter 900R, converted by the quarter-wave plate 700 into linearly polarized light which can be transmitted by the polarizer 600, and transmitted by the polarizer 600 to be emitted to the viewer 10000 side.

In other words, of white light radiated from the light-emitting thin-film layer 100W, only the component having a wavelength falling into a specific wavelength range of a red color is emitted to the viewer 10000 side essentially without being absorbed by the red color filter 500R or polarizer 600. As a result, a brighter red-color image is displayed.

Similarly, of white light radiated from the light-emitting thin-film layer 100W that constitutes a green (or blue) pixel, only the component having a wavelength falling into a specific wavelength range of a green (or blue) color is emitted to the viewer 10000 side essentially without being absorbed by the green color filter 500G (or blue color filter 500B) or polarizer 600. As a result, a brighter green-color (or blue-color) image is displayed.

In other words, light which is absorbed by a polarizer and lost in the conventional display, can be effectively utilized to enhance light utilization efficiency and thereby to realize a light emitting display producing a brighter image.

When the optical compensation layer 800 is positioned between the quarter-wave plate 700 and circularly polarized light reflective layer 500, as is the case with this embodiment, a phase difference occurring in light traveling at an angle through the circularly polarized light reflective layer can be compensated by the optical compensation layer. As a result, the effect of enhancing emission intensity does not precipitously go down as viewing angle increases, although the wavelength range in which the effect of enhancing emission intensity is produced shifts to the short wavelength side.

In this embodiment, light is transmitted by the color filter before being emitted to the viewer 10000 side. Color changes can be controlled at a low level, even when the wavelength range in which the effect of enhancing emission intensity is produced by the cholesteric liquid crystal layer shifts to the short wavelength side, because the color filter works to limit wavelength of light it transmits.

In other words, the light emitting display of this embodiment can control color changes resulting from viewing angle changes by virtue of the color filter, in spite of the optical compensation layer 800 positioned between the quarter-wave plate 700 and circularly polarized light reflective layer 500, and the principal reflection wavelength range of the cholesteric liquid crystal layer 500 corresponding to the wavelength range in which spectral luminous efficiency is high, e.g., the range of a green or red color other than blue.

The cholesteric liquid crystal layer has a selective reflection wavelength range narrower than the wavelength range of light which the ordinary color filter incorporated with a pigment or dye transmits, with the result that its reflectance distribution with respect to wavelength can be more precipitous. Therefore, light radiated from the light-emitting thin-film layer and reflected by the cholesteric liquid crystal layer to be reused has a narrower full-width at half maximum and more precipitous intensity distribution with respect to wavelength than light merely transmitted by a color filter after being radiated from the light-emitting thin-film layer.

As a result, this embodiment can realize a light emitting display which has a higher color purity of each of a red, green and blue colors and wider range of displayed color than a conventional device with an organic light-emitting diode combined with a white color-emitting color filter, which lacks a cholesteric liquid crystal layer reflecting light to be reused.

On the other hand, at least half of ambient light entering the display area from a bright ambient atmosphere is absorbed by the polarizer 600 while passing therethrough. When light transmitted by the polarizer 600 transmits the quarter-wave plate 700, the light transmitted is converted into circularly polarized light, by receiving the action. When the light transmitted transmits the color filter, light having a wavelength falling into at least two-thirds of its wavelength range is absorbed by the color filter.

Light transmitted by the color filter and circularly polarized light reflective layer 500 is reflected by the reflective electrode 300 back to the layer 500, which reflects the reentered light component having a wavelength falling into the reflection wavelength range of the layer 500 and transmits the others. Light transmitted by the layer 500 is converted by the quarter-wave plate 700 into linearly polarized light. It is absorbed by the polarizer 600, and not emitted to the viewer 10000 side.

In other words, light reflected by the circularly polarized light reflective layer 500 is reflected again by the reflective electrode 300 back to the layer 500, where it is transmitted this time. Light transmitted by the layer 500 is then transmitted by the color filter and polarizer 600 etc. to be emitted to the viewer 10000 side. This light accounts for only a small portion, and ambient light reflection is controlled at a low level in this embodiment.

In other words, this embodiment realizes a light emitting display of high contrast ratio, because most of ambient light is absorbed by the polarizer and color filter to make a dark image still darker even in a bright atmosphere.

A phase difference occurring in light traveling at an angle through the cholesteric liquid crystal layer as the circularly polarized light reflective layer 500 is compensated by the optical compensation layer 800. As a result, this embodiment can control increase of ambient light reflection caused by the phase difference produced at the cholesteric liquid crystal layer as viewing angle increases.

When the optical compensation layer 800 is positioned between the quarter-wave plate 700 and circularly polarized light reflective layer 500, as is the case with this embodiment, ambient light reflection resulting from light having a wavelength falling into the reflection wavelength range of the cholesteric liquid-crystal layer 500 does not go down precipitously as viewing angle increases, although accompanied by the reflection wavelength range shifting to the short-wavelength side. In the display of this embodiment, light is invariably transmitted by the color filter before being emitted to the viewer 10000 side. Therefore, when the ambient light reflection wavelength range shifts to the short-wavelength side as viewing angle increases, reflected light is partly absorbed by the color filter to control ambient light reflection.

Therefore, this embodiment realizes a light emitting display which can control ambient light reflection over a wide viewing angle range by virtue of the optical compensation layer and color filter, and hence keep a contrast ratio at a high level over a wide viewing angle range even in a bright atmosphere.

Moreover, this embodiment facilitates assembling the display, because an assembly of the optical compensation layer 800, quarter-wave plate 700 and polarizer 600 is prefabricated into a film, on which the transparent sealing plate 90 is provided.

The position of the optical compensation layer 800 of this embodiment relative to the color filter and circularly polarized light reflective layer does not limit its position for the light emitting display of the present invention. For example, the optical compensation layer 800 may be positioned between the circularly polarized light reflective layer 500 and transparent electrode 200. This arrangement allows ambient light reflection resulting from light having a wavelength falling into the selective reflection wavelength range of the layer 500 and the effect of enhancing emission intensity to go down as viewing angle increases. As a result, it diminishes ambient light reflection as viewing angle increases to enhance contrast ratio in a bright atmosphere and, at the same time, controls color changes occurring as viewing angle changes.

Moreover, the order of the color filter and circularly polarized light reflective layer may be changed. In other words, the color filter and circularly polarized light reflective layer may be provided in this order from the light-emitting thin-film layer side. In this arrangement, light reflected by the circularly polarized light reflective layer to be reused is transmitted twice by the color filter. As a result, loss of light increases, which, however, is accompanied by increased color purity because the color filter absorbs more light having a wavelength unnecessary for a desired color.

This embodiment uses a plurality of the patterned cholesteric liquid-crystal layers of different selective reflection wavelength range. However, the light emitting display of the present invention is not limited to this arrangement. For example, the circularly polarized light reflective layer having a principal reflection wavelength range corresponding to the wavelength range of one of a blue, green and red colors may totally cover the display area without being patterned. This arrangement brings advantages, e.g., enhanced brightness and purity of the specific color having a wavelength falling into the principal reflection wavelength range of the circularly polarized light reflective layer.

The above arrangement can realize a light emitting display of higher contrast ratio in a bright atmosphere, in particular when circularly polarized light reflective layer has the principal reflection wavelength range corresponding to the wavelength range of a blue color, because of controlled ambient light reflection, as discussed earlier by referring to FIGS. 21 and 22.

All of the light-emitting thin-film layers in this embodiment emit white light. However, the present invention is not limited to this arrangement. For example, the light-emitting thin-film layer emitting a different color may be provided for each pixel, where the cholesteric liquid-crystal layers 500R, 500G and 500B having the reflection wavelength range corresponding to the wavelength range of a red, green or blue color, and color filters 900R, 900G and 900B transmitting a red, green or blue color are positioned at the light-emitting thin-film layers for the pixels emitting a red, green or blue color. This arrangement realizes a light emitting display of high light utilization efficiency, because of controlled absorption of light, radiated from each of the light-emitting thin-films, at the color filter.

Figure 26:
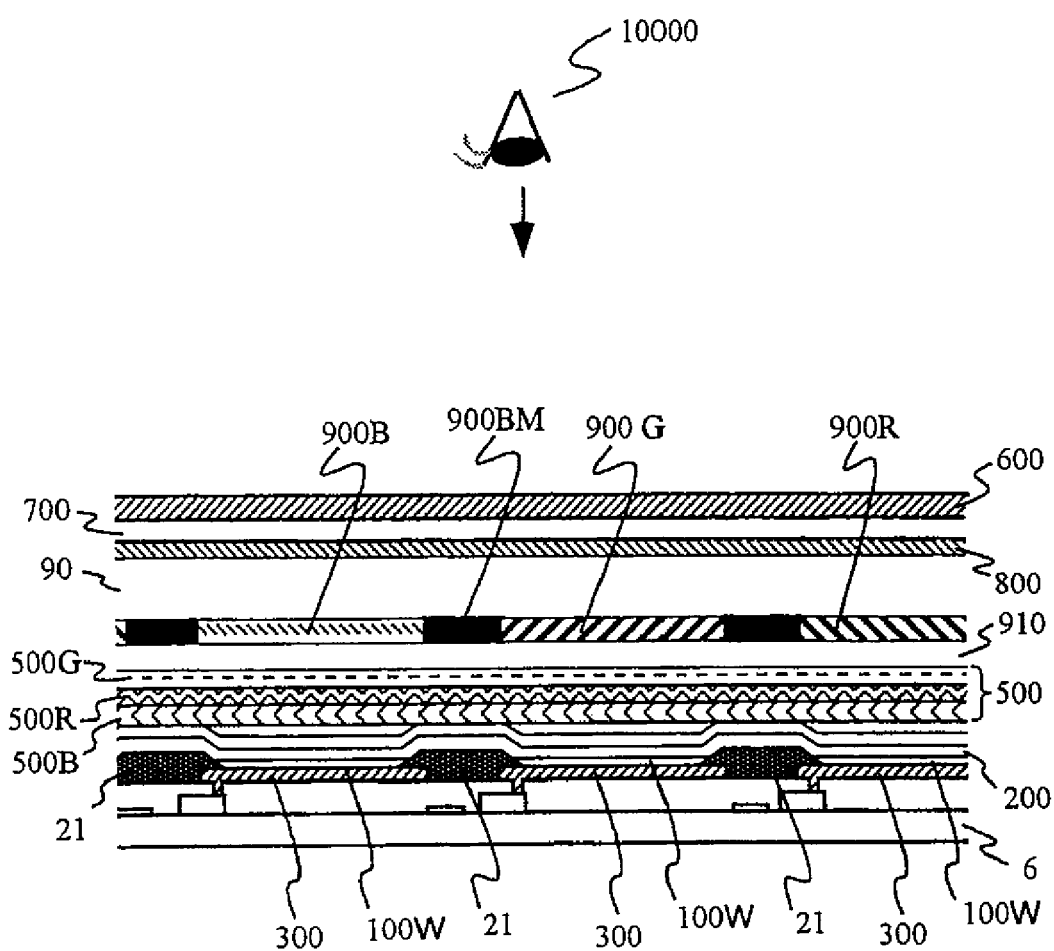
FIG. 26 is a part of cross-sectional structure of still another example of the light emitting displays of the present invention.

Next, still another embodiment of the light emitting display of the present invention is described. FIG. 26 schematically outlines part of the cross-section of the light emitting display of the present invention. This display shares the basic structure with the previous embodiment, illustrated in FIG. 25, except that a laminate of the cholesteric liquid-crystal layers as the circularly polarized light reflective layers 500. The common members are given the same signs and the detailed description is omitted.

The laminate for the light emitting display, of this embodiment is composed of the cholesteric liquid-crystal layers 500B, 500R and 500G having the principal reflection wavelength range corresponding to the wavelength range of a blue, red and green colors, respectively.

This embodiment realizes a light emitting display which produces a brighter image, because these cholesteric liquid-crystal layers work to reduce loss of all of the red, green and blue colors at each of the polarizers.

In particular, the light emitting display of this embodiment, unlike those of the previous embodiments, preferably has the circularly polarized light reflective layer 500 which has the principal reflection wavelength range covering the entire visible wavelength range, more preferably extending into at least part of the infrared wavelength range. This circularly polarized light reflective layer can be realized by laminating a plurality of the cholesteric liquid-crystal layers of different principal reflection wavelength range, as is done in this embodiment.

Laminating a plurality of the cholesteric liquid-crystal layers increases phase difference in light traveling at an angle through the circularly polarized light reflective layers, and the optical compensation layer 800 is designed to have a phase difference which can compensate the totaled phase difference occurring in the cholesteric liquid-crystal layers.

In the above arrangement, the effect of enhancing emission intensity by the selective reflection of the cholesteric liquid-crystal layer is effective over a wide wavelength range. Therefore, the effect of enhancing emission intensity changes little over the visible wavelength range, even when the selective reflection wavelength range of the cholesteric liquid-crystal layer shifts to the short wavelength range as viewing angle increases, to control color changes with changed viewing angle.

Moreover, this embodiment, positioning the optical compensation layer 800 between the circularly polarized light reflective layer 500 and quarter-wave plate 700, keeps the effect of enhancing emission intensity by the selective reflection of the cholesteric liquid-crystal layer even when viewing angle increases, and can realize a light emitting display of high light utilization efficiency over a wide viewing angle range.

In other words, this embodiment realizes a light emitting display which can produce a brighter image changing in color to only a limited extent over a wide viewing angle range.

On the other hand, at least half of ambient light entering the display area from a bright ambient atmosphere is absorbed by the polarizer 600 while passing therethrough. When light transmitted by the polarizer 600 transmits the quarter-wave plate 700, the light transmitted is converted into circularly polarized light by receiving the action thereof. When the light transmitted transmits the color filter, light having a wavelength falling into at least two-thirds of its wavelength range is absorbed by the color filter.

Light transmitted by the color filter and circularly polarized light reflective layer 500 is reflected by the reflective electrode 300 back to the layer 500. Light reflected by the layer 500 is again reflected by the reflective electrode 300 back to the layer 500, which transmits this time the reentered light. It is then transmitted by the color filter, polarizer 600 and the like to be emitted to the viewer 10000 side. This light goes down as it is absorbed by the polarizer and color filter through which it passes twice. In other words, reflection of ambient light, which increases as the reflective wavelength range of the circularly polarized light reflective layer is widened, can be controlled by the color filter in this embodiment.

A phase difference occurring in light traveling at an angle through the cholesteric liquid crystal layer as the circularly polarized light reflective layer 500 is compensated by the optical compensation layer 800. As a result, this embodiment can control increase of ambient light reflection caused by the phase difference produced at the cholesteric liquid crystal layer even when viewing angle increases.

Therefore, this embodiment realizes a light emitting display of high contrast ratio, most of ambient light is absorbed by the polarizer and color filter to make a dark image still darker even in a bright atmosphere.

The order of the cholesteric liquid-crystal layers which constitute the laminate for the present invention is not limited to that shown in FIG. 26. Moreover, the circularly polarized light reflective layer may not be of a laminate composed of a plurality of the cholesteric liquid-crystal layers, but of the cholesteric liquid-crystal layer with continuously changing helical pitches.

The position of the optical compensation layer 800 of this embodiment relative to the color filter and circularly polarized light reflective layer does not limit its position for the light emitting display of the present invention. For example, the optical compensation layer 800 may be positioned between the circularly polarized light reflective layer 500 and transparent electrode 200. This arrangement diminishes ambient light reflection resulting from light having a wavelength falling into the selective reflection wavelength range of the cholesteric liquid-crystal layer (circularly polarized light reflective layer). As a result, it produces an image of higher contrast ratio in a bright atmosphere as viewing angle increases.

Moreover, the order of the color filter and circularly polarized light reflective layer may be changed. In other words, the color filter and circularly polarized light reflective layer 500 may be provided in this order from the light-emitting thin-film layer 100W side. In this arrangement, light reflected by the circularly polarized light reflective layer 500 to be reused is transmitted twice by the color filter. As a result, loss of light increases, which, however, is accompanied by increased color purity because the color filter absorbs more light having a wavelength unnecessary for a desired color.

Figure 27:
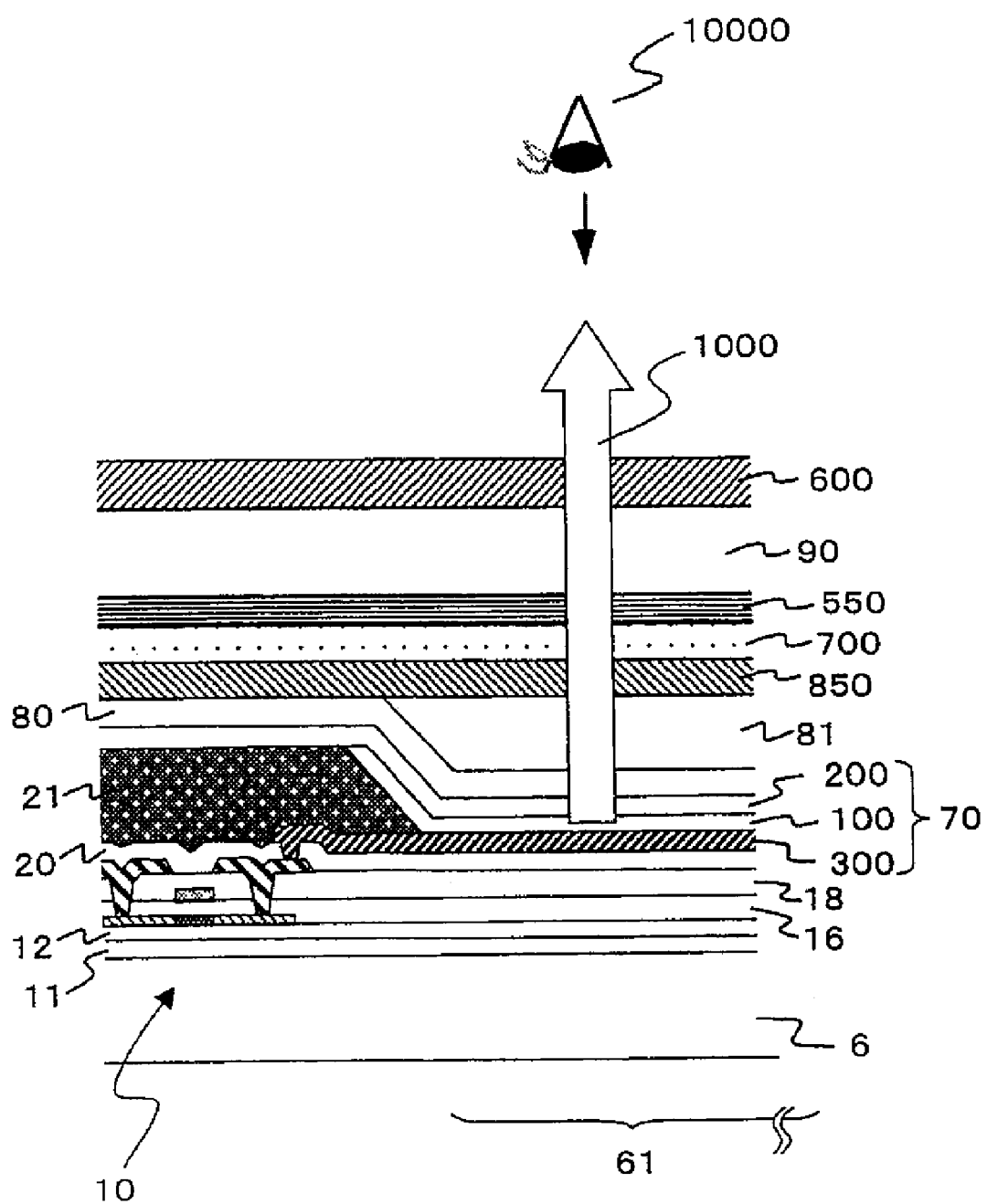
FIG. 27 is a cross-sectional view which schematically illustrates the structure around a pixel of still another example of the light emitting displays of the present invention.
Figure 28:
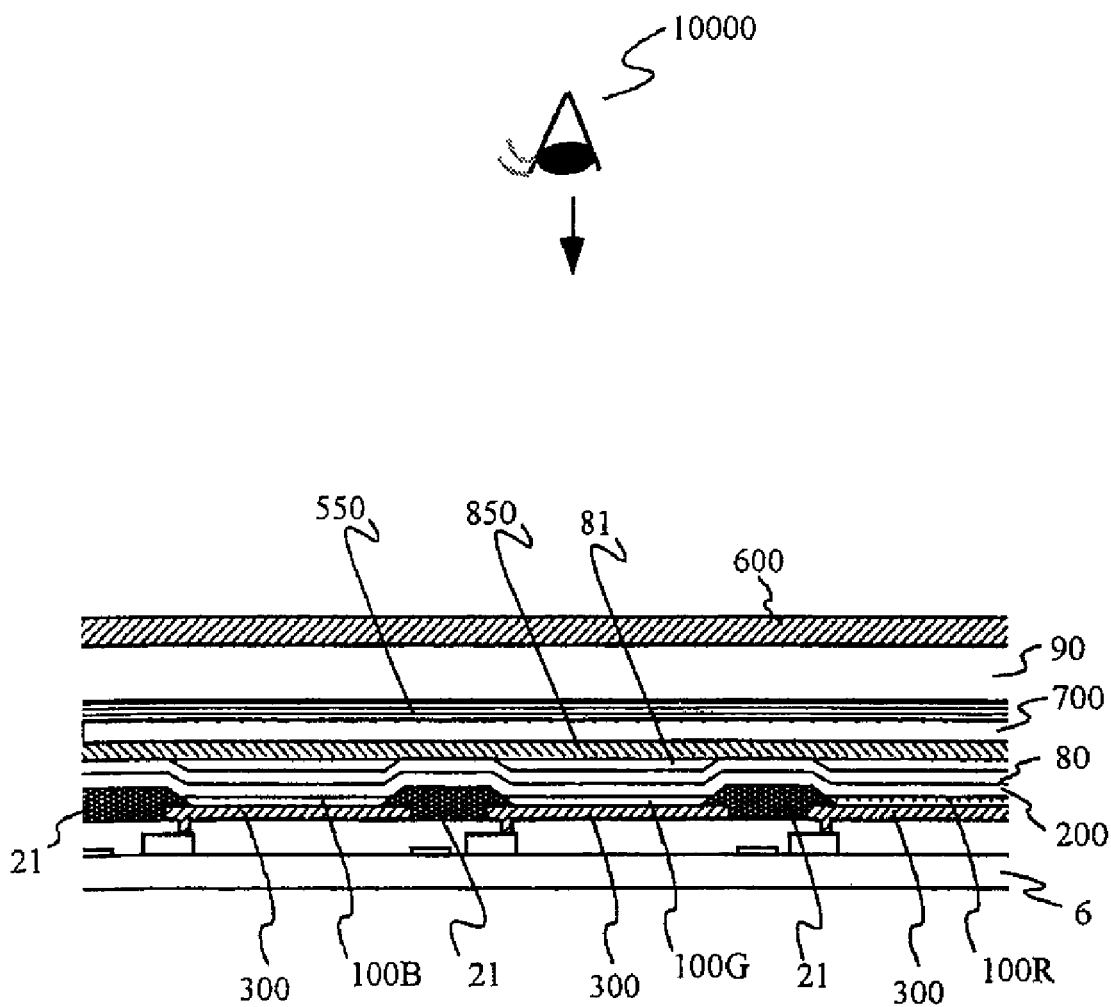
FIG. 28 is a part of cross-sectional structure of still another example of the light emitting displays of the present invention.

Next, still another embodiment of the light emitting display of the present invention is described by referring to FIGS. 27 and 28. FIG. 27 schematically outlines the cross-section around a pixel, illustrating the cross-sectional structure of the light emitting display of the present invention. FIG. 28 also schematically outlines part of the cross-section of the light emitting display of the present invention. This embodiment has a combination of the linearly polarized light reflection member 550 and quarter-wave plate as the circularly polarized light reflective layer in place of the cholesteric liquid-crystal layer, where the member 550 reflects the linearly polarized light component having a specific wavelength range and transmits the other components.

The light emitting display of this embodiment has a laminate of the optical compensation layer 850, quarter-wave plate 700, linearly polarized light reflection member 550 and polarizer 600 as the optical members arranged in this order from the organic light-emitting diode 70 side. The display of this embodiment is the same as that of the previous embodiment described by referring to FIGS. 21 and 22, except that the linearly polarized light reflection member 550 is used in place of the circularly polarized light reflective layer 500 and position of the quarter-wave plate 700 is changed. The common members are given the same signs and the detailed description is omitted.

The display of this embodiment has the optical compensation layer 850, quarter-wave plate 700, linearly polarized light reflection member 550 and polarizer 600 arranged in this order from the transparent electrode 200 side, as illustrated in FIG. 27.

The linearly polarized light reflection member 550 works to reflect the linearly polarized light component of incident light having a specific wavelength range and transmits the other linearly polarized light component having the polarizing plane perpendicular to that of the above component. The member 550 may be selected from various structures. It may be of a birefringent, reflective, polarizing film composed of a plurality of different birefringent, high-molecular-weight films stacked alternately, e.g., the one disclosed by the international application WO95/27919, described earlier. Another example stacks 2 prism arrays having an apex angle of around 90°, with a polarization split part of a dielectric multi-layer in the interface, disclosed by SID92 Digest p 427.

It is recommended to use the former birefringent, reflective, polarizing film as the linearly polarized light reflection member 550, because it can be handled more easily. A phase difference, which may increase ambient light reflection, is produced in light traveling at an angle through the linearly polarized light reflection member. Therefore, the optical compensation layer 850 is provided at an adequate position between the polarizer 600 and organic light-emitting diode 70 to compensate the phase difference.

The linearly polarized light reflection member 550 preferably has a central reflection wavelength of 400 to 490 nm, more preferably 420 to 480 nm, and preferably has a reflection wavelength range of 510 nm or less. This is to enhance blue light utilization efficiency and color purity, and, at the same time, to control ambient light reflection as far as possible, as is the case with each of the previous embodiments.

The linearly polarized light reflection member 550 is positioned between the polarizer 600 and quarter-wave plate 700 in such a way to align the linearly polarized light transmitting axes of the member 550 and polarizer 600 with each other.

Figure 29:
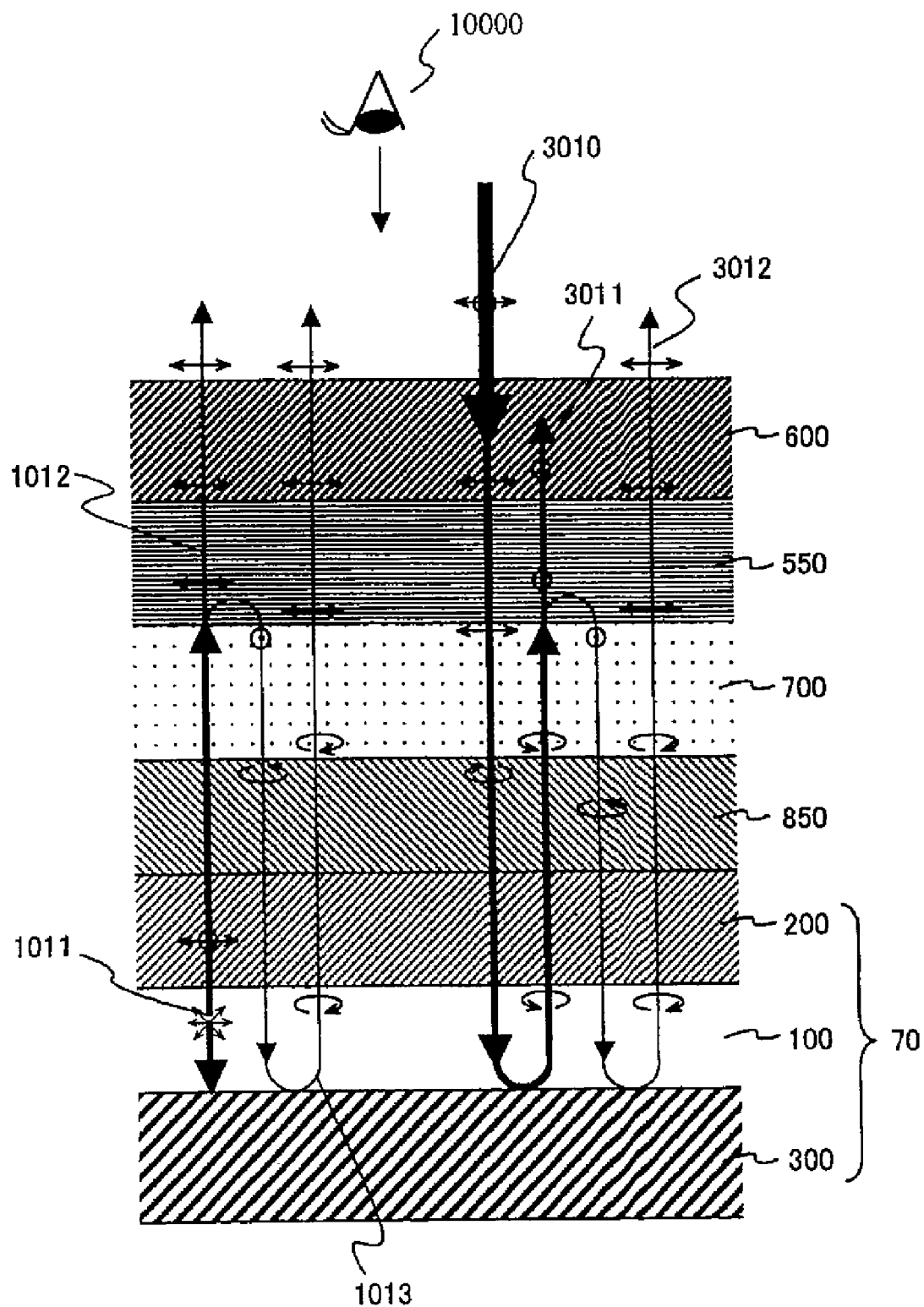
FIG. 29 is a part of cross-sectional structure of light-emitting area in the light emitting displays of the present invention.

Next, light radiated from the light-emitting thin-film layer 100 and light entering the light-emitting area 61 from an ambient atmosphere are described by referring to FIG. 29, which shows the cross-sectional structure around the light-emitting area of this embodiment, where those members, e.g., substrate, which are not directly related to light behavior are omitted.

Referring to FIG. 29, the light 1011 radiated from the light-emitting thin-film layer 100 is directed towards the transparent electrode 200 side either directly or after being reflected by the reflective electrode 300, and transmitted by the transparent electrode 200, optical compensation layer 850 and quarter-wave plate 700 to enter the linearly polarized light reflection member 550. The light radiated from the light-emitting thin-film layer 100 to eventually enter the linearly polarized light reflection member 550 is unpolarized. Therefore, the linearly polarized light reflection member 550 reflects the linearly polarized light component which has a wavelength in the wavelength range corresponding to that of a blue color and is to be absorbed by the polarizer 600, and transmits the other components.

Of the light 1012 transmitted by the linearly polarized light reflection member 550, the component having a wavelength falling into its reflection wavelength range is emitted to the viewer 10000 side after being transmitted by the polarizer 600. About half of the other light 1012 components, having a wavelength out of the above wavelength range are absorbed by the polarizer 600, the remainder being emitted to the viewer 10000 side.

On the other hand, the light 1013 reflected by the linearly polarized light reflection member 550 is transmitted by the quarter-wave plate 700 towards the reflective electrode 300. It is converted into circularly polarized light by the quarter-wave plate 700 while passing therethrough, and reflected by the reflective electrode 300 to travel in the different direction and to become circularly polarized light rotating in the opposite direction. Light reflected by the reflective electrode 300 is converted by the quarter-wave plate 700 while passing therethrough into linearly polarized light which can be transmitted by the linearly polarized light reflection member 550 this time, and transmitted by the member 550 and polarizer 600 to be emitted to the viewer 10000 side.

Of light radiated from the light-emitting thin-film layer, the component having a wavelength falling into the wavelength range corresponding to that of a blue color is emitted to the viewer 10000 side essentially without being absorbed by the polarizer, as is the one in the previous embodiment, to enhance blue color utilization efficiency. Therefore, this embodiment realizes a light emitting display which produces a brighter image at the same power consumption, or an image of the same brightness at a lower current level in the organic light-emitting diode, reducing power consumption and extending life time.

At the same time, setting a selective reflection wavelength range of the linearly polarized light reflection member 550 narrower than the wavelength range of light radiated from the light-emitting thin-film layer can improve color purity of light emitted from a blue-displaying pixel to the viewer side.

Next, light entering the light-emitting area of the light emitting display from a bright ambient atmosphere is described. The ambient light 3010 is generally unpolarized. However, the polarizer 600 absorbs a linearly polarized light component having a plane of polarization extending in a specific direction, while transmitting another linearly polarized light component having the plane perpendicular to the above. Linearly polarized light transmitted by the polarizer 600 is also transmitted by the linearly polarized light reflection member 550. The quarter-wave plate 700 then acts on light transmitted by these optical members to make it circularly polarized. Light transmitted by the plate 700 is then reflected by the reflective electrode 300.

Circularly polarized light is reflected by the reflective electrode 300 to travel in a different direction and rotate in the opposite direction. It is then converted by the quarter-wave plate 700, while passing therethrough, into linearly polarized light absorbable by the polarizer 600 and directed to the linearly polarized light reflection member 550, which reflects the linearly polarized light component having a wavelength in the wavelength range corresponding to that of a blue color while transmitting the other components. Light transmitted by the member 550 is absorbed by the polarizer 600 and is not returned back to the outside.

On the other hand, the light 3012 reflected by the linearly polarized light reflection member 550 is converted by the quarter-wave plate 700 while passing therethrough into circularly polarized light, and reflected back to the quarter-wave plate 700 by the reflective electrode 300 to rotate in the opposite direction. Then, the quarter-wave plate 700 converts light from the reflective electrode 300 into linearly polarized light which can be this time transmitted by the polarizer 600. Light transmitted by the linearly polarized light reflection member 550 and polarizer 600 is emitted to the viewer 10000 side.

In other words, ambient light reflected is limited to the component which has a wavelength falling into the reflection wavelength range of the linearly polarized light reflection member 550, and accounts for only a small portion of ambient light. It has a wavelength falling into the wavelength range corresponding to that of a blue color, which is low in spectral luminous efficiency of photopic vision, and hence has a decreased luminous reflectance. Therefore, this embodiment realizes, like the previous ones, a light emitting display producing an image of high contrast ratio, because it cuts off most of ambient light even in a bright atmosphere to make a dark image still darker.

A phase difference will occur in light traveling at an angle through the linearly polarized light reflection member 550 at a high viewing angle. However, it can be compensated by the optical compensation layer 850, to control increased ambient light reflection caused by the phase difference. As a result, this embodiment can realize a light emitting display producing an image of high contrast ratio over a wide viewing angle.

The optical compensation layer 850 is preferably positioned between the linearly polarized light reflection member 550 and organic light-emitting diode 70, as in this embodiment. When positioned between the polarizer 600 and linearly polarized light reflection member 550, for example, the optical compensation layer 850 may cause an unnecessary phase difference in light entering the display area from an ambient atmosphere and transmitted by the polarizer 600 while it transmits the light at an angle to change its polarized conditions. As a result, it may be partly reflected by the linearly polarized light reflection member 550 to increase ambient light reflection.

Therefore, it is preferable to position the optical compensation layer 850 between the linearly polarized light reflection member 550 and organic light-emitting diode 70, as in this embodiment, to control ambient light reflection in a bright atmosphere.

It is known that an exciter is formed at a statistically high probability under the triplet excited state. Therefore, light-emitting materials of high luminous efficiency, referred to as phosphorescent or triplet light-emitting materials have been attracting attention. They are realized by use of a heavy metal complex having, e.g., Ir or Pt as the central metal. They exhibit a high light-emitting efficiency for a green and red colors, but their blue-emitting efficiency is not so high at present.

In a case where phosphorescent light-emitting materials are used for light-emitting thin-film layers each constituting a red, green or blue pixel to display a white-colored image, for example, light intensity of a red and green colors should be adjusted at that of a blue color of lower efficiency. As a result, the display cannot produce a bright, white-colored image in spite of its high red- and green-emitting efficiency.

By contrast, each of the embodiments of the present invention described by referring to FIG. 1, 19, 21, 22, 23 or 27 can realize a light emitting display capable of producing a bright, white-colored image by applying a phosphorescent light-emitting material to the light-emitting thin-film layer which has an enhanced light utilization efficiency in a wavelength range corresponding to that of a blue color to utilize high light-emitting efficiency of the material.

More specifically, a phosphorescent material is used for the light-emitting thin-film layers for each of the red and green pixels in the organic, light-emitting diode while a fluorescent material or phosphorescent material having a lower efficiency than that for another color is used for the blue pixel. This arrangement realizes a high light-emitting efficiency of a phosphorescent material at the red and green pixels, and high light utilization efficiency at the blue pixel by the blue-reflecting, circularly polarized light reflective layer, although its light-emitting efficiency is lower. As a result light emitted from the display to the viewer side has an effective efficiency of an improved balance among a red, green and blue colors, realizing a brighter, white-colored image in which the function of a phosphorescent material of high light-emitting efficiency is utilized.

The present invention is described in each of the embodiments taking an active matrix drive type light emitting display as the example, but is not limited to this type. In other words, it may be of a passive matrix drive type, which dispenses with a switching device, e.g., thin-film transistor, and connects each electrode for the light-emitting device to a vertically or horizontally scanning line.

For a full-color OLED display, a combination of a blue-emitting device and fluorescent color-changing medium (CCM) has been proposed (this method is hereinafter referred to as "CCM" method). The CCM method excites the color changing fluorescent dye layer with light produced in a blue-emitting layer to emit the 3 primary colors by converting the blue color into a green and red colors.

The present invention may be used to realize the full-color display described above by arranging a polarizer, quarter-wave plate, optical compensation layer and circularly polarized light reflective layer (or linearly polarized light reflective member) each at an adequate position between the light-emitting thin-film layer and viewer.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A light emitting display provided with a plurality of pixels, each pixel having, in this order:
   a reflective layer;
   a first electrode;
   a light-emitting thin-film layer;
   a second electrode;
   an optical compensation layer;
   a circularly polarized light reflective layer;
   a quarter-wave plate; and
   a polarizer, wherein
   the optical compensation layer is provided between the second electrode and the polarizer,
   the display has at least a blue pixel, a red pixel and a green pixel, and
   each of the circularly polarized light reflective layers is patterned for each of the pixels and has an almost constant product of a thickness of the circularly polarized light reflective layer and a value obtained by subtracting a refractive index in the in-plane direction perpendicular to the thickness direction from a refractive index in the thickness direction.

2. A light emitting display provided with a plurality of pixels, each pixel having, in this order:
   a reflective layer;
   a first electrode;
   a light-emitting thin-film layer;
   a second electrode;
   an optical compensation layer;
   a circularly polarized light reflective layer;
   a quarter-wave plate; and
   a polarizer, wherein
   the optical compensation layer is provided between the second electrode and the polarizer,
   the display has at least a blue pixel, a red pixel and a green pixel,
   both $\lambda_0$ and $\lambda_{Imax}$ exist within the wavelength range of light radiated from the light-emitting thin-film layer but are different from each other,
   $\lambda_0$ is the central wavelength in the principal reflection wavelength range of light reflected by the circularly polarized light reflective layer, and
   $\lambda_{Imax}$ is the wavelength at which an intensity of interference, which occurs between the light radiated from the light-emitting thin-film layer and the layers that comprise the pixel, attains a maximum, all at a viewing angle of 0°.

3. A light emitting display provided with a plurality of pixels, each pixel having, in this order:
   a reflective layer;
   a first electrode;
   a light-emitting thin-film layer;
   a second electrode;
   an optical compensation layer;
   a circularly polarized light reflective layer;
   a quarter-wave plate; and
   a polarizer, wherein the optical compensation layer is provided between the second electrode and the polarizer, the display has at least a blue pixel, a red pixel and a green pixel, one of the following relationships is satisfied:

$$\lambda_0 > \lambda_{Emax} > \lambda_{Imax} \text{ or}$$

$$\lambda_0 < \lambda_{Emax} < \lambda_{Imax}$$

$\lambda_0$ is the central wavelength in the principal reflection wavelength range of light reflected by the circularly polarized light reflective layer, $\lambda_{Emax}$ is the peak wavelength of light radiated from the light-emitting thin-film layer, and $\lambda_{Imax}$ is the wavelength at which an intensity of interference, which occurs between the light radiated from the light-emitting thin-film layer and the layers that comprise the pixel, attains a maximum, all at a viewing angle of 0°.

4. A light emitting display provided with a plurality of pixels, each pixel having, in this order:
a reflective layer;
a first electrode;
a light-emitting thin-film layer;
a second electrode;
an optical compensation layer;
a circularly polarized light reflective layer;
a quarter-wave plate; and
a polarizer, wherein
the optical compensation layer is provided between the second electrode and the polarizer,
the display has at least a blue pixel, a red pixel and a green pixel,
both $\lambda_0$ and $\lambda_{Imax}$ exist within the wavelength range of light radiated from the light-emitting thin-film layer but are different from each other, $\lambda_0$ is the central wavelength in the principal reflection wavelength range of light reflected by the circularly polarized light reflective layer, and $\lambda_{Imax}$ is the wavelength at which intensity of interference to light radiated from the light-emitting thin-film layer attains a maximum, all at viewing angle of 0°.

5. A light emitting display provided with a plurality of pixels, each pixel having, in this order:
a reflective layer;
a first electrode;
a light-emitting thin-film layer;
a second electrode;
an optical compensation layer;
a circularly polarized light reflective layer;
a quarter-wave plate; and
a polarizer, wherein
the optical compensation layer is provided between the second electrode and the polarizer,
the display has at least a blue pixel, a red pixel and a green pixel, one of the following relationships is satisfied:

$$\lambda_0 > \lambda_{Emax} > \lambda_{Imax} \text{ or}$$

$$\lambda_0 < \lambda_{Emax} < \lambda_{Imax}$$

$\lambda_0$ is the central wavelength in the principal reflection wavelength range of light reflected by the circularly polarized light reflective layer, $\lambda_{Emax}$ is the peak wavelength of light radiated from the light-emitting thin-film layer, and $\lambda_{Imax}$ is the wavelength at which intensity of interference to light radiated from the light-emitting thin-film layer attains a maximum, all at viewing angle of 0°.

* * * * *